United States Patent
Fujii et al.

(10) Patent No.: US 8,089,144 B2
(45) Date of Patent: Jan. 3, 2012

(54) SEMICONDUCTOR DEVICE AND METHOD FOR MANUFACTURING THE SAME

(75) Inventors: Tetsuo Fujii, Toyohashi (JP); Akitoshi Yamanaka, Hekinan (JP); Hisanori Yokura, Obu (JP)

(73) Assignee: DENSO CORPORATION, Kariya (JP)

( * ) Notice: Subject to any disclaimer, the term of this patent is extended or adjusted under 35 U.S.C. 154(b) by 53 days.

(21) Appl. No.: 12/654,087

(22) Filed: Dec. 10, 2009

(65) Prior Publication Data

US 2010/0148341 A1 Jun. 17, 2010

(30) Foreign Application Priority Data

Dec. 17, 2008 (JP) .................. 2008-321218
Dec. 25, 2008 (JP) .................. 2008-330252
Jun. 9, 2009 (JP) .................. 2009-138031

(51) Int. Cl.
*H01L 23/48* (2006.01)
(52) U.S. Cl. ........ 257/688; 257/692; 257/739; 257/776; 257/415; 257/E23.016; 438/117; 438/118; 438/51
(58) Field of Classification Search .................. 257/688, 257/692, 739, 776, 415, E23.016; 438/117, 438/118, 51
See application file for complete search history.

(56) References Cited

U.S. PATENT DOCUMENTS

| | | |
|---|---|---|
| 4,642,878 A | 2/1987 | Maeda |
| 4,651,409 A | 3/1987 | Ellsworth et al. |
| 4,920,071 A * | 4/1990 | Thomas ........ 438/626 |
| 5,461,916 A | 10/1995 | Fujii et al. |
| 5,534,463 A * | 7/1996 | Lee et al. ........ 438/643 |
| 5,756,901 A | 5/1998 | Kurle et al. |
| 6,240,782 B1 | 6/2001 | Kato et al. |
| 6,405,592 B1 | 6/2002 | Murari et al. |
| 6,441,450 B1 | 8/2002 | Yamaguchi et al. |
| 6,789,423 B2 | 9/2004 | An et al. |
| 6,835,588 B2 | 12/2004 | An et al. |
| 6,841,453 B2 | 1/2005 | Mastromatteo |
| 6,876,048 B2 | 4/2005 | Fischer et al. |

(Continued)

FOREIGN PATENT DOCUMENTS

JP        A-03-067177         3/1991

(Continued)

OTHER PUBLICATIONS

Office Action dated Nov. 16, 2010, issued in corresponding JP patent application No. 2008-321218 (English translation enclosed).

(Continued)

*Primary Examiner* — Tu-Tu Ho
(74) *Attorney, Agent, or Firm* — Posz Law Group, PLC

(57) ABSTRACT

A semiconductor device includes: a sensor including a sensor structure on a first side of the sensor and a periphery element surrounding the sensor structure; and a cap covering the sensor structure and having a second side bonded to the first side of the sensor. The cap includes a first wiring layer on the second side of the cap. The first wiring layer steps over the periphery element. The sensor further includes a sensor side connection portion, and the cap further includes a cap side connection portion. The sensor side connection portion is bonded to the cap side connection portion. At least one of the sensor side connection portion and the cap side connection portion provides an eutectic alloy so that the sensor side connection portion and the cap side connection portion are bonded to each other.

22 Claims, 40 Drawing Sheets

U.S. PATENT DOCUMENTS

| | | |
|---|---|---|
| 6,958,529 B2 | 10/2005 | Ishibashi et al. |
| 7,104,129 B2 | 9/2006 | Nasiri et al. |
| 7,221,033 B2 | 5/2007 | Lutz et al. |
| 7,250,353 B2 | 7/2007 | Nasiri et al. |
| 7,276,789 B1 | 10/2007 | Cohn et al. |
| 7,432,587 B2 | 10/2008 | Mastromatteo |
| 7,442,570 B2 | 10/2008 | Nasiri et al. |
| 2004/0067604 A1* | 4/2004 | Ouellet et al. ............... 438/108 |
| 2004/0188782 A1 | 9/2004 | Fujii |
| 2008/0290490 A1 | 11/2008 | Fujii et al. |
| 2008/0296717 A1* | 12/2008 | Beroz et al. .................. 257/434 |
| 2009/0008728 A1 | 1/2009 | Fujii et al. |
| 2009/0152656 A1 | 6/2009 | Okudo et al. |
| 2010/0072563 A1 | 3/2010 | Sato et al. |

FOREIGN PATENT DOCUMENTS

| | | |
|---|---|---|
| JP | A-10-092702 | 4/1998 |
| JP | A-11-220141 | 8/1999 |
| JP | A-2001-119040 | 4/2001 |
| JP | A-2004-333133 | 11/2004 |
| JP | A-2007-000986 | 1/2007 |
| JP | A-2007-194572 | 8/2007 |
| JP | A-2007-263765 | 10/2007 |
| KR | 20010057139 * | 7/2001 |
| WO | WO 2010/032820 | 3/2010 |

OTHER PUBLICATIONS

Office Action mailed Jun. 14, 2011 in corresponding JP application No. 2009-138031 (and English translation).

* cited by examiner

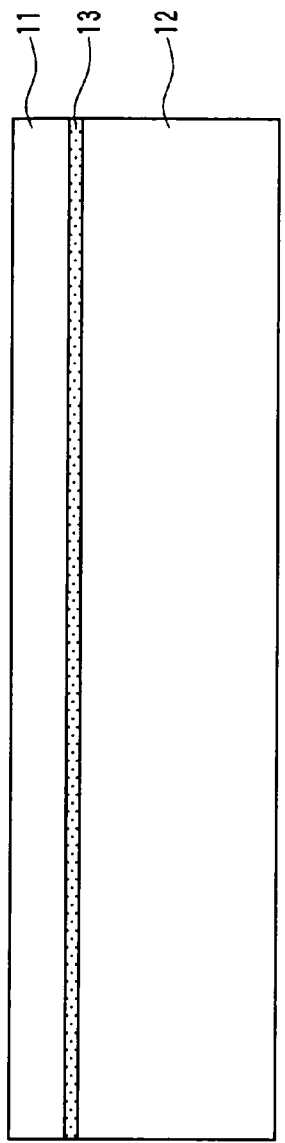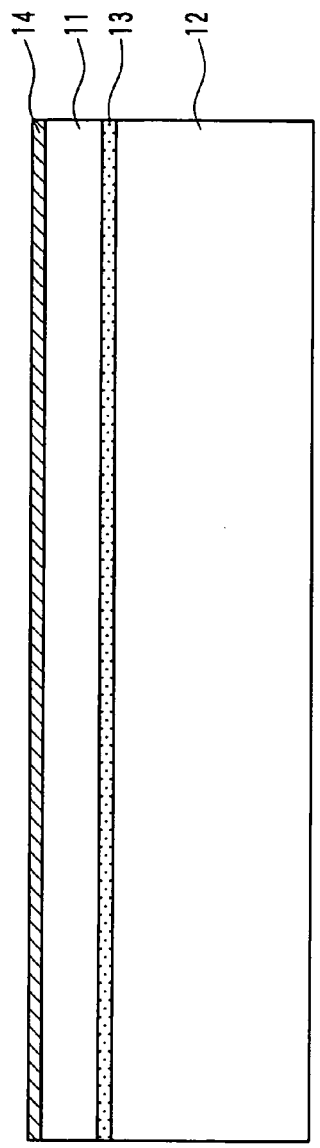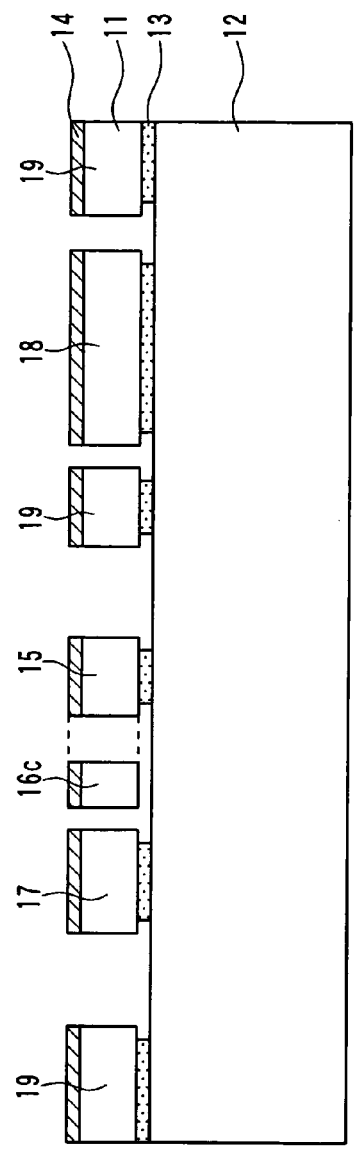

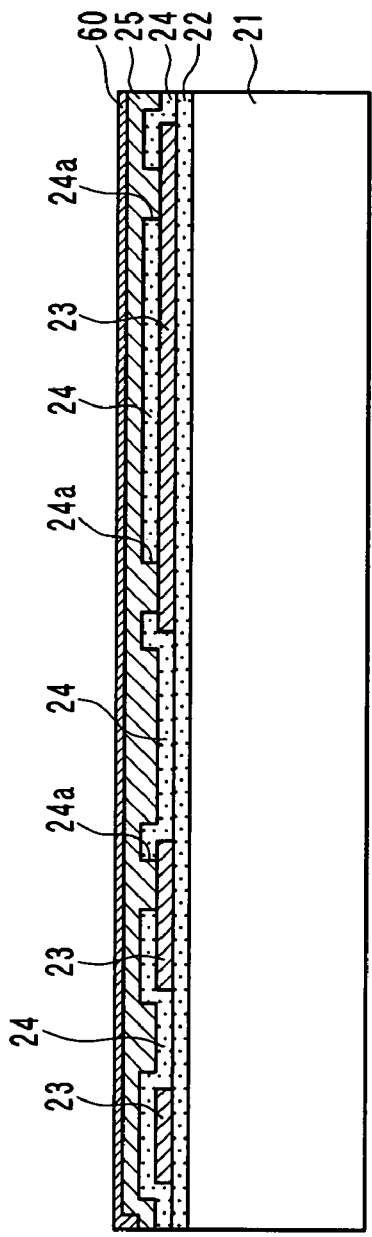
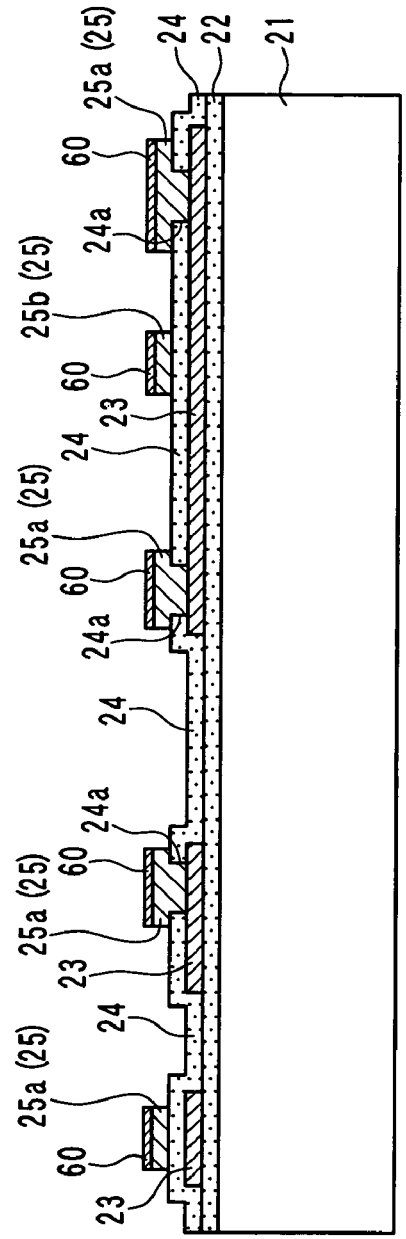
FIG. 9A
FIG. 9B

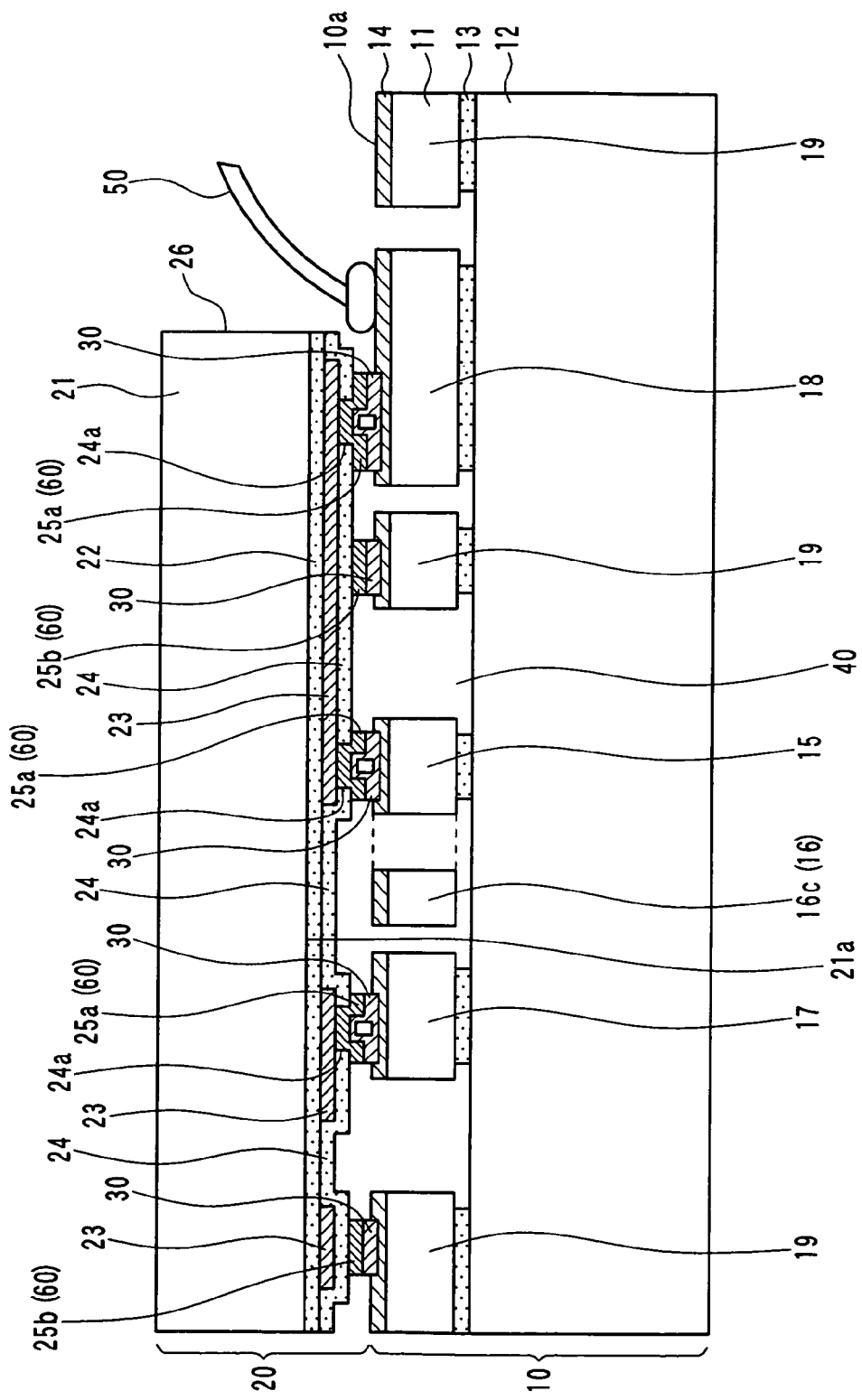

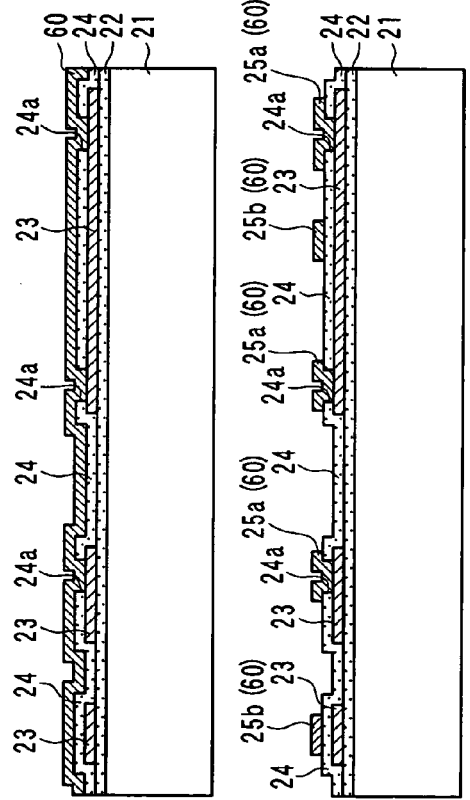
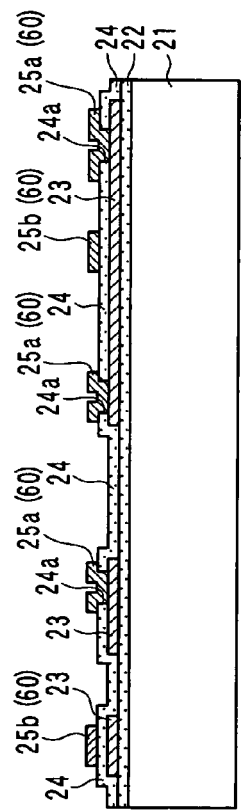
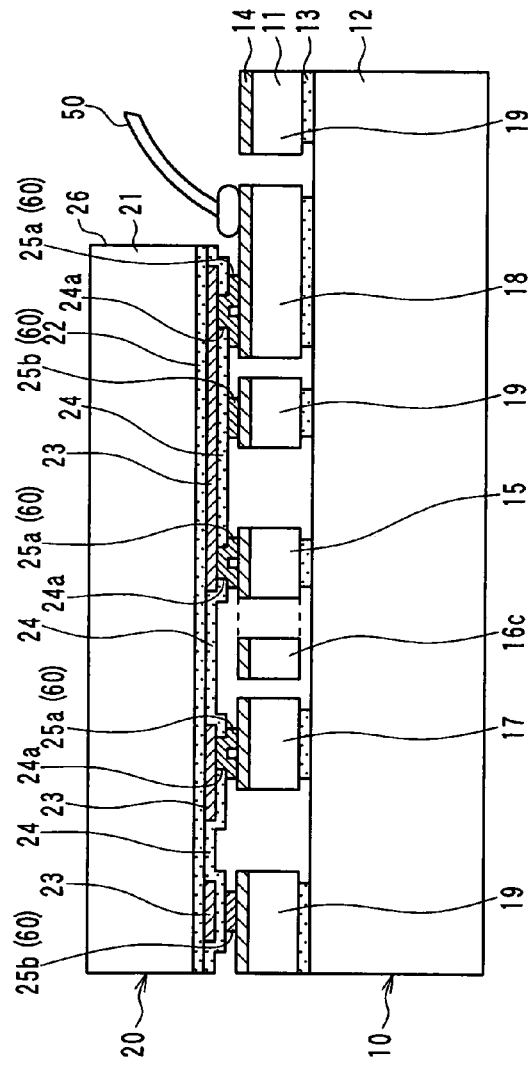
FIG. 11A
FIG. 11B
FIG. 11C

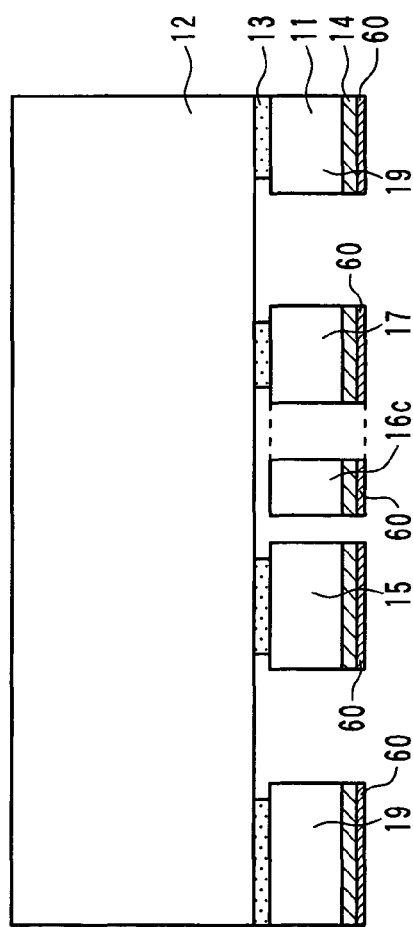
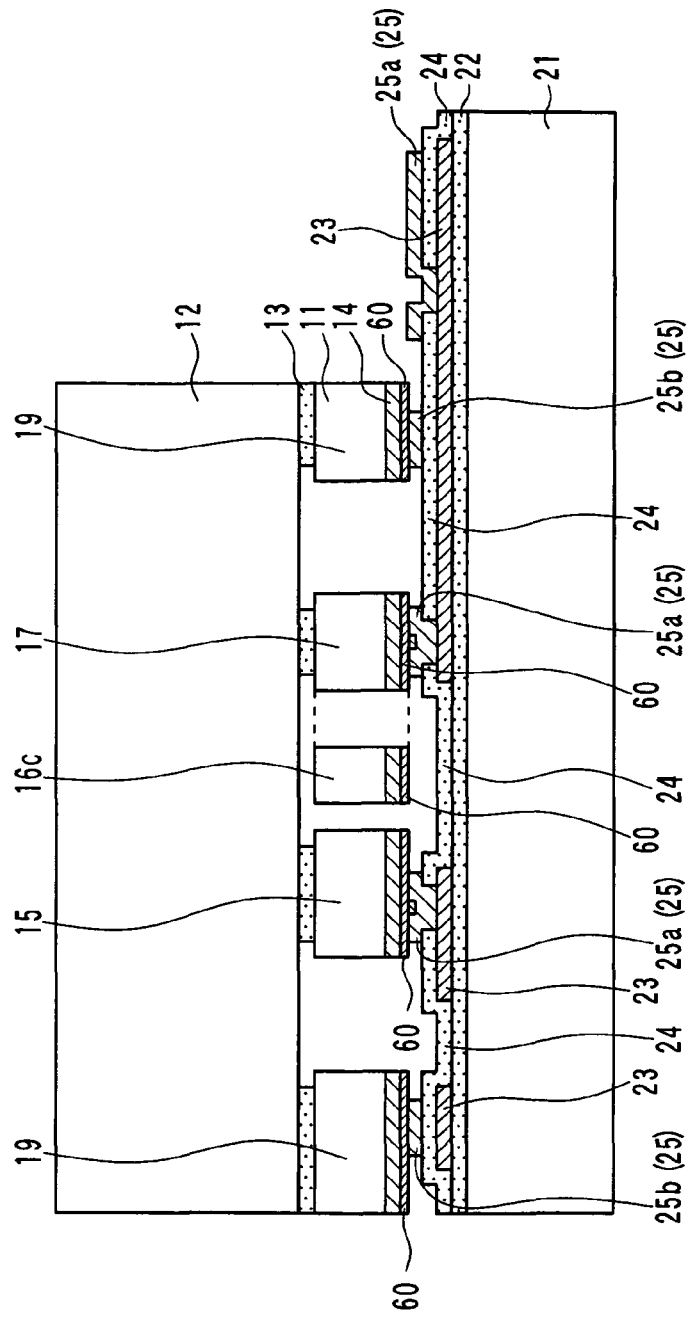
FIG. 14A
FIG. 14B

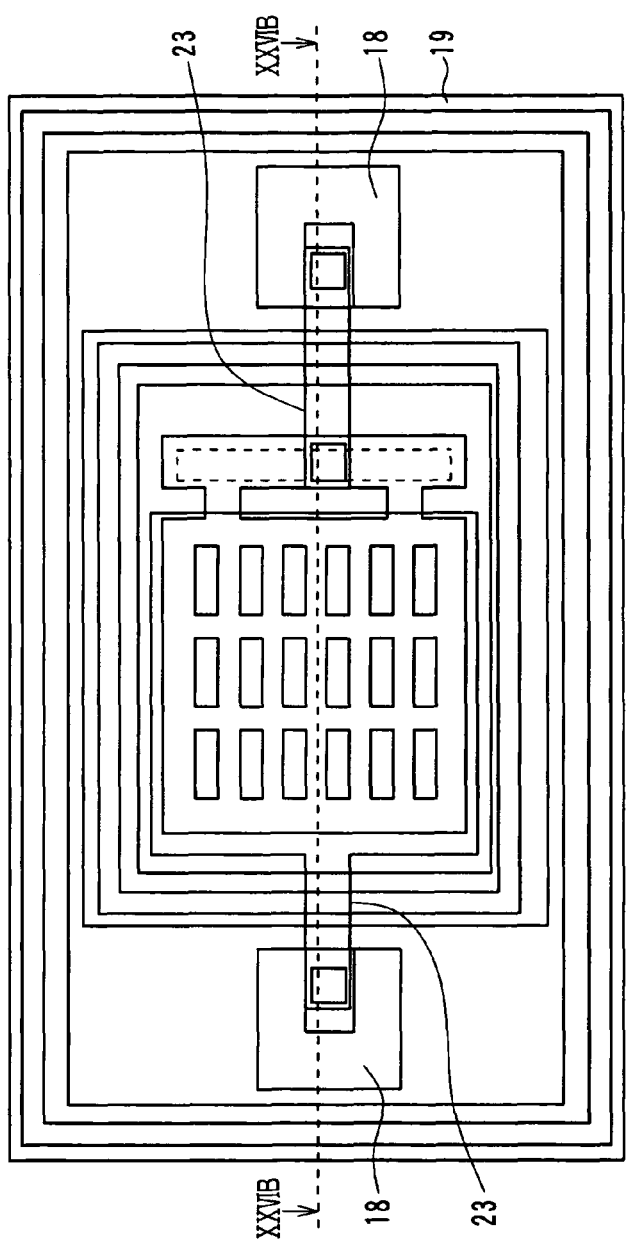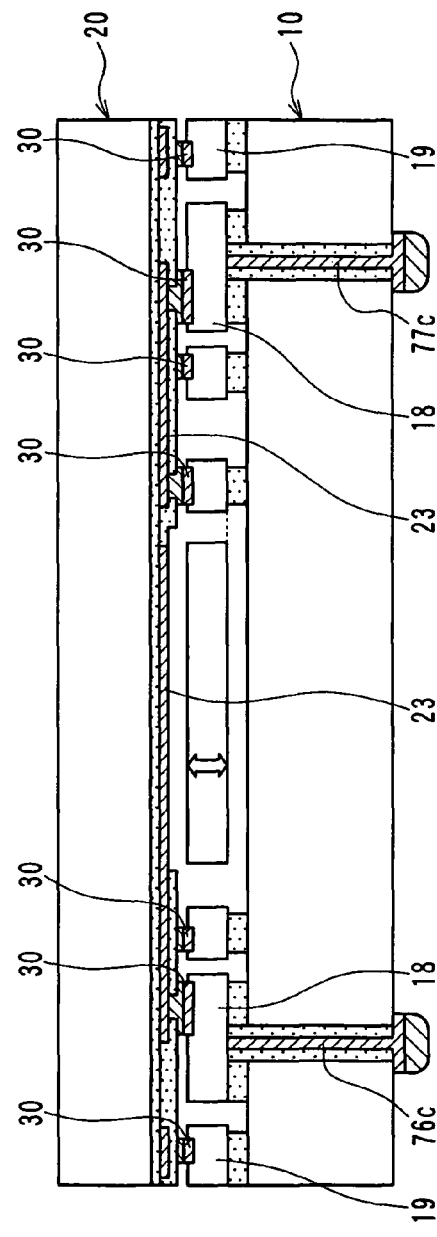
FIG. 26A
FIG. 26B

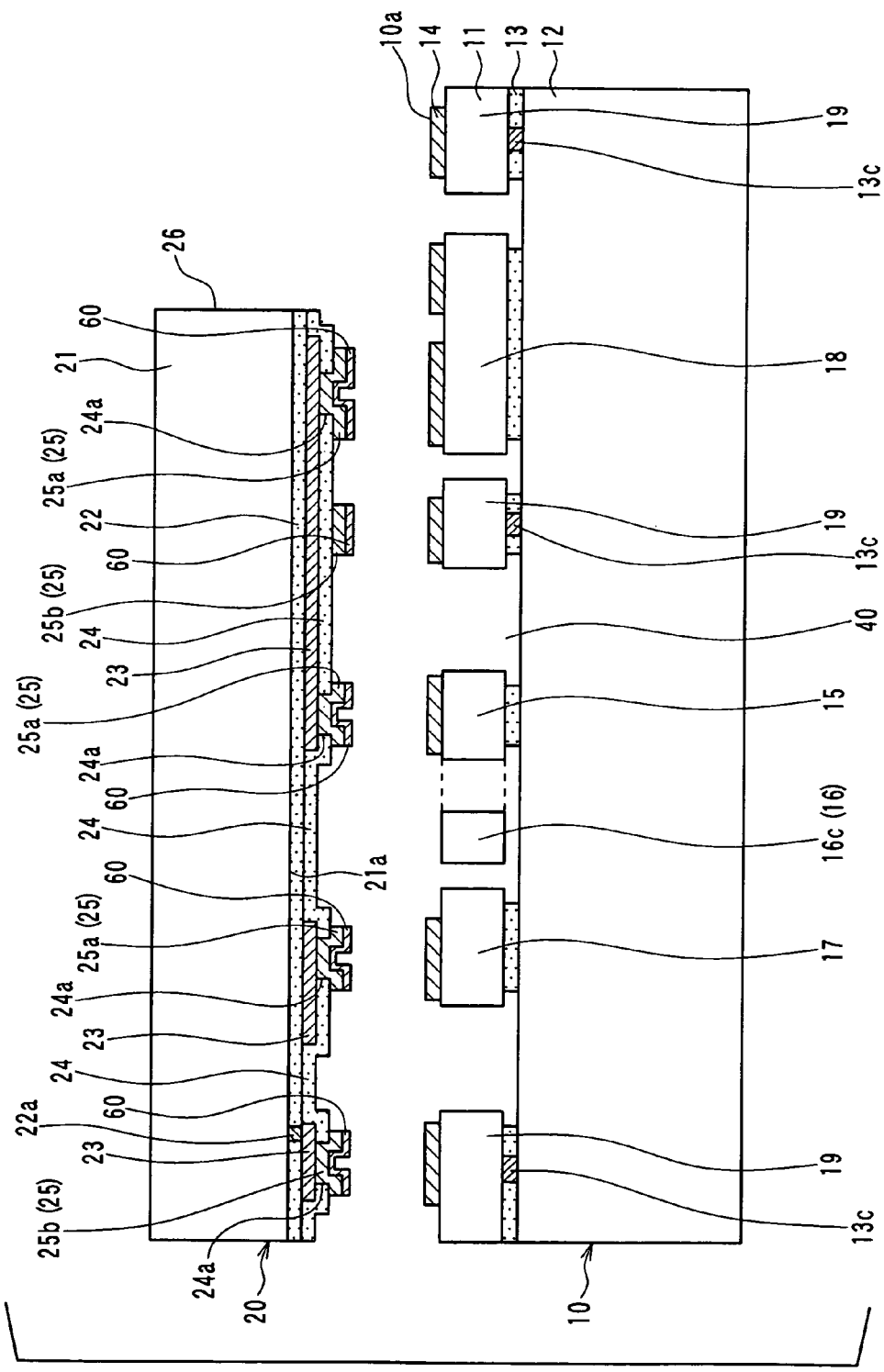

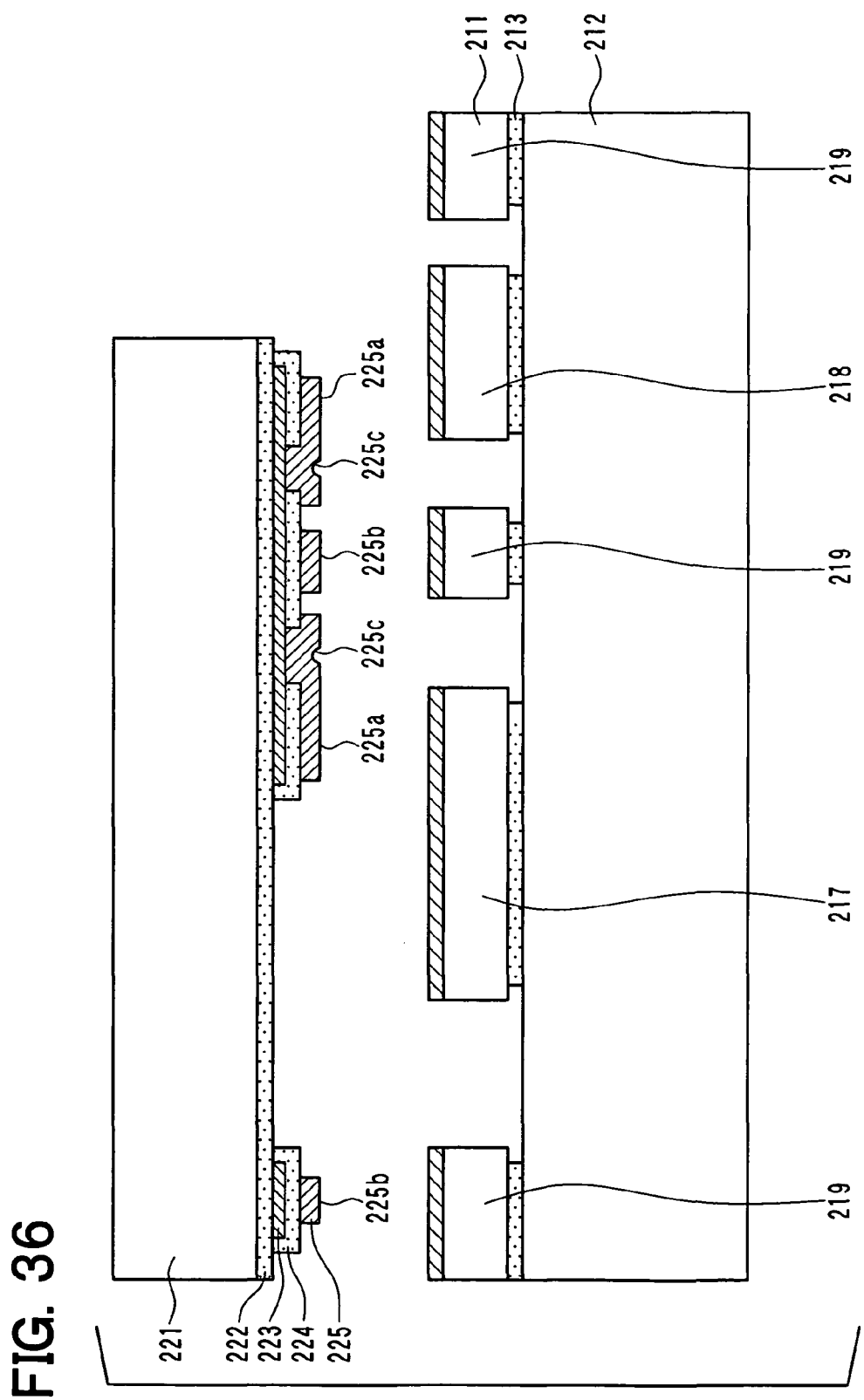

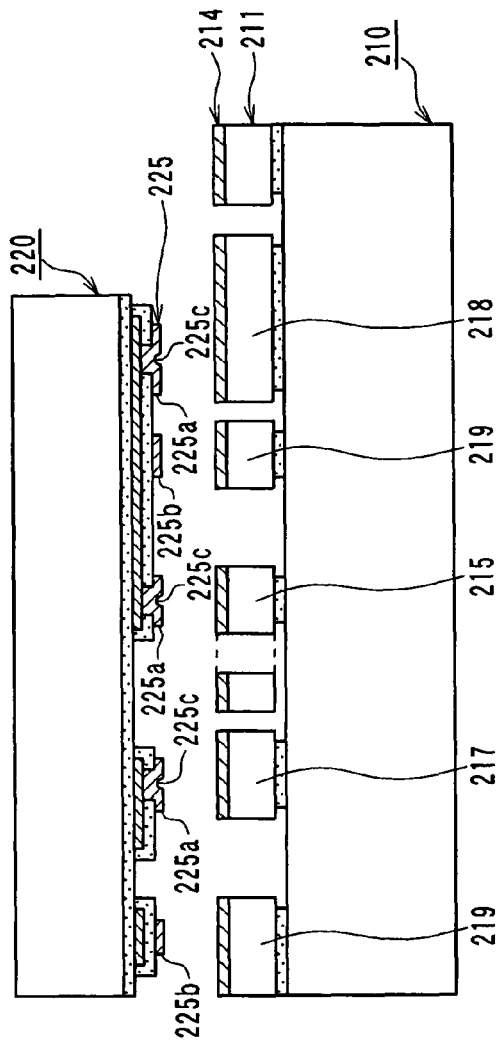
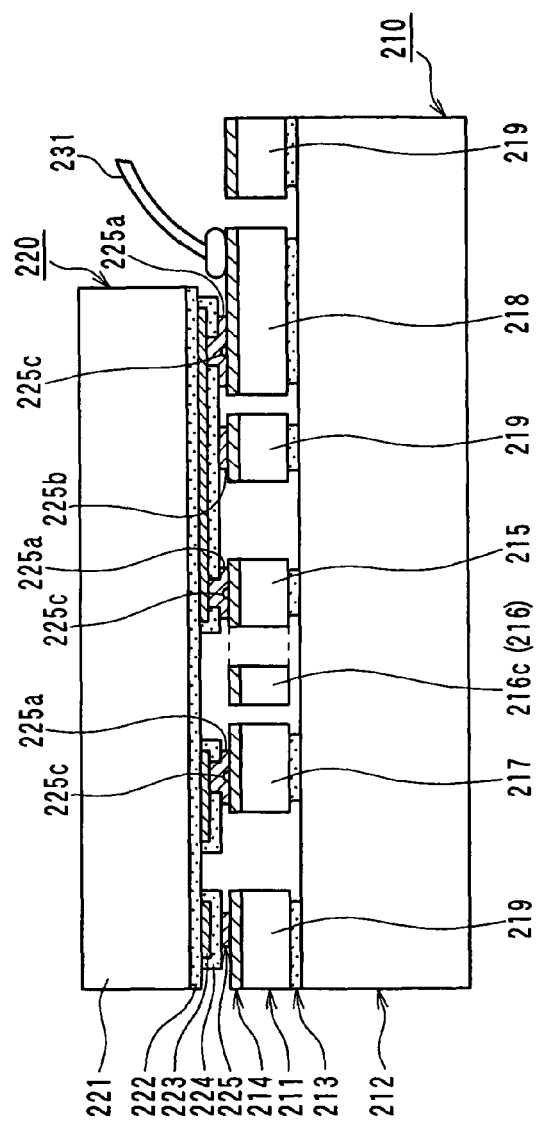
FIG. 40A RELATED ART
FIG. 40B RELATED ART

SEMICONDUCTOR DEVICE AND METHOD FOR MANUFACTURING THE SAME

CROSS REFERENCE TO RELATED APPLICATIONS

This application is based on Japanese Patent Applications No. 2008-321218 filed on Dec. 17, 2008, No. 2008-330252 filed on Dec. 25, 2008, and No. 2009-138031 filed on Jun. 9, 2009, the disclosures of which are incorporated herein by reference.

FIELD OF THE INVENTION

The present invention relates to a semiconductor device and a method for manufacturing a semiconductor device.

BACKGROUND OF THE INVENTION

Conventionally, an inertia force sensor having a device layer, an upper substrate and a lower substrate is proposed in, for example, JP-A-2004-333133. The device layer includes a movable portion and the like. The upper substrate is bonded to the upper side of the device layer, and the lower substrate is bonded to the lower side of the device layer. Thus, the movable, portion in the device layer is sealed with the upper and lower substrates. The upper substrate functions as a cap layer for covering the movable portion so that the upper substrate prevents water and foreign particle from penetrating into the movable portion.

Further, the upper substrate includes a through hole so as to expose a part of the device layer. Thus, a pad on the device layer is exposed in the through hole. A bonding wire is connected to the pad via the through hole so that the device layer is coupled with an external system electrically.

In the prior art, the through hole having a large depth is formed in the cap layer, and the bonding wire is connected to the device layer in a bottom of the through hole. Alternatively, the present inventors have proposed a structure of a sensor layer and a cap layer directly bonded together in Japanese Patent Application No. 2008-4144. Specifically, in the structure, a movable portion is formed in the sensor layer via a wiring patter, and the sensor layer and the cap layer are integrated.

However, it is necessary to flatten a surface of the wiring pattern since a flat surface of the sensor layer and a flat surface of the cap layer are bonded together. Further, even when the surface of the wiring pattern is flattened, a foreign particle may attach the surface of the wiring pattern. In such a case, the surface of the wiring pattern is roughened, and thereby, the sensor layer and the cap layer are not directly bonded together. Thus, connection and conduction in the device may be damaged.

Further, conventionally, a semiconductor physical quantity sensor for detecting physical quantity such as acceleration, yaw rate and vibration is disclosed in JP-A-H09-129898, JP-A-H11-295336, and JP-A-H06-123628. The sensor detects the physical quantity by detection of capacitance change between a movable portion and a fixed portion. The movable portion has a beam structure. The movable portion and the fixed portion are formed in a multi-layered SOI substrate, and function as a sensing portion. A wiring for connecting between parts of the sensor is made of poly crystal silicon.

Further, in JP-A-2004-333133, the cap layer covers the movable portion so that water and/or foreign particle are prevented from penetrating into the movable portion. The cap layer includes multiple through holes, and a bonding wire is directly bonded to a wire bonding pad of the SOI substrate. Thus, the bonding wire functions as a wiring layer.

Further, a semiconductor physical quantity sensor is disclosed in JP-A-2004-311951. In the sensor, a movable portion and the like is formed in a silicon layer of a SOI substrate, and a signal processing circuit is formed in a silicon layer of another SOI substrate. The silicon layer of the SOI substrate is bonded to the other silicon layer of the other SOI substrate via a ring shape bump. Another example of the ring shape bump is disclosed in JP-A-H11-94506. In these sensors, a wiring layer is formed in the sensor so as to electrically couple between the signal processing circuit and an external circuit. Further, the wiring layer is insulated from the ring shape bump, and the wiring layer steps over the bump, and the wiring layer is retrieved to the outside of the ring shape bump.

However, in the techniques disclosed in JP-A-H09-129898, JP-A-H11-295336, and JP-A-H06-123628, since the wiring layer made of poly crystal silicon is formed on the same substrate, on which the sensing portion is formed, a manufacturing process is complicated, and a manufacturing yield of the sensor is reduced.

Further, in the technique disclosed in JP-A-2004-333133, it is necessary to form multiple through holes ion the cap layer. Further, since the bonding wire is bonded to the wire bonding pad with using a bonding tool, it is necessary to form the through hole having a sufficient diameter so as not to contact the tool on an inner wall of the through hole. Thus, a chip size of a semiconductor chip, on which the semiconductor physical quantity sensor is formed, increases.

In the technique of JP-A-2004-311951, since the wiring layer steps over the ring shape bump, it is necessary to insulate the bump and the wiring layer with using an insulation film between the bump and the wiring layer. Thus, a structure of the semiconductor physical quantity sensor is complicated.

SUMMARY OF THE INVENTION

In view of the above-described problem, it is an object of the present disclosure to provide a semiconductor device with strong connection and sufficient conduction. It is another object of the present disclosure to provide a method for manufacturing a semiconductor device with strong connection and sufficient conduction.

According to a first aspect of the present disclosure, a semiconductor device includes: a sensor including a sensor structure and a periphery element, wherein the sensor structure is disposed on a first side of the sensor, and the periphery element surrounds the sensor structure; and a cap covering the sensor structure and having a second side, which is bonded to the first side of the sensor. The cap includes a first wiring layer, which is disposed on the second side of the cap. The first wiring layer steps over the periphery element. The sensor further includes a sensor side connection portion, and the cap further includes a cap side connection portion. The sensor side connection portion is bonded to the cap side connection portion. At least one of the sensor side connection portion and the cap side connection portion provides an eutectic alloy so that the sensor side connection portion and the cap side connection portion are bonded to each other.

Since a part of the sensor side connection portion or a part of the cap side connection portion are alloyed to be the eutectic alloy, concavities and convexities on the sensor side connection portion and the cap side connection portion are filled with the eutectic alloy. Thus, the sensor side connection portion and the cap side connection portion are bonded to each other with strong connection and sufficient conduction. Further, since the first wiring layer can be made of the same material as the sensor side connection portion and/or the cap side connection portion. Thus, structure of the device is simplified, and thereby, structural stability of the device is improved, and a manufacturing cost of the device is reduced.

According to a second aspect of the present disclosure, a method for manufacturing a semiconductor device includes: forming a sensor structure on a first side of a sensor; forming a periphery element surrounding the sensor structure; preparing a cap for covering the sensor structure; forming a first wiring layer on a second side of the cap; and bonding the first side of the sensor and the second side of the cap. The first wiring layer steps over the periphery element. The sensor includes a sensor side connection portion, and the cap includes a cap side connection portion. The bonding includes alloying at least one of the sensor side connection portion and the cap side connection portion to be an eutectic alloy so that the sensor side connection portion and the cap side connection portion are bonded to each other.

Since a part of the sensor side connection portion or a part of the cap side connection portion are alloyed to be the eutectic alloy, concavities and convexities on the sensor side connection portion and the cap side connection portion are filled with the eutectic alloy. Thus, the sensor side connection portion and the cap side connection portion are bonded to each other with strong connection and sufficient conduction. Further, since the first wiring layer can be made of the same material as the sensor side connection portion and/or the cap side connection portion. Thus, structure of the device is simplified, and thereby, structural stability of the device is improved, and a manufacturing cost of the device is reduced.

According to a third aspect of the present disclosure, a semiconductor device includes: a sensor having a plate shape and including a sensor structure, which is arranged on a first side of the sensor; and a cap having a second side, which is bonded to the first side of the sensor. The cap includes a first wiring layer, an insulation film and a second wiring layer, which are disposed on the second side of the cap. The first wiring layer connects between an outer periphery of the first side of the sensor and the sensor structure. The insulation film is disposed on the first wiring layer, and includes an opening. The first wiring layer is exposed from the insulation film via the opening. The second wiring layer includes a wiring portion. The wiring portion is disposed on the first wiring layer exposed from the insulation film. The wiring portion has a concavity, which is disposed over the opening and is concaved toward the opening. A region of the sensor structure connecting to the wiring portion is defined as a contact region. The contact region contacts a part of a surface of the wiring portion other than the concavity.

In the above device, since a whole of the contact region is bonded to the wiring portion, a bonding area between the contact region and the wiring portion is sufficiently secured. Thus, a bonding strength between the sensor and the cap is improved.

According to a fourth aspect of the present disclosure, a semiconductor device includes: a first chip having a plate shape with a first side and including a first IC circuit, which is disposed on the first side of the first chip; and a second chip having a plate shape with a second side and including a second IC circuit, which is disposed on the second side of the second chip. The first chip further includes: a first insulation film disposed on the first IC circuit; a first wiring layer disposed on the first insulation film and coupled with the first IC circuit; a second insulation, film disposed on the first wiring layer and having a first opening for exposing the first wiring layer from the second insulation film; and a second wiring layer disposed on the first wiring layer exposed from the second insulation film via the first opening. The second wiring layer includes a first concavity, which is disposed over the first opening and is concaved toward the first opening. The second chip further includes: a third insulation film disposed on the second IC circuit; a third wiring layer disposed on the third insulation film and coupled with the second IC circuit; a fourth insulation film disposed on the third wiring layer and having a second opening for exposing the third wiring layer from the fourth insulation film; and a fourth wiring layer disposed on the third wiring layer exposed from the fourth insulation film via the second opening. The fourth wiring layer includes a second concavity, which is disposed over the second opening and is concaved toward the second opening. The first concavity of the second wiring layer faces the second concavity of the fourth wiring layer. The second wiring layer of the first chip is bonded to the fourth wiring layer of the second chip so that the first side of the first chip is coupled with the second side of the second chip.

In the above device, the first concavity of the second wiring layer in the first chip is not covered with the fourth wiring layer of the second chip. Further, the second concavity of the fourth wiring layer in the second chip is not covered with the second wiring layer in the first chip. Thus, a bonding area between the second wiring layer and the fourth wiring layer is sufficiently secured. Thus, a bonding strength between the first chip and the second chip is improved.

According to a fifth aspect of the present disclosure, a method for manufacturing a semiconductor device includes: forming a sensor structure on a first side of a sensor having a plate shape; forming and patterning a first wiring layer on a second side of a cap in such a manner that the first wiring layer connects between an outer periphery of the first side of the sensor and the sensor structure; forming an insulation film on the first wiring layer; forming an opening in the insulation film so, as to expose the first wiring layer from the insulation film via the opening, wherein a region of the sensor structure to be connected to the cap is defined as a contact region, and the opening of the insulation film does not face the contact region; forming and patterning a second wiring layer on the insulation film so as to have a wiring portion, wherein the wiring portion is disposed on the first wiring layer exposed from the insulation film, and the wiring portion has a concavity with a bottom; flattening a surface of the wiring portion so as to leave the bottom of the concavity; and bonding the second side of the cap and the first side of the sensor in such a manner that the contact region of the sensor structure is bonded to a part of a surface of the wiring portion, which is spaced apart from a region of the wiring portion corresponding to the opening of the insulation film.

In the above method, since a whole of the contact region is bonded to the wiring portion, a bonding area between the contact region and the wiring portion is sufficiently secured. Thus, a bonding strength between the sensor and, the cap is improved. Further, since it is not necessary to remove the concavity completely in the flattening the surface of the wiring portion, productivity of the semiconductor device is improved.

According to a sixth aspect of the present disclosure, a method for manufacturing a semiconductor device includes: forming a first IC circuit on a first side of a first chip having a plate shape; forming a first insulation film on the first IC circuit; forming a first wiring layer on the first insulation film and coupling the first wiring layer and the first IC circuit; forming a second insulation film on the first wiring layer; forming a first opening in the second insulation film in such a manner that the first wiring layer is exposed from the second insulation film via the first opening; forming a second wiring layer on the first wiring layer exposed from the second insulation film via the first opening, wherein the second wiring layer includes a first concavity, which is disposed over the first opening and is concaved toward the first opening; forming a second IC circuit on a second side of a second chip having a plate shape; forming a third insulation film on the second IC circuit; forming a third wiring layer on the third insulation film and coupling the third wiring layer and the second IC circuit; forming a fourth insulation film on the third wiring layer; forming a second opening in the fourth insulation film in such a manner that the third wiring layer is exposed from the fourth insulation film via the second opening; forming a fourth wiring layer on the third wiring layer exposed from the fourth insulation film via the second opening, wherein the fourth wiring layer includes a second concavity, which is disposed over the second opening and is concaved toward the second opening; facing the first concavity of the second wiring layer and the second concavity of the fourth wiring layer; and bonding the second wiring layer of the first chip and the fourth wiring layer of the second chip so that the first side of the first chip is coupled with the second side of the second chip.

In the above method, the first concavity of the second wiring layer in the first chip is not covered with the fourth wiring layer of the second chip. Further, the second concavity of the fourth wiring layer in the second chip is not covered with the second wiring layer in the first chip. Thus, a bonding area between the second wiring layer and the fourth wiring layer is sufficiently secured. Thus, a bonding strength between the first chip and the second chip is improved. Further, since it is not necessary to remove the first and second concavities completely, productivity of the semiconductor device is improved.

BRIEF DESCRIPTION OF THE DRAWINGS

The above and other objects, features and advantages of the present invention will become more apparent from the following detailed description made with reference to the accompanying drawings. In the drawings:

FIGS. 4A to 4C are diagrams showing a manufacturing process of the sensor portion;

FIGS. 9A and 9B are diagrams showing a step for forming a second wiring layer in a semiconductor device according to a third embodiment;

FIG. 10 is a diagram showing a cross sectional view of a semiconductor device according to a fourth embodiment;

FIGS. 11A to 11C are diagrams showing a manufacturing method of the semiconductor device in FIG. 10;

FIGS. 14A to 14B are diagrams showing a manufacturing method of the semiconductor device in FIG. 13;

FIG. 26A is a diagram showing a plan view of a semiconductor device according to a sixteenth embodiment, and FIG. 26B is a diagram showing a cross sectional view of the device taken along line XXVIB-XXVIB in FIG. 26A;

FIG. 30 is a diagram showing a manufacturing method of the semiconductor device in FIG. 29;

FIG. 36 is a diagram showing a bonding process between the sensor portion and the cap portion;

FIGS. 40A and 40B are diagrams showing a semiconductor physical quantity sensor according to a related art.

DETAILED DESCRIPTION OF THE PREFERRED EMBODIMENTS

Figure 1:
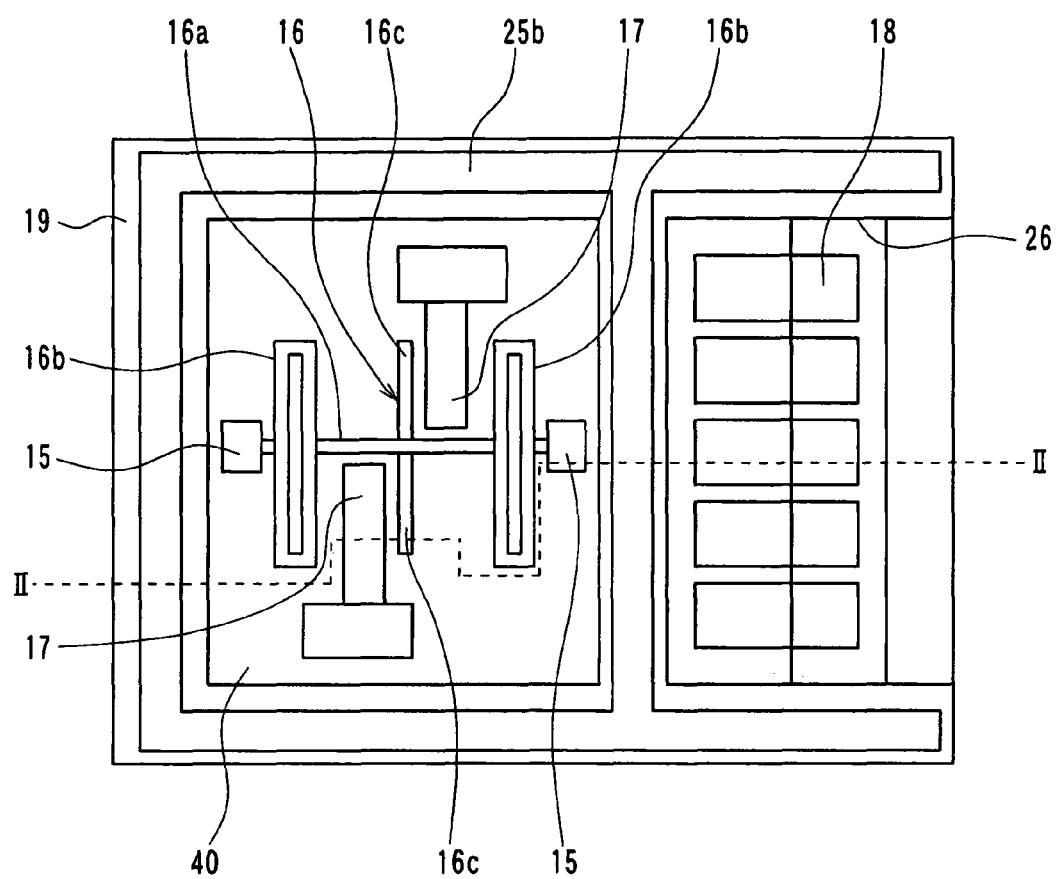
FIG. 1 is a diagram showing a plan view of a semiconductor device according to a first embodiment.

In view of the above points, the present inventors have studied a semiconductor device, a structure of a semiconductor sensor, and a manufacturing method of the device. This technique is disclosed in Japanese Patent Application No. 2008-4144, and the technique provides to simplify a structure of the sensor and to reduce a chip size of a semiconductor chip. Here, the above disclosure does not constitute a prior art, and is merely a preliminary study by the present inventors.

In the above technique, as shown in FIGS. 40A and 40B, the first wiring layer 223 is formed on the first insulation film 222 and patterned into a certain pattern. Then, the second insulation 24 is formed on the first insulation film 222 and the first wiring layer 223. An opening for exposing the first wiring layer 223 is formed at a part of the second insulation film 224, which faces the first electrode of the sensor 210. Then, after the second wiring layer 225 is formed on a region including the opening 24a, the second wiring layer 225 is bonded to the fixed electrode and the like in the sensor portion 210. Thus, the sensor portion 210 and the cap portion 220 are stacked, and the fixed electrode and the like in the sensor portion 210 is electrically coupled with the second wiring layer 225 in the cap portion 220.

However, when the second wiring layer 225 is formed in the opening 224a of the second insulation film 222, the concavity 225c may be formed at a position corresponding to the opening 224a. The concavity 225c is concaved on the second wiring layer 225a. The concavity 225c is formed by a step coverage effect. Thus, when the second wiring layer 225 is bonded to the fixed electrode and the like in the sensor portion 225, the concavity 225c in the second wiring layer 225 does not contact the fixed electrode and the like in the sensor portion 210. Thus, the contact area is reduced.

Thus, to improve the contact area of the second wiring layer 225, the second wiring layer 225 may be polished so as to remove the concavity. However, when the thickness of the substrate becomes thin, a product yield of the device may increase.

First Embodiment

A semiconductor device according to a first embodiment is suitably used for an integrated circuit such as an IC and a LSI, a semiconductor physical quantity sensor having a movable portion, and a MEMS oscillator, each of which is covered with a cap layer. The semiconductor physical quantity sensor is, for example, an acceleration sensor, an angular speed sensor, i.e., a gyro sensor and the like.

The semiconductor device according to the first embodiment is the physical quantity sensor having the movable portion. The physical quantity sensor is suitably used for detecting physical quantity such as acceleration and angular, speed. Specifically, the semiconductor device in the first embodiment detects acceleration in a direction parallel to a surface of a substrate.

Figure 2:
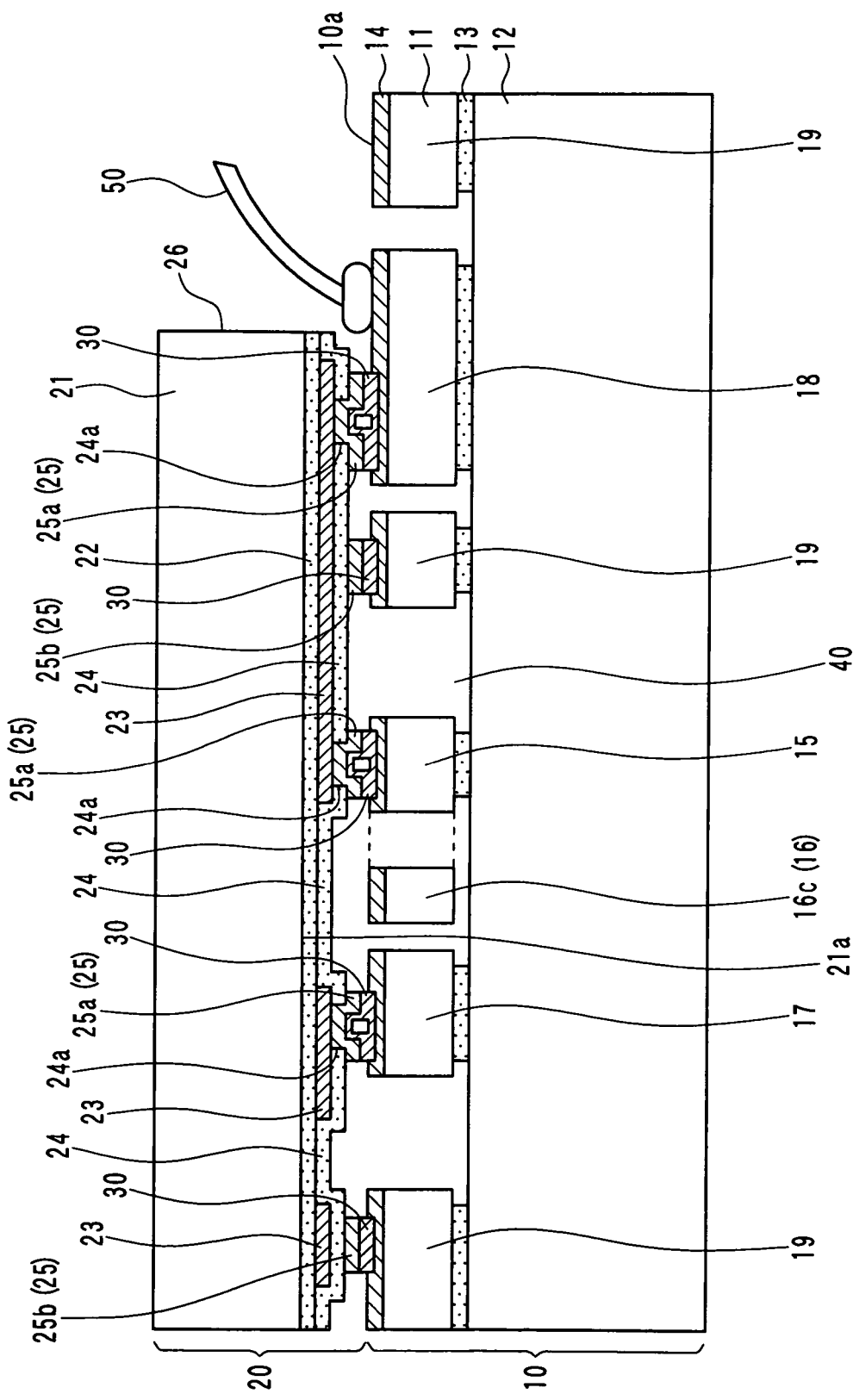
FIG. 2 is a diagram showing a cross sectional view of the device taken along line II-II in FIG. 1.
Figure 3A:
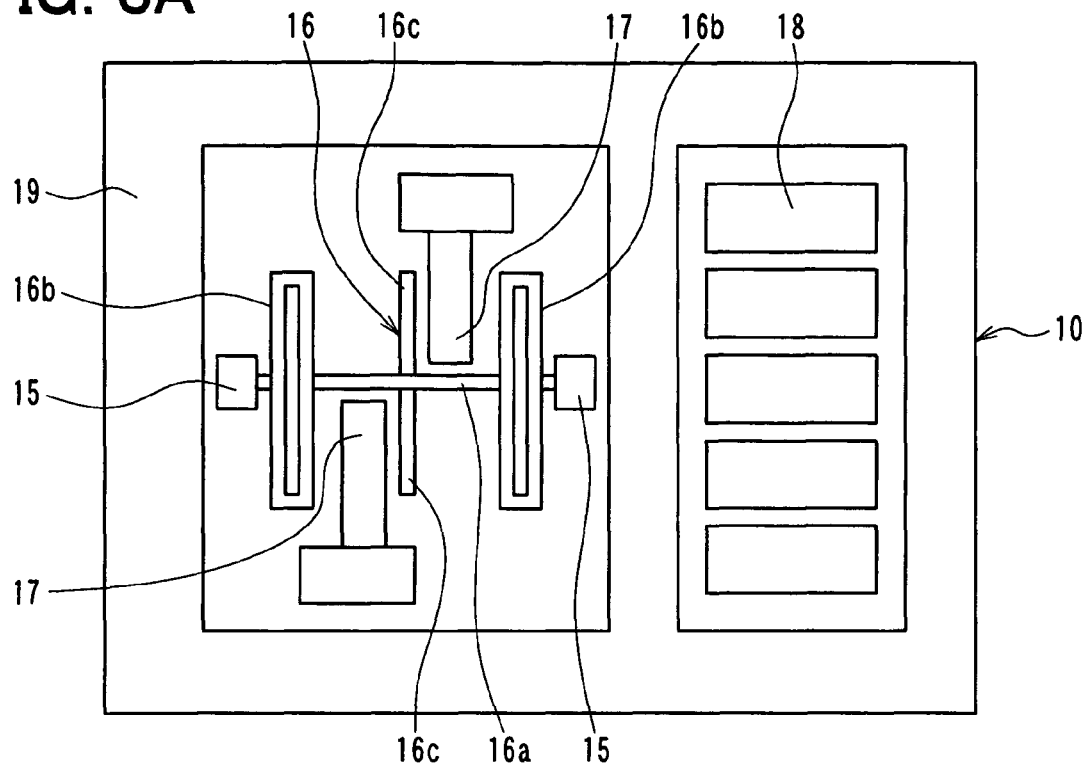
FIG. 3A is a diagram showing a plan view of a sensor portion.
Figure 3B:
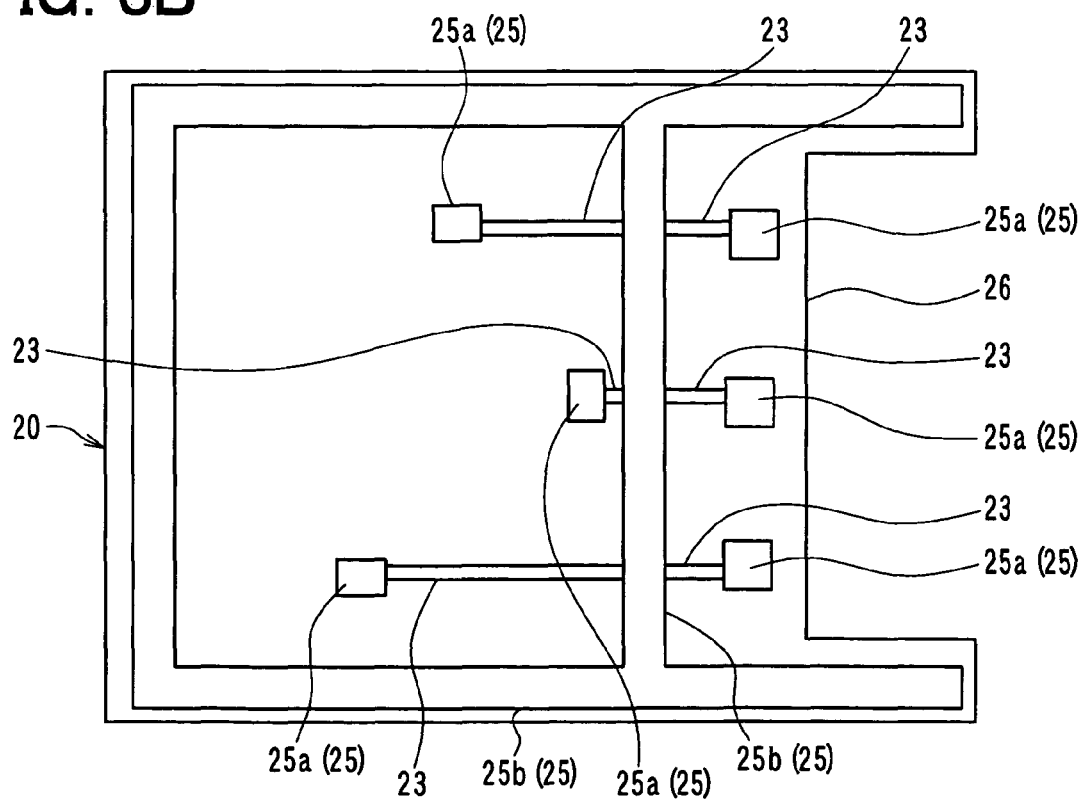
FIG. 3B is a diagram showing a plan view of a cap portion.

FIGS. 1-3B show the semiconductor device according to the first embodiment. In FIGS. 3A and 3B, one side 10a of a sensor portion 10 and one side of a cap portion 20 are shown.

The one side of the sensor portion 10 faces the one side of the cap portion 20. With reference to FIGS. 1-3B, a structure of the semiconductor device will be explained.

As shown in FIG. 2, in the semiconductor device, the sensor portion 10 and the cap portion 20 are stacked. The sensor portion 10 has a plate shape with the one side 10a. The cap portion 20 is bonded to the one side 10a of the sensor portion 10.

The structure of the sensor portion 10 will be explained. The sensor portion 10 includes a sensing portion for detecting physical quantity such as acceleration. The sensor portion 10 includes a SOI substrate having a first silicon layer 11, an insulation layer 13 and a second silicon layer 12, which are stacked in this order so that the insulation layer 13 is sandwiched between the first and second silicon layers 11, 12. In this embodiment, a wiring layer 14 made of aluminum is formed on a surface of the first silicon layer 11. Accordingly, the surface of the wiring layer 14 provides the one side 10a of the sensor portion 10.

As shown in FIG. 3A, the sensing portion having an anchor 15, a vibrator 16, a fixed electrode 17, a connection element 18 and a periphery element 19 is formed in the first silicon layer 11. Here, the vibrator 16 is, for example, a movable electrode of the acceleration sensor.

The anchor 15 has a block shape for supporting the vibrator 16 with respect to the second silicon layer 12. The anchor 15 includes two parts, which are disposed on the insulation layer 13. The vibrator 16 is arranged between two anchor parts 15.

The vibrator 16 includes a linear part 16a, a beam 16b, and a movable electrode 16c. The linear part 16a connects between two anchor parts 15. The beam 16b is connected to the linear part 16a. The movable electrode 16c extends along with a direction perpendicular to the linear part 16a. As shown in FIG. 2, since the vibrator 16 is arranged between two anchor parts 15, the vibrator 16 is spaced apart from the second silicon layer 12.

The fixed electrode 17 faces the movable electrode 16c in the vibrator 16. The fixed electrode 17 is fixed to the insulation layer 13. Thus, the movable electrode 16c and the fixed electrode 17 are arranged to have a comb-teeth shape. Thus, a comb-teeth type capacitor is formed. In FIG. 1, the number of comb-teeth provided by the movable electrode 16c and the fixed electrode 17 is minimized. Alternatively, the number of comb-teeth provided by the movable electrode 16c and the fixed electrode 17 may be larger than the minimum number.

The anchor 15, the vibrator 16 and the fixed electrode 17 provide a comb-teeth structure as a sensor structure.

The connection element 18 functions as a terminal for electrically coupling between the semiconductor device and an external system. As shown in FIG. 2, the connection element 18 is arranged on a periphery of the one side 10a of the sensor portion 10. The wiring layer 14 is disposed on a part of the first silicon layer 11 provided by the connection element 18. Accordingly, the device is electrically coupled with the external system via the wiring layer 14.

As shown in FIG. 3A, the periphery element 19 surrounds the sensor structure and the connection element 18. Specifically, the periphery element 19 surrounds a whole circumference of the sensor structure and the connection element 18. The periphery element 18 is, bonded to the cap layer 20 so that the sensor structure is sealed. Alternatively, the periphery element 19 may not surround a whole circumference of the sensor structure and the connection element 18. In this case, the device functions without difficulty.

The cap portion 20 will be explained. As shown In FIG. 2, the cap portion 20 includes a silicon substrate 21, a first insulation film 22, a first wiring layer 23, a second insulation film 24, and a second wiring layer 25.

As shown in FIG. 3B, the silicon substrate 21 having a square shape includes a concavity 26, which hollows on one side of the square shape. The concavity 26 provides to expose the connection element 18 from the silicon substrate 21 when the sensor portion 10 is bonded to the cap portion 20. Alternatively, the cap portion 20 may not include the concavity 26. In this case, both edges of the concavity 26, i.e., both protrusions on periphery of the concavity 26, may be removed.

The first insulation film 22 is formed on the one side 21a of the substrate 21, which faces the sensor portion 10. The first insulation film 22 is made of, for example, $SiO_2$, $Si_3N_4$ or the like.

The first wiring layer 23 is disposed on the first insulation film 22, and patterned. The first wiring layer 23 is patterned to connect between the anchor 15 and the connection element 18 and further to connect between the fixed electrode 17 and the connection element 18. Further, the first wiring layer 23 is arranged at a position corresponding to the periphery element 19. The first wiring layer 23 is made of, for example, aluminum.

The second insulation film 24 is formed to cover the first wiring layer 23. The second insulation film 24 includes openings 24a, which face the anchor 15, the fixed electrode 27 and the connection element 18, respectively.

The second wiring layer 25 is filled in the openings 24a and further formed on the second insulation film 24. The second wiring layer 25 is patterned. Specifically, the second wiring layer 25 includes a wiring portion 25a and a sealing portion 25b. The wiring portion 25a is connected to the anchor 15, the fixed electrode 17 and the connection element 18, which provide the sensor structure of the sensor portion 10. The sealing portion 25b is connected to the periphery element 19 of the sensor portion 10. The wiring portion 25a and the sealing portion 25b are disposed on the same layer, and are electrically insulated from each other. The second wiring layer 25 is made of, for example, aluminum.

A part of the wiring portion 25a filled in the openings 24a of the second insulation film 24 is concaved because of a step coverage effect. Thus, the surface of the part of the wiring portion 25a hollows.

As shown in FIG. 3B; the sealing portion 25b has a ring shape corresponding to the periphery element 19. Thus, one end of the sealing portion 25b is connected to the other end of the sealing portion 25b. Thus, the sealing portion 25b surrounds the sensor structure. Specifically, the sealing portion surrounds a whole circumference of the sensor structure. The second wiring layer 25 providing the sealing portion 25b is a different layer of the first wiring layer 23. Thus, the sealing portion 25b can step over the first wiring layer 23. The sealing portion 25b may be a floating potential. Alternatively, the sealing portion 25b may be a predetermined potential such as a ground potential. Thus, the first wiring layer 23, the second insulation film 24, and the second wiring layer 25 are patterned to connect between the outer periphery of the one side 21a of the silicon substrate 21 and the sensor structure.

In a wiring structure in the second wiring layer 25, the wiring portion 25a and the sealing portion 25b have the same height from the one side of the substrate 21. In this embodiment, the first wiring layer 23 is arranged at a position corresponding to the periphery element 19, so that the sealing portion 25b and the wring portion 25a have the same height.

The second wiring layer 25 in the cap portion 20 and the wiring layer 14 in the sensor portion 10 are bonded together in eutectic manner. Specifically, a germanium layer as a conductive layer is sandwiched between the second wiring layer 25 and the wiring layer 14. Then, the germanium layer is heated so that the germanium layer and a part of the second wiring layer 25 form eutectic alloy, and further, the germanium layer and a part of the wiring layer 14 form eutectic alloy. Thus, a eutectic alloy portion 30 is formed. The eutectic alloy portion 30 is made of aluminum-germanium alloy.

The eutectic alloy means that aluminum in the second wiring layer 25 and germanium in the wiring layer 14 are melt so that aluminum and germanium form alloy. Accordingly, in this embodiment, all of the germanium layer is melt and forms the eutectic alloy so that no germanium layer remains. Alternatively, a part of the germanium layer may remain without forming the eutectic alloy. In this embodiment, all of the germanium layer reacts with the second wiring layer 25 and the wiring layer 14 so that all of the germanium layer is changed to the eutectic alloy portion 30. Thus, the eutectic alloy portion 30 penetrates into a part of the second wiring layer 25 and a part of the wiring layer 14. Specifically, the part of the second wiring layer 25 and the part of the wiring layer 14 are alloyed in eutectic manner.

The germanium layer reacts with only aluminum in the part of the wiring portion 25a in the second wiring layer 25, which is concaved because of the step coverage effect, so that the germanium layer and the aluminum in the wiring portion 25a form the eutectic alloy portion 30. Specifically, in the openings 24a of the second insulation film 24, the germanium layer does not react with the wiring layer 14.

Thus, the sealing portion 25b of the cap portion 20 is bonded to the periphery element 19 of the sensor portion 10 via the eutectic alloy portion 30. Thus, as shown in FIG. 2, the sensor structure is sealed between the sensor portion 10 and the cap portion 20. Specifically, the sensor portion 10 and the cap portion 20 provide a sealed portion 40 therebetween, so that the sensor structure is disposed in the sealed portion 40. Thus, the sensor structure is sealed in the sealed portion 40, which is surrounded with the second silicon layer 12, the insulation layer 13, the periphery element 19, the sealing portion 25b, the eutectic alloy portion 30 and the second insulation film 24. In this embodiment, the sealed portion 40 is in vacuum.

The wiring portion 25a of the cap portion 20 in the sealed portion 40 is bonded to the anchor 15 via the eutectic alloy portion 30. The anchor 15 is electrically connected to the connection element 18 via the eutectic alloy portion 30 in the sealed portion 40, the wiring portion 25a in the sealed portion 40, the first wiring layer 23 in the sealed portion 40, the wiring portion 25a outside the sealed portion 40, and the eutectic alloy portion 30 outside the sealed portion 40. Similarly, the fixed electrode 17 is electrically connected to the connection element 18 via the eutectic alloy portion 30 in the sealed portion 40, the wiring portion 25a in the sealed portion 40, the first wiring layer 23 in the sealed portion 40, the eutectic alloy portion 30 outside the sealed portion 40, and the wiring portion 25a outside the sealed portion 40.

The sensor structure is accommodated in the sealed portion 40 between the sensor portion 10 and the cap portion 20, so that water and foreign particles are prevented from being penetrated into the sensor structure. Thus, the sensor structure is protected from water and foreign particles.

As shown in FIG. 1, the connection elements 18 of the sensor portion 10 are exposed from the cap portion 20 via the concavity 26 formed in the cap portion 20. A wire 50 is connected to the connection element 18 exposed from the cap portion 20. Thus, the semiconductor device is electrically connected to an external system via the wire 50.

A manufacturing method of the semiconductor device will be explained with reference to FIGS. 4A to 6. The following explanation will be performed with reference to one chip of the semiconductor device. In general, multiple chips in a wafer are simultaneously manufactured.

As shown in FIG. 4A, a SOI substrate is prepared. Specifically, a surface of a single crystal silicon substrate as the second silicon layer 12 is thermally oxidized so that a $SiO_2$ film as the insulation layer 13 is formed on the second silicon layer 12. The single crystal silicon substrate has a specific resistance in a range between 0.001 ω·cm (i.e., ohm centimeters) and 0.1 ω·cm, and has a thickness in a range between 300 μm (i.e., micrometers) and 600 μm. Further, the single crystal silicon substrate has a N conductive type and a (100)-orientation surface. The $SiO_2$ film has a thickness in a range between 5 μm and 100 μm. A single crystal silicon layer as the first silicon layer 11 is formed on the $SiO_2$ film. The single crystal silicon layer has the same specific resistance and the same orientation surface as the single crystal silicon substrate. The single crystal silicon layer has a $N^+$ conductive type. In this embodiment, the thickness of the first silicon layer 11 is 15 μm. Thus, the SOI substrate, in which the insulation layer 13 is sandwiched between the first and second silicon layers 11, 12, is completed.

In the above embodiment, the first silicon layer 11 is made of $N^+$ conductive type silicon. Alternatively, the first silicon layer 11 may be made of $P^+$ conductive type silicon. Further, the first silicon layer 11 may be made of $N^+$ conductive type poly-crystal silicon or $P^+$ conductive type poly-crystal silicon. When the first silicon layer 11 may be made of $N^+$ conductive type poly-crystal silicon or $P^+$ conductive type poly-crystal silicon, the insulation layer 13 may have a contact hole so that the first silicon layer 11 is electrically coupled with the second silicon layer 12. Furthermore, although the SOI substrate is prepared in the above embodiment, a glass substrate, a metallic substrate, a ceramics substrate, or other material substrates may be prepared. The thickness of the first and second silicon layers 11, 12 may be different from the above thickness in the present embodiment.

As shown in FIG. 4B, an aluminum layer as the wiring layer 14 having a thickness in arrange between 0.3 micrometers and 1 micrometer is formed on the first silicon layer 11 in the SOI substrate by a CVD method or the like. In this case, the wiring layer 14 is formed to cover a whole surface of the first silicon layer 11.

Since the wiring layer 14 is formed to stack the aluminum layer, crystal grains of aluminum are stacked on the first silicon layer 11. Accordingly, the grains of aluminum are exposed on the surface of the aluminum layer 14, so that the surface of the aluminum layer 14 is rough. The surface of the aluminum layer 14 may be flattened by polishing the surface with a CMP polishing method.

In a step of FIG. 4C, a trench is formed in the wiring layer 14 and the first silicon layer 11 in a photo lithography and etching process. Thus, the anchor 15, the vibrator 16, the fixed electrode 17, the connection element 18 and the periphery element 19 are formed. At least a part of insulation layer 13 between the first silicon layer 11 for forming the vibrator 16 and the second silicon layer 12 is removed with an etchant in a gas phase or a liquid phase. The etchant is, for example, HF (i.e., hydrogen fluoride). Thus, the vibrator 16 is formed. Accordingly, the sensor portion 10 is completed.

Next, a manufacturing method of the cap portion 20 will be explained. Multiple cap portions 20 are formed in one silicon wafer.

Figure 5A:
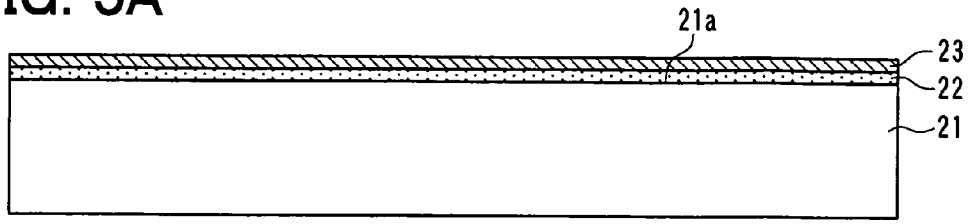
FIGS. 5A to 5E are diagrams showing a manufacturing process of the cap portion.

As shown in FIG. 5A, a single crystal silicon substrate 21 having almost the same characteristics as the second silicon layer 12 is prepared. A SiO2 film as the first insulation film 22 is formed on the one side 21a of the silicon substrate 21. Then, an aluminum film as the first wiring layer 23 having a thickness in a range between 0.3 micrometers and 1 micrometer is formed on the surface of the first insulation film 22.

Figure 5B:
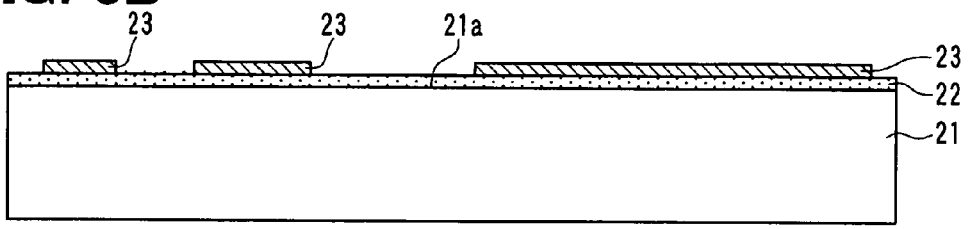

As shown in FIG. 5B, the aluminum film as the first wiring layer 23 is patterned in a photo lithography and etching method. Alternatively, the aluminum film may be deposited on the first insulation film 22 with using a metallic mask made of stainless steel having a hole. In this case, the aluminum film is formed by a mask evaporation method so that the aluminum film is preliminary patterned.

Figure 5C:
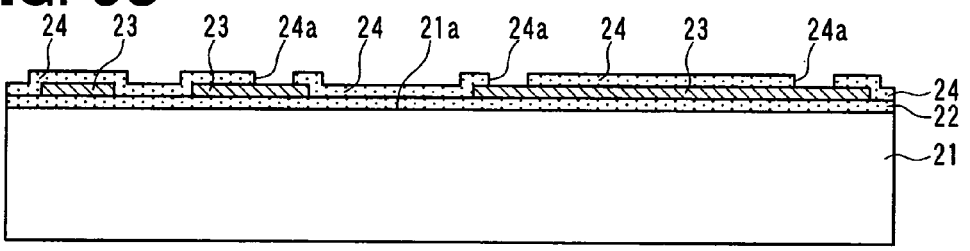

As shown in FIG. 5C, another $SiO_2$ film as the second insulation film 24 is formed on the first wiring layer 23. Openings 24a is formed in the second insulation film 24 at positions corresponding to the anchor 15, the fixed electrode 17 and the connection element 18.

The openings 24a may be arranged in the second insulation film 24 at positions, which are slightly shifted from the positions completely facing the anchor 15, the fixed electrode 17 and the connection element 18. The openings 24a are used for contacting the first wiring layer 23 and the second wiring layer 25, which is formed in a latter step.

In the present embodiment, only a part of the second insulation film 24 on the first wiring layer 23 is removed. Alternatively, a whole part of the second insulation film 24 facing the vibrator 16 may be removed. Thus, the vibrator 16 does not contact the second insulation film 24, and further, a parasitic capacitance of the vibrator 16 is reduced.

Figure 5D:
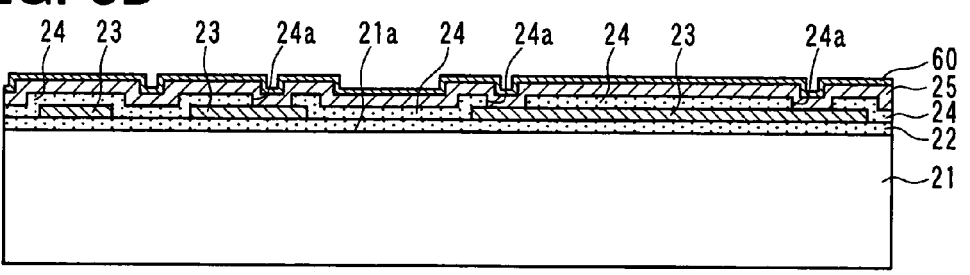

As shown in FIG. 5D, another aluminum layer as the second wiring layer 25 is formed on the second insulation film 24 and a part of the first wiring layer 23, which is exposed from the second insulation film 24 via the openings 24a. The aluminum layer has a thickness in a range between 0.3 micrometers and 1 micrometer. A conductive layer 60 made of germanium is formed on the aluminum layer. The conductive layer 60 has a thickness in a range between 0.3 micrometers and 1 micrometer. The second wiring layer 25 and the conductive layer 60 may be formed by a deposition method or a sputtering method.

Since the second wiring layer 25 is formed to stack the aluminum layer, crystal grains of aluminum are stacked on the first silicon layer 11. Accordingly, the grains of aluminum are exposed on the surface of the second wiring layer 25, so that the surface of the second wiring layer 25 is rough. After the above step, the conductive layer 60 is arranged on the rough surface of the second wiring layer 25.

After forming the second wiring layer 25, the surface of the second wiring layer 25 may be polished in a CMP polishing process. In this case, the conductive layer 60 is partially formed on the flat surface of the second wiring layer 25. The purpose of the CMP polish process is not to remove concavities caused by a step coverage effect. Accordingly, the concavities remain on the second wiring layer 25. In this case, the conductive layer may be formed on the surface of the second wiring layer 25 having the concavities.

Figure 5E:
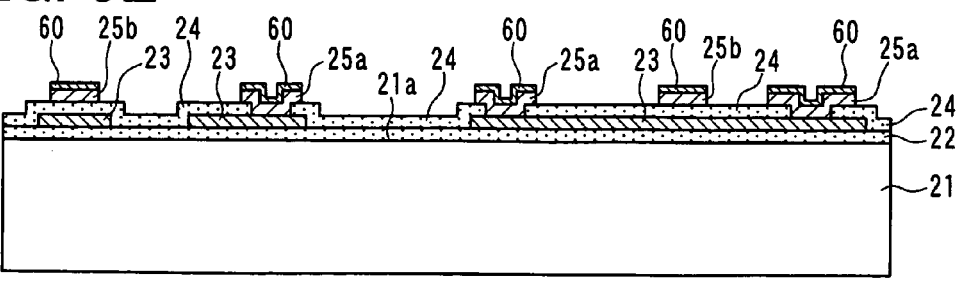

As shown in FIG. 5E, the wiring portion 25a and the sealing portion 25b are formed in the second wiring layer 25 by a patterning method or a mask deposition method. Then, the conductive layer 60 is formed on the wiring portion 25a and the sealing portion 25b. Thus, the wiring portion 25a of the second wiring layer 25 and the first wiring layer 23 are electrically connected to each other via the opening 24a of the second insulation film 24. Thus, the cap portion 20 is completed.

Figure 6:
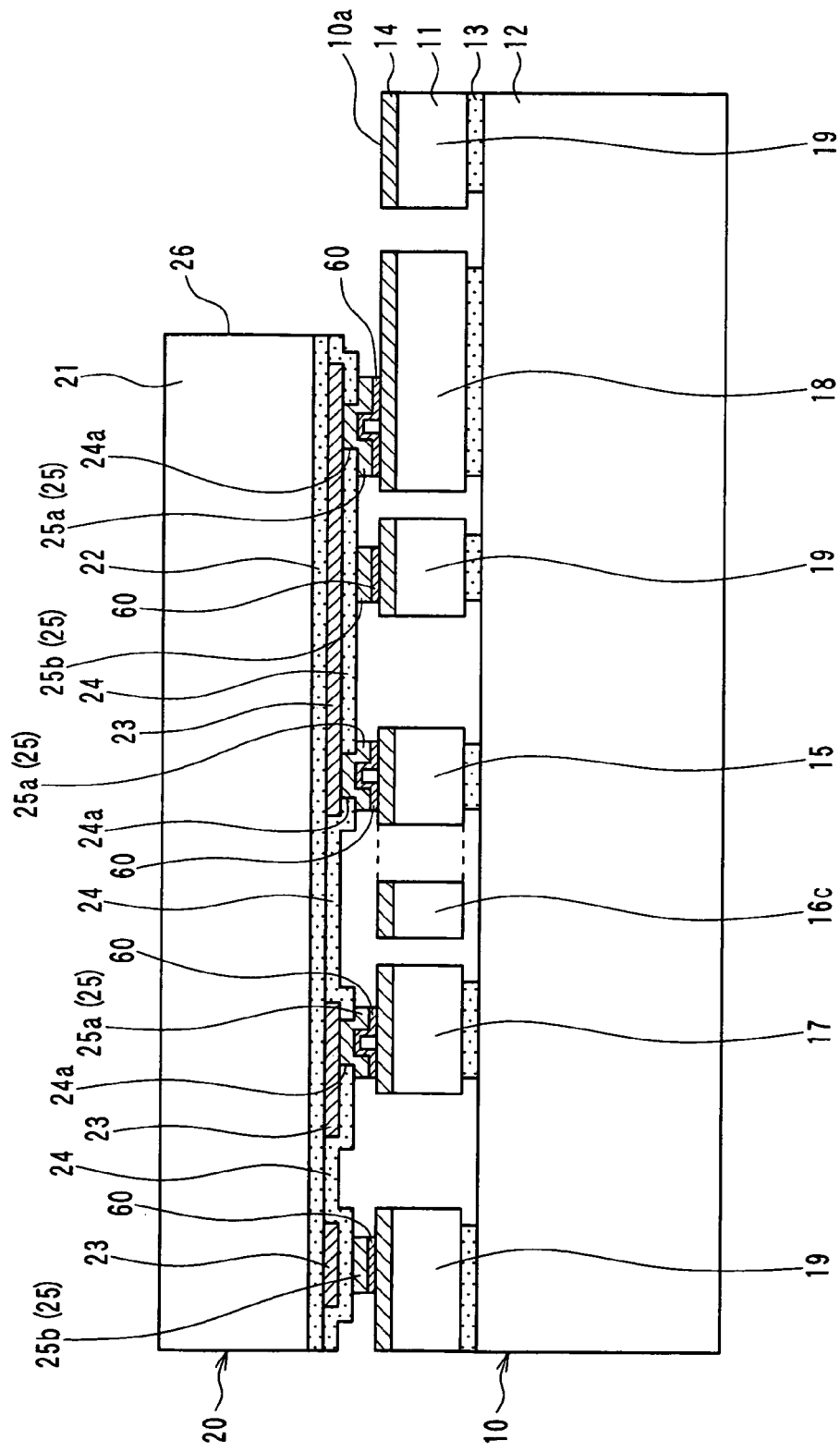
FIG. 6 is a diagram showing a step for bonding the sensor portion and the cap portion.

As shown in FIG. 6, the wafer having multiple sensor portions 10 and the wafer having multiple cap portions 20 are bonded together in a vacuum chamber. When the bonding process is executed, the wiring layer 14 of the sensor portion 10 is arranged to face the conductive layer 60 of the cap portion 20. Then, the distance between the sensor portion 10 and the cap portion 20 is reduced, so that the sensor portion 10 approaches the cap portion 20. Then, the wiring layer 14 contacts the conductive layer 60. Thus, the conductive layer 60 is sandwiched between the second wiring layer 25 of the cap portion 20 and the wiring layer 14 of the sensor portion 10.

The sensor portion 10 and the cap portion 20 are stacked and heated. Here, since the conductive layer 60 is made of germanium, and the second wiring layer and the wiring layer 14 are made of aluminum, eutectic temperature is about 420° C. when germanium content is 28.4 at %. Specifically, germanium content with respect to aluminum content is 28.4 at %, the eutectic temperature is 420° C.

For example, the melting point of aluminum is 660° C., and the melting point of germanium is 938° C. When aluminum contacts germanium, a contact portion reacts around a low temperature in a range between 420° C. and 440° C. so that eutectic reaction between aluminum and germanium occurs. Thus, germanium atoms are diffused into aluminum grain boundaries. Thus, aluminum atoms at a boundary between the second wiring layer 25 and the conductive layer 60 and at a boundary between the wiring layer 14 and the conductive layer 60, are replaced with germanium atoms. Thus, aluminum-germanium eutectic alloy is formed.

Specifically, aluminum and germanium in the conductive layer 60 melt into each other, so that the conductive layer 60 melts and expands on the second wiring layer 25 and the wiring layer 14 to fill the concavities and convexities on the surface of the second wiring layer 25 and the concavities and convexities on the surface of the wiring layer 14. Further, a part of the second wiring layer 25 and a part of the wiring layer 14 react with the conductive layer 60 so that the eutectic alloy is formed. Thus, the clearance between the surface of the second wiring layer 25 and the conductive layer 60 and the clearance between the surface of the wiring layer 14 and the conductive layer 60 are disappeared. Thus, the second wiring layer 25 and the wiring layer 14 are bonded to each other with the eutectic alloy. The eutectic alloy provides the eutectic alloy portion 30, as shown in FIG. 2.

Thus, since the conductive layer 60 and the part of the second wiring layer 25 and the part of the wiring layer 14 are alloyed to be the eutectic alloy portion 30, the conductive layer 60, the second wiring layer 25 and the wiring layer 14 are stably bonded together at a low temperature such as 420° C.

When the conductive layer 60 and the part of the second wiring layer 25 and the part of the wiring layer 14 are alloyed, a certain force is applied to each wafer so that one wafer is pressed on the other wafer. In this case, since the conductive layer 60 melts, the bonding between the melted conductive layer 60 and the second wiring layer 25 or the wiring layer 14 is promoted.

Thus, the periphery element 19 in the sensor portion 10 and the sealing portion 25b in the cap portion 20 are bonded together via the eutectic alloy portion 30. The sealed portion 40 is formed between the sensor portion 10 and the cap portion 20 so that the sensor structure is accommodated in the sealed portion 40. Further, the anchor 15, the fixed electrode 17 and the connection element 18 in the sensor portion 10 and the wiring portion 25a in the cap portion 20 are bonded together via the eutectic alloy portion 30, respectively. Thus, the sensor structure in the sensor portion 10 and the connection element 18 are electrically coupled with each other.

Figure 7:
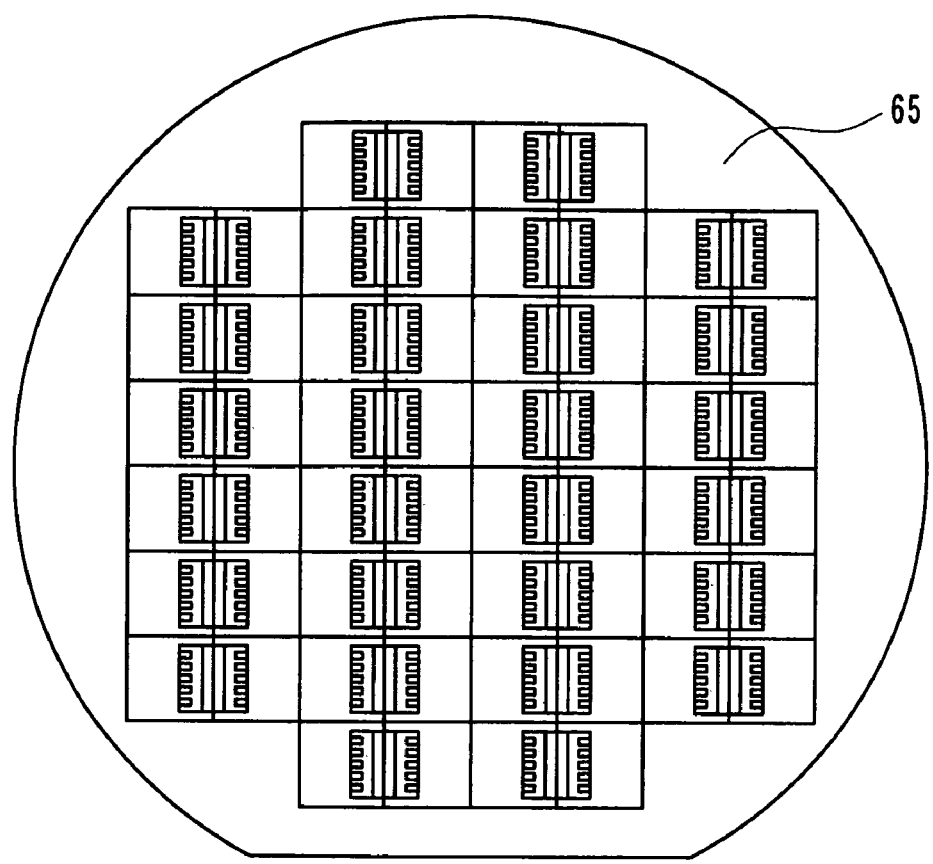
FIG. 7 is a diagram showing a plan view of a wafer having multiple semiconductor devices.

Thus, the sensor portions 10 and the cap portions 20 are formed on the wafers, respectively, and then, the wafers are bonded together. Thus, as shown in FIG. 7, multiple semiconductor devices are formed in a wafer 65. By dividing the wafer 65 into multiple chips, i.e., by cutting the wafer 65 in a dicing cut process so as to divide the wafer 65 into multiple semiconductor chips, individual semiconductor device is formed.

Further, the semiconductor device is mounted on a circuit board or the like (not shown). As shown in FIG. 2, the connection element 18 is coupled with an external circuit via the wire 50, so that an electric signal corresponding to the physical quantity detected by the sensor structure is output to the external circuit, which is disposed outside of the semiconductor device.

A detection method for detecting acceleration in the semiconductor device will be explained. When acceleration is applied to the semiconductor device, the beam 16b of the vibrator 16 bends. The vibrator 16 is displaced with respect to the fixed electrode 17 along with a longitudinal direction of the linear part 16a. The fixed electrode 17 is fixed at a predetermined position of the device. Accordingly, the distance between the movable electrode 16c and the fixed electrode 17 is changed, and thereby, the capacitance between the movable electrode 16c and the fixed electrode 17 is changed. By measuring the capacitance, the acceleration is detected by the device.

In the present embodiment, the conductive layer 60 made of germanium is formed on the second wiring layer 25 made of aluminum so that the conductive layer 60 is sandwiched between the second wiring layer 25 and the wiring layer 14 in the sensor portion 10. Then, the conductive layer 60 is heated so that the conductive layer 60 melts. Thus, the conductive layer 60 and the part of the second wiring layer 25 are alloyed to be the eutectic alloy portion 30. Further, the wiring layer 14 and the conductive layer 60 are alloyed to be the eutectic alloy portion 30.

Thus, since the conductive layer 60 melts, and the conductive layer 60 is used for forming the eutectic alloy, the melted conductive layer 60 fills the concavities and convexities on the surface of the second wiring layer 25 and, the concavities and convexities on the surface of the wiring layer 14. Further, the space between the surface of the second wiring layer 25 and the conductive layer 60, and the space between the surface of the wiring layer 14 and the conductive layer 60 are disappeared, i.e., filled with the eutectic alloy. Thus, the second wiring layer 25 is bonded to the wiring layer 14 without clearance therebetween via the eutectic alloy portion 30 that is prepared from the eutectic alloy between the second wiring layer 25, the wiring layer 14 and the conductive layer 60. Reduction of the bonding area between the second wiring layer 25 and the wiring layer 14 is improved. Accordingly, the second wiring layer 25 and the wiring layer 14 are bonded together surely. The bonding strength between the second wiring layer 25 and the wiring layer 14 is sufficient. Since the wiring portion 25a and the wiring layer 14 are bonded together surely, electric conduction between the wiring portion 25a and the wiring layer 14 is surely secured. Furthermore, since the sealed portion 25b and the wiring layer 14 are bonded together surely, air-tightness of the sealed portion 40 is improved and secured.

Here, the anchor 15, the vibrator 16 and the fixed electrode 17 provide a comb-teeth structure for the sensor structure. The anchor 15, the fixed electrode 17, the connection element 18 and the periphery element 19 provide a bonding portion on the sensor side. The wiring portion 25a and the sealed portion 25b provide a bonding portion on the cap side. The second wiring layer 25 provides a metal layer. Further, a part of the sensor structure provides the sensor structure other than the vibrator 16, and therefore, the part of the sensor structure is the anchor 15 and the fixed electrode 17.

Second Embodiment

In the first embodiment, the wiring layer 14 in the sensor portion 10 covers the concavities on the wiring portion 25a, and then, the eutectic alloy between the wiring layer 14 and the wiring portion 25a is formed. In the second embodiment, the wiring layer 14 is bonded to the flat surface of the wiring portion 25a.

Figure 8:
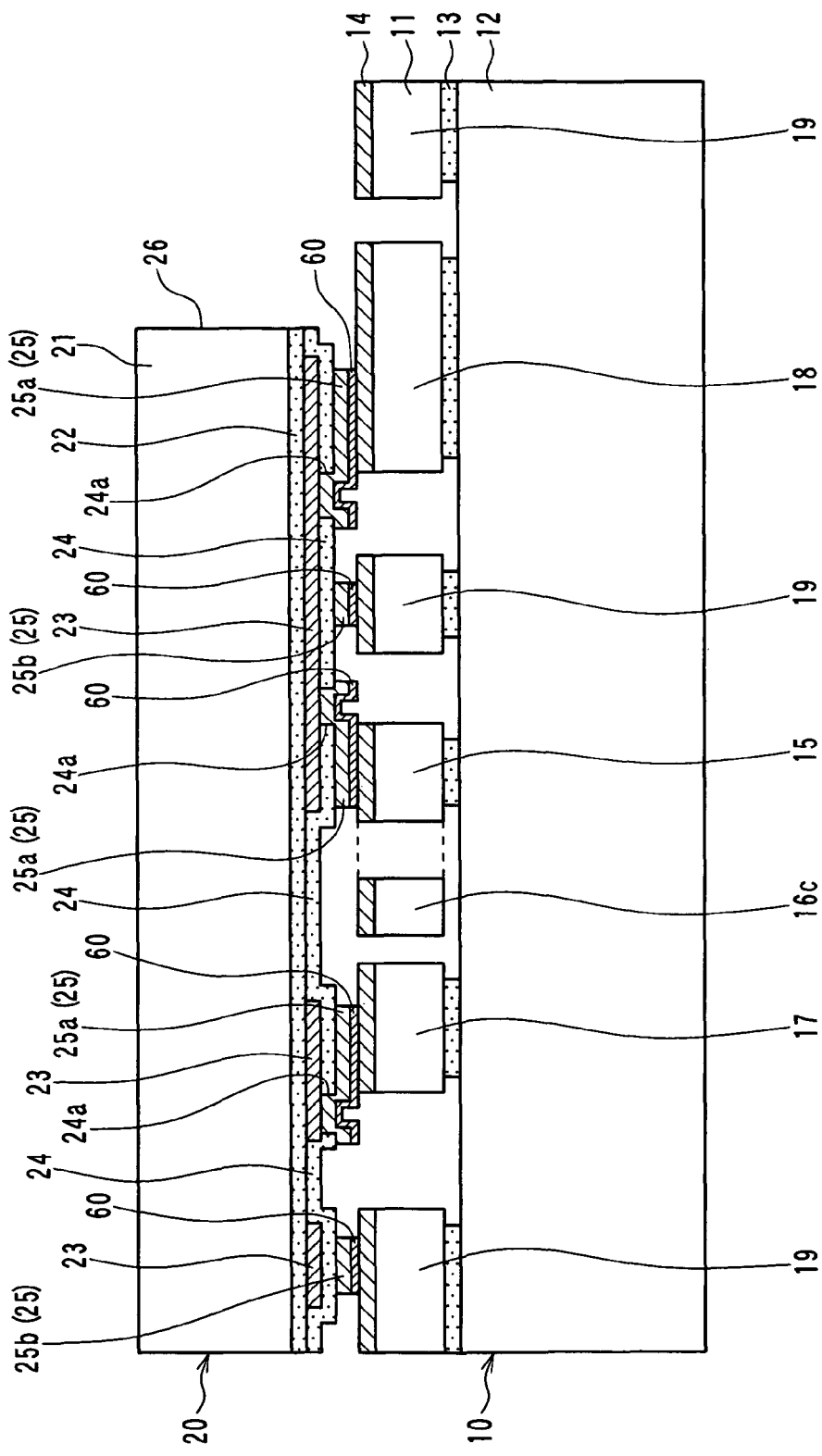
FIG. 8 is a diagram showing a step for bonding a sensor portion and a cap portion in a semiconductor device according to a second embodiment.

FIG. 8 shows a bonding state of the sensor portion 10 and the cap portion 20. FIG. 8 corresponds to FIG. 6.

In FIG. 8, a part of the wiring portion 25a of the second wiring layer 25, which is embedded in the opening 24a of the second insulation film 24, is concaved because of a step coverage effect, so that the surface of the wiring portion 25a has a concavity. This concavity has a bottom, and is formed in such a manner that the surface of the wiring portion 25a of the second wiring layer 25 is concaved toward the first wiring layer 23.

Since the conductive layer 60 is formed on the surface of the wiring portion 25a, the conductive layer 60 has a surface shape, which corresponds to the surface shape of the wiring portion 25a. Accordingly, the conductive layer 60 also has a concavity, which corresponds to the concavity of the wiring portion 25a.

The openings 24a are formed in a region of the second insulation film 24, which is different from a region facing the anchor 15, the fixed electrode 17 and the connection element 18 in the sensor portion 10. Thus, the opening 24a does not face, i.e., does not overlap the anchor 15, the fixed electrode 17 and the connection element 18.

Alternatively, the opening 24a may partially overlap the anchor 15, the fixed electrode 17 and the connection element 18 as long as the opening 24a is space apart from the concavity of the wiring portion 25a.

The opening 24a is formed ion the second insulation film 24, and the anchor 15, the fixed electrode 17 and the connection element 18 contact the conductive layer 60, respectively. Specifically, the anchor 15, the fixed electrode 17 and the connection element 18 contact a flat portion of the conductive layer 60.

After that, a heating process is executed, so that the anchor 15, the fixed electrode 17 and the connection element 18 are bonded with the flat portion of the wiring portion 25a via the eutectic alloy portion 30.

Thus, even if the wiring portion 25a includes a concavity caused by the step coverage effect, the anchor 15, the fixed electrode 17 and the connection element 18 are bonded to the flat portion of the wiring portion 25a. Accordingly, the bonding area between the wiring portion 25a and the anchor 15 and the like is sufficiently large. Thus, the wiring portion 25a and the anchor 15 or the like are stably and sufficiently bonded together.

Third Embodiment

In the first and second embodiments, the concavity of wiring portion 25a is formed on the opening 24a in the second insulation film 24 because of the step coverage. In the third embodiment, the concavity is not formed on the wiring portion 25a.

In the step of forming the cap portion 20, the opening 24a is formed ion the second insulation film 24 in the steps in FIGS. 5A to 5C.

Then, in a step of FIG. 9A, the aluminum layer as the second wiring layer 25 is formed on the second insulation film 24 and the first wiring layer 23 exposed in the opening 24a of the second insulation film 24. Then, the second wiring layer 25 is flattened by a CMP polishing method. Thus, the concavity of the wiring portion 25a is removed. The surface of the second wiring layer 25 is flat without concavity. After that, the conductive layer 60 is formed on the flat surface of the second wiring layer 25.

As shown in FIG. 9B, the second wiring layer 25 and the conductive layer 60 are patterned so that the wiring portion 25a and the sealing portion 25b are formed. Thus, the surface of the conductive layer 60 is flat and has the same height.

Accordingly, since the concavity of the wiring portion 25a caused by the step coverage effect is removed, a whole surface of the wiring portion 25a is flat without concavity. Accordingly, the second wiring layer 25 and the wiring layer 14 are stably bonded together.

Fourth Embodiment

In the first embodiment, the second wiring layer 25 is made of aluminum. In this embodiment, the second wiring layer 25 is replaced with eth conductive layer 60.

FIG. 10 shows a semiconductor device according to a fourth embodiment. The conductive layer 60 is formed on the second insulation film 24 and the first wiring layer 23 exposed in the opening 24a of the second insulation film 24. Further, the conductive layer 60 is patterned so as to form the wiring portion 25a and the sealing portion 25b. The conductive layer 60 is made of germanium.

A part of the wiring layer 14 and a part of the conductive layer 60 are alloyed to be eutectic alloy, and the eutectic alloy portion 30 is formed. Specifically, the wiring portion 25a and the sealing portion 25b are bonded to the sensor portion 10 via the eutectic alloy portion 30. In this case, the device does not include the second wiring layer 25, compared with the device shown in FIG. 6. Accordingly, in the device, one aluminum layer is removed from the device in FIG. 6.

The manufacturing method of the semiconductor device in FIG. 10 will be explained with reference to FIGS. 11A to 11C. In the steps of FIGS. 5A to 5C, the opening 24a is formed ion the second insulation film 24. Then, as shown in FIG. 11A, the conductive layer 60 made of germanium is formed on the second insulation film 24 and the first wiring layer 23 exposed in the opening 24a of the second insulation film 24.

As shown in FIG. 11B, the conductive layer 60 is patterned so as to form the wiring portion 25a and the sealing portion 25b.

Then, in a step of FIG. 11C, a wafer prepared in the step of FIG. 11B and the wafer prepared in the step of FIGS. 4A to 4C are stacked. Similar to the step of FIG. 6, the wafers are heated under a condition that the wiring layer 144 contacts the conductive layer 60. Thus, a part of the wiring layer 14 and a part of the conductive layer 60 are alloyed to be eutectic alloy. The wiring portion 25a is bonded to the anchor 15, the fixed electrode 17 and the connection element 18 via the eutectic alloy portion 30. Specifically, the sealing portion 25b is bonded to the wiring layer 14 via the eutectic alloy portion 30. Thus, the semiconductor device in FIG. 10 is completed.

Thus, the second wiring layer 25 is provided by the conductive layer 60 without forming an aluminum layer as the second wiring layer 25. In such as structure, since the wiring layer 14 providing the one side 10a of the sensor portion 10 is made of aluminum, the wiring layer 14 is bonded to the wire 50 easily.

Fifth Embodiment

In the fourth embodiment, the conductive layer 60 includes a concavity caused by the step coverage effect, which is arranged in the opening 24a in the second insulation film 24. In the fifth embodiment, the conductive layer 60 does not include the concavity.

Figure 12A:
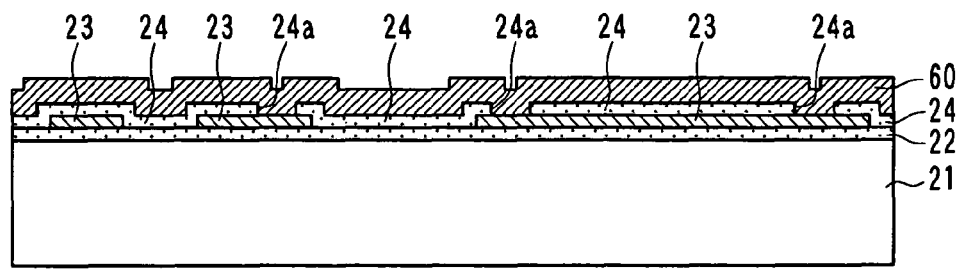
FIG. 12A to 12C are diagrams showing a manufacturing method of a semiconductor device according to a fifth embodiment.

The steps shown in FIGS. 5A to 5C are performed, and the opening 24a is formed in the second insulation film 24. Then, in a step of FIG. 12A, the conductive layer 60 made of germanium is formed on the second insulation film 24 and the first wiring layer 23 exposed in the opening 24a of the second insulation film 24.

Figure 12B:
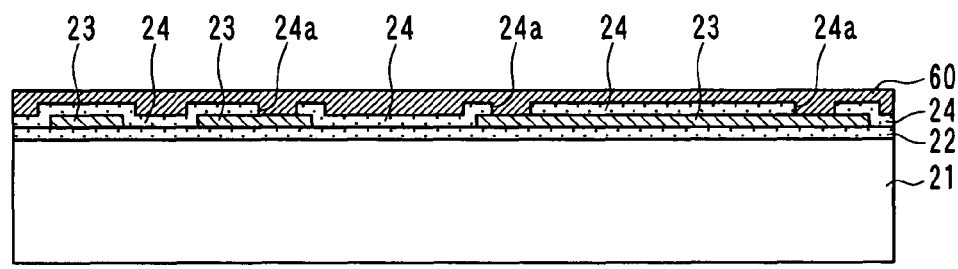

In a step of FIG. 12B, the conductive layer 60 is flattened by the CMP polishing method. Thus, the concavity on the conductive layer 60 caused by the step coverage effect is removed, so that the surface of the conductive layer 60 is flattened without the concavity.

Figure 12C:
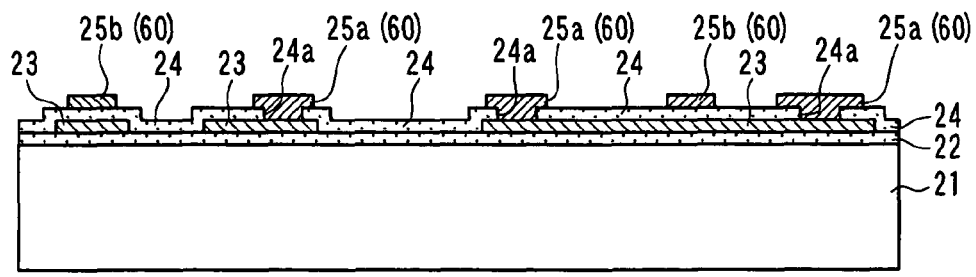

As shown in FIG. 12C, the conductive layer 60 is patterned so as to form the wiring portion 25a and the sealing portion 25b. Thus, the wiring portion 25a and the sealing portion 25b have the same height and flat surfaces.

Thus, the concavity of the conductive layer 60 caused by the opening 24a of the second insulation film 24 is removed. A whole surface of the conductive layer 60 is flattened without the concavity. Accordingly, the conductive layer 60 is bonded to the wiring portion 14 stably and sufficiently.

Sixth Embodiment

In the first embodiment, the conductive layer 60 is formed on the second wiring layer 25. In the sixth embodiment, the conductive layer 60 is formed o the wiring layer 14.

Figure 13:
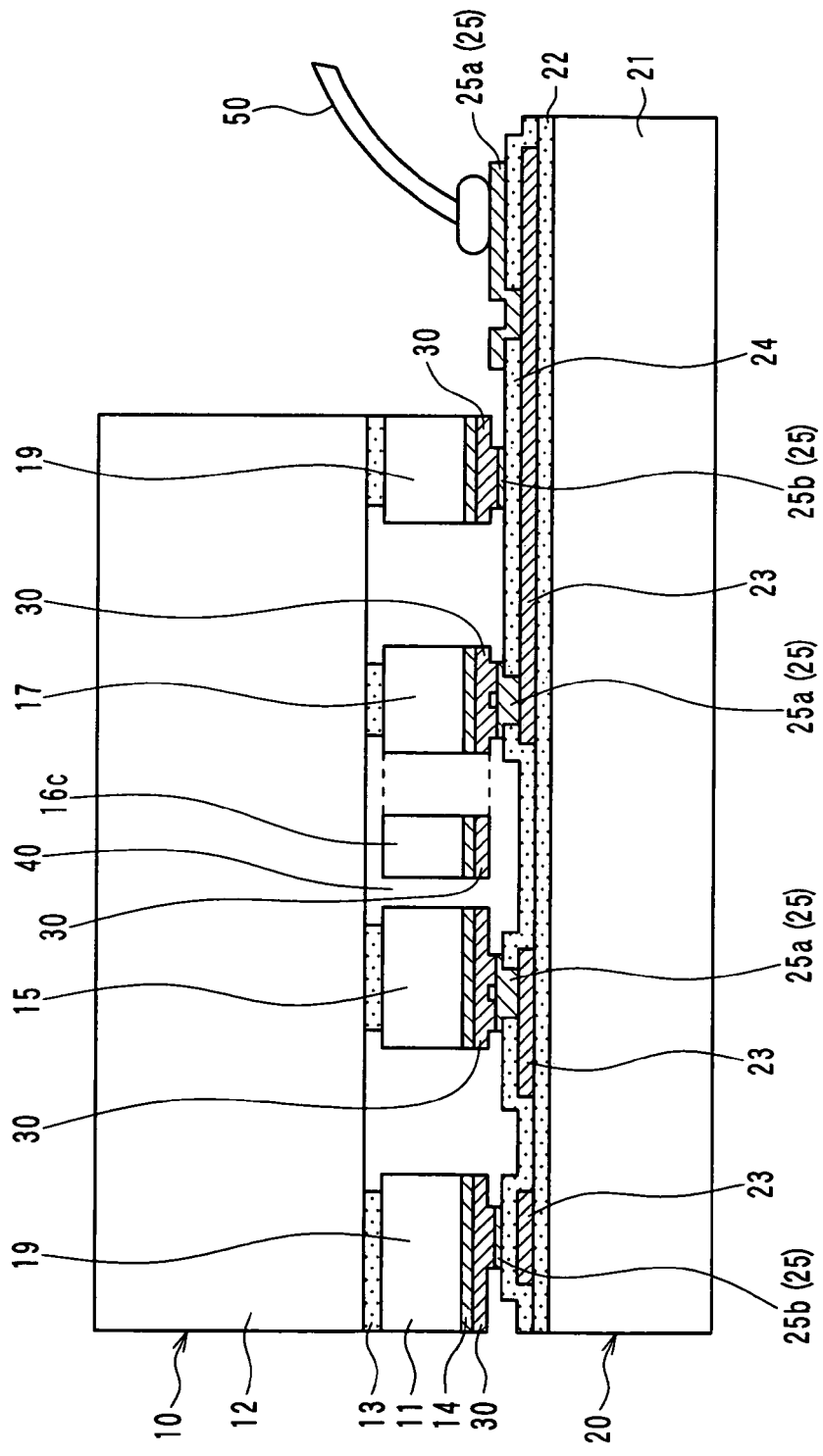
FIG. 13 is a diagram showing a cross sectional view of a semiconductor device according to a sixth embodiment.

FIG. 13 shows a semiconductor device according to the sixth embodiment. The device in FIG. 13 does not include the connection element 18 in the sensor portion 10 in FIG. 1. In the device in FIG. 13, the sensor portion 10 only includes a region, which is surrounded with the periphery element 19. The cap portion 20 in FIG. 13 is similar to the cap portion 20 in FIG. 1.

Accordingly, the sensor portion 10 in FIG. 13 has dimensions, which are smaller than the dimensions of the sensor portion in FIG. 1 because the device in FIG. 13 does not include the connection element 18. When the sensor structure of the sensor portion 10 is sealed with the sealing portion 25b of the cap portion 20. The wiring portion 25a is exposed from the sensor portion 10. The wiring portion 25a in FIG. 1 is connected to the connection element 18 of the sensor portion 10.

In this embodiment, the wiring portion 25a exposed from the sensor portion 10 and not sealed in the sensor portion 10 is used for a pad. As shown in FIG. 13, the wiring portion 25a exposed from the sensor portion 10 is connected to the wire 50, so that the device is electrically coupled with an external circuit.

Similar to the first embodiment, the second wiring layer 25 and the wiring layer 14 are bonded together via the eutectic alloy portion 30.

Next, a manufacturing method of the semiconductor device will be explained. For example, the steps in FIGS. 5A to 5C are executed. After that, in the step of FIG. 5D, only the second wiring layer 25 is formed, and in the step of FIG. 5E, the second wiring layer 25 is patterned. Thus, the cap portion 20 is prepared.

In a step of FIG. 14A, the step of FIG. 4A and the step of FIG. 4B are executed. After that, the conductive layer 60 is formed on the wiring layer 14. Then, the step of FIG. 4C is executed so that the anchor 15 and the like is formed. Thus, the conductive layer 60 is formed on the wiring layer 14.

Then, in a step of FIG. 14B, a wafer having multiple sensor portions 10 and a wafer having multiple cap portions 20 are bonded in a vacuum chamber. Specifically, the conductive layer 60 is sandwiched between the wiring layer 14 and the second wiring layer 25, and then, the conductive layer 60 is heated. Thus, the conductive layer 60 and a part of the wiring layer 14 are alloyed to be eutectic apply. Further, the conductive layer 60 and a part of the second wiring layer 25 are alloyed to be eutectic alloy. Thus, the second wiring layer 25 and the wiring layer 14 are bonded together via the eutectic alloy portion 30.

Then, the wafers bonded together are divided into multiple chips. Each chip provides the semiconductor device. When the wafers are divided with using a dicing saw, the first silicon layer 11 disposed on a region for bonding the wire 50 is preliminary removed, so that the region for binding the wire 50 is opened to the outside of the device. In the step of FIG. 14B, only the second silicon layer 12 is diced and removed. Then, the wafers bonded together is completely diced from a top to a bottom of the wafers so that the wafers are divided into multiple chips. Thus, as shown in FIG. 13, the wiring portion 25a exposed from the sensor portion 10 is connected to the wire 50 so that the device is coupled with an external system.

Thus, the conductive layer 60 is formed in the cap 20, and the second wiring layer 25 contacts the conductive layer 60. After that, the device is heated so that an eutectic bonding process is performed.

Here, the second wiring layer 12 provides a metallic layer.

Seventh Embodiment

In a semiconductor device according to a seventh embodiment, the cap portion 20 includes an IC circuit 27.

Figure 15:
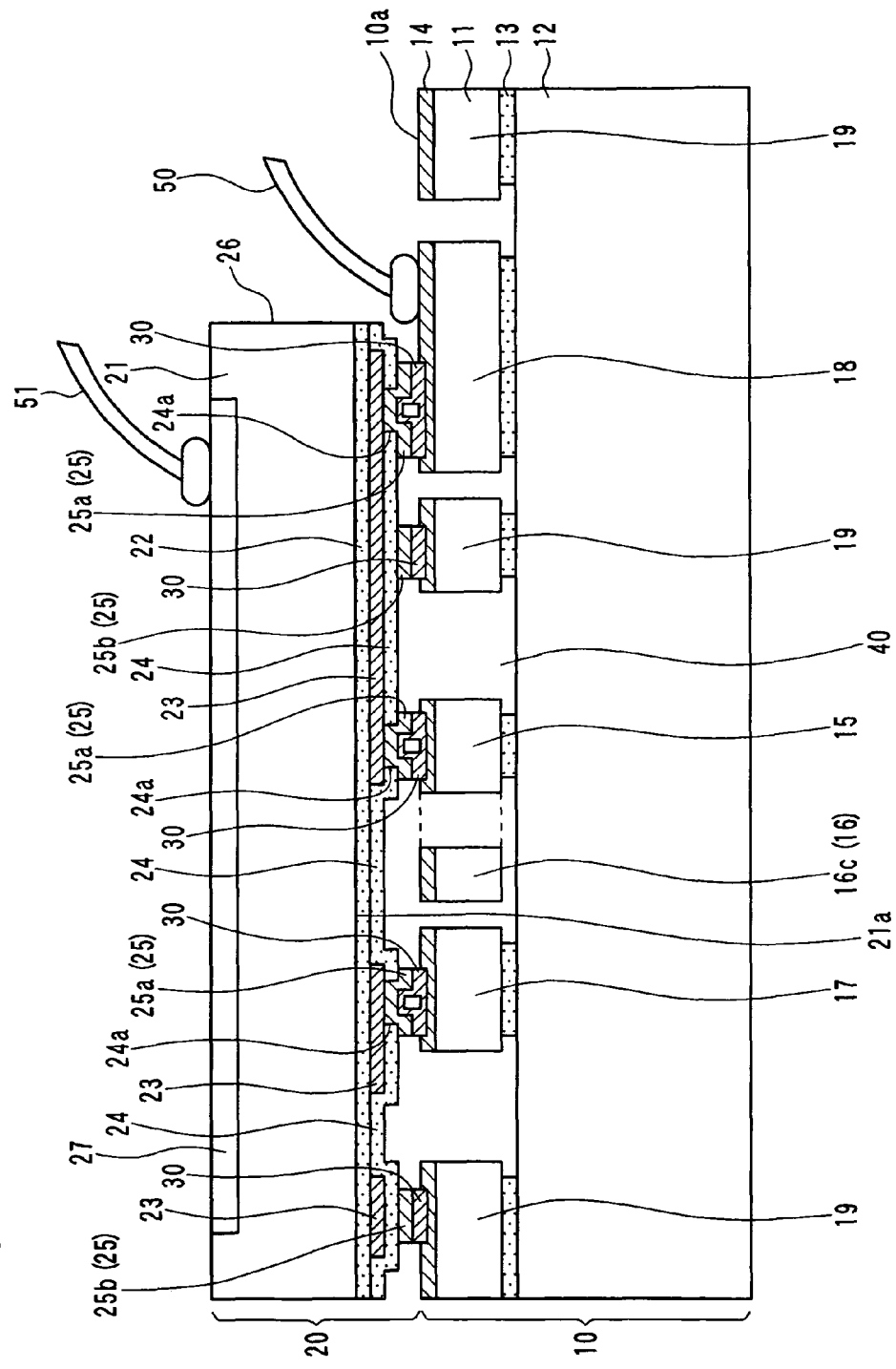
FIG. 15 is a diagram showing a cross sectional view of a semiconductor device according to a seventh embodiment.

FIG. 15 shows the device. The IC circuit 27 is formed on the silicon substrate 21 in the cap portion 20, and opposite to the one side 21a of the silicon substrate 21. The first insulation film 22 is formed on the one side 21a of the silicon substrate 21.

The IC circuit 27 includes, for example, an amplifier for amplifying a signal corresponding to the physical quantity detected by the sensor portion 10 and/or a processor for processing the signal. The IC circuit 27 is formed in the cap portion 20 when the cap portion 20 is manufactured. Specifically, the IC circuit 27 is formed before a stacked wiring such as the first wiring layer 23 is formed in the cap portion 20.

The IC circuit 27 is connected to a wire 51. The wire 51 is connected to, for example, the connection element 18 in the sensor portion 10. Alternatively, the wire 51 may be connected to an external circuit. Thus, the IC circuit 27 is formed in the cap portion 20.

Eighth Embodiment

Figure 16:
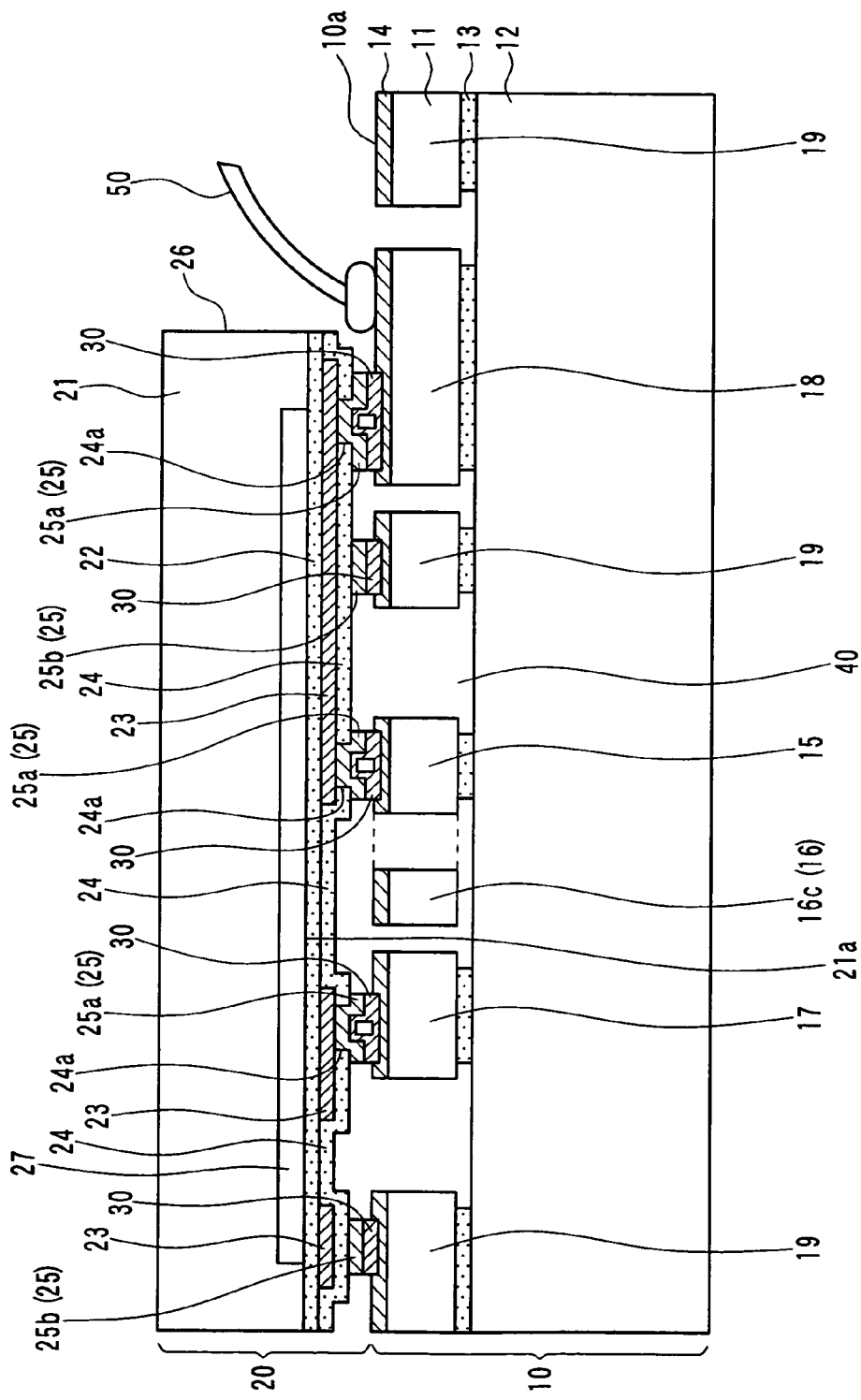
FIG. 16 is a diagram showing a cross sectional view of a semiconductor device according to an eighth embodiment.

FIG. 16 shows a semiconductor device according to an eighth embodiment. The IC circuit 27 is formed on the one side 21a of the silicon substrate 21 in the cap portion 20. The one side of the silicon substrate 21 faces the sensor portion 10.

The first insulation film 22 is formed to cover the one side 21a of the silicon substrate 21 including the IC circuit 27. The first wiring layer 23, the second insulation film 24 and the second wiring layer 25 are formed in this order. In this case, an opening (not shown) is formed in the first insulation film 22. An IC chip manufacturing method may be used for manufacturing the device. Further, a wiring layer of an IC chip is made of aluminum or copper, and a multi-layered wiring layer may be used for the device. The IC circuit 27 is electrically connected to the first wiring layer 23 via the opening.

In the above structure of the cap portion 20, the first insulation film 22 can be formed just after the IOC circuit 27 is formed on the one side 21a of the substrate 21. Further, it may not be necessary to connect the IC circuit 27 with the wire 51. Thus, the manufacturing process of the cap portion 20 is simplified.

Ninth Embodiment

Figure 17:
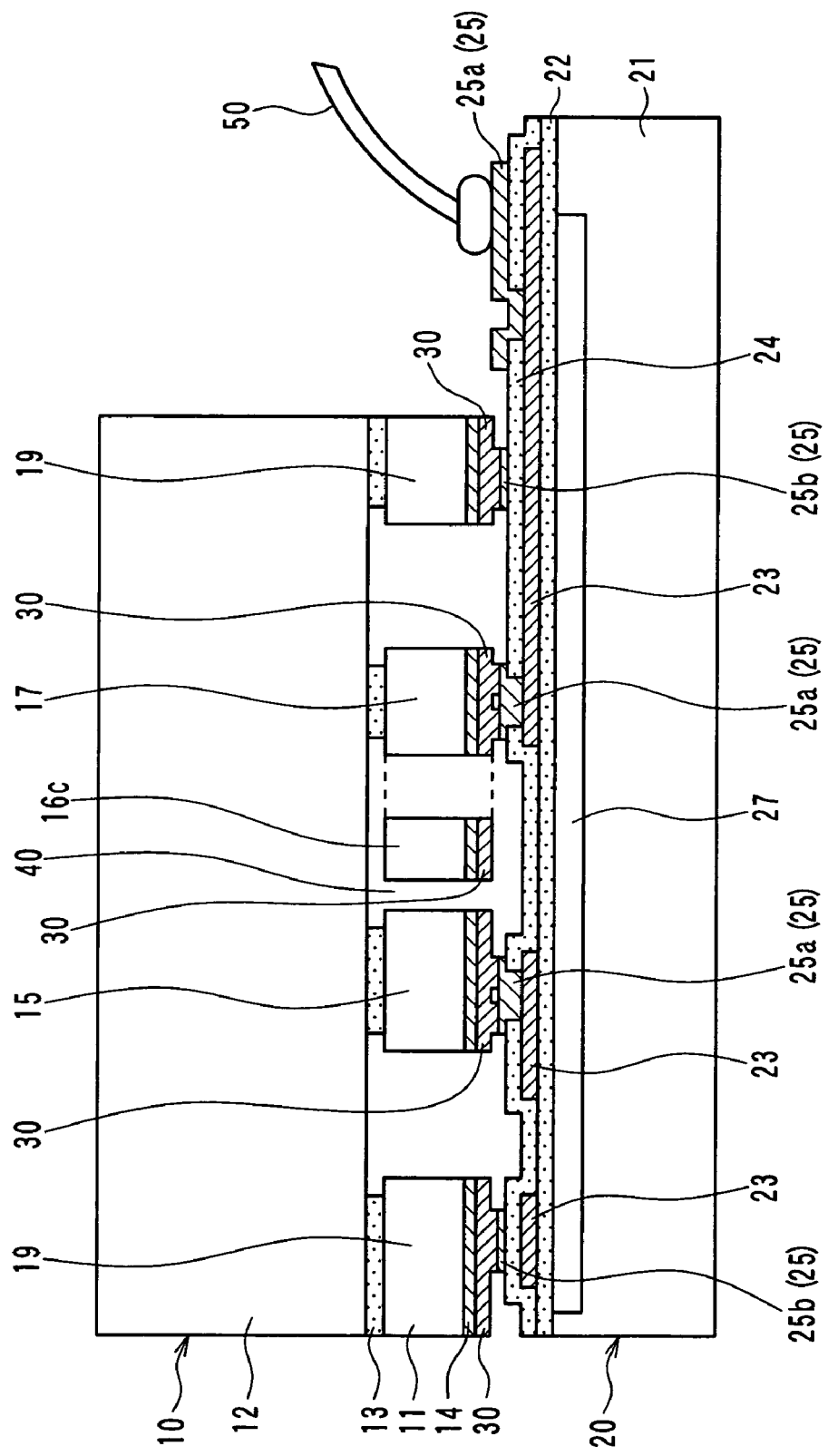
FIG. 17 is a diagram showing a cross sectional view of a semiconductor device according to a ninth embodiment.

FIG. 17 shows a semiconductor device according to a ninth embodiment. The sensor 10 without the connection element 18 is bonded to the cap portion 20. The IC circuit 27 is formed on the one side 21a of the substrate 21 in the cap portion 20. The one side 21a of the substrate 21 faces the sensor portion 10. The IC circuit 27 is electrically connected to the first wiring layer 23 via an opening (not shown) in the first insulation film 22. Thus, the device in FIG. 17 includes the IC circuit 27, which is not provided in the device shown in FIG. 13.

Tenth Embodiment

In the above embodiments, the sensor portion 10 and the cap portion 20 are bonded together via aluminum-germanium eutectic alloy. In a tenth embodiment, the sensor portion 10 and the cap portion 20 are bonded together via gold-silicon eutectic alloy.

Figure 18:
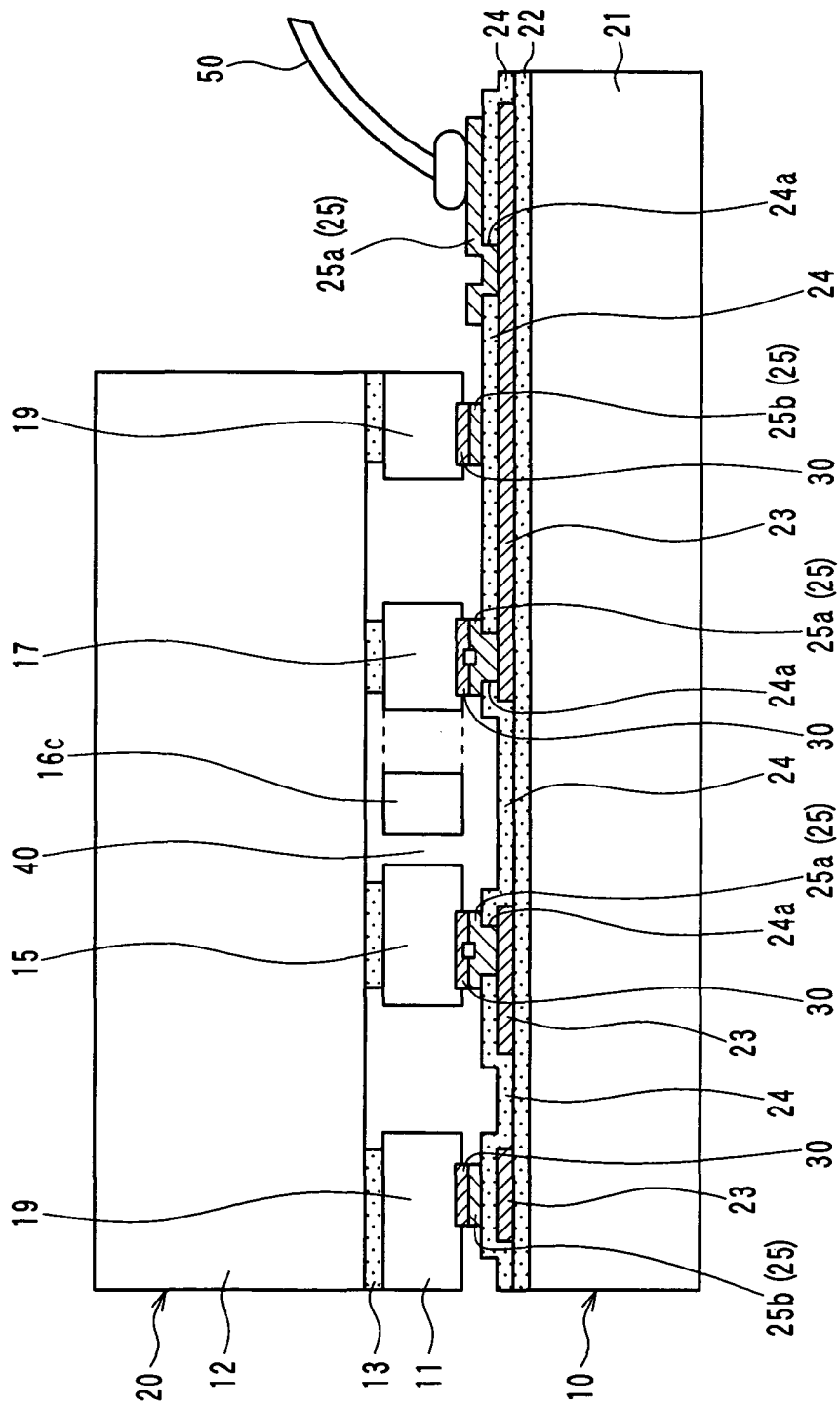
FIG. 18 is a diagram showing a cross sectional view of a semiconductor device according to a tenth embodiment.

FIG. 18 shows a semiconductor device according to the tenth embodiment. The sensor portion 10 does not include the wiring layer 14. Accordingly, the first silicon layer 11 provides the one side 10a of the sensor portion 10. Thus, silicon is exposed on the sensor portion 10. Further, the sensor portion 10 does not include the connection element 18.

The cap portion 20 in the device in FIG. 18 is similar to the cap portion in the device in FIG. 6. In this embodiment, the first wiring layer 23 and the second wiring layer 25 are made of gold.

The second wiring layer 25 in the cap portion 20 and the first silicon layer 11 of the sensor portion 10 are bonded together with the eutectic alloy. Specifically, the second wiring layer 25 contacts the first silicon layer 11, and the cap portion 20 and the sensor portion 10 are heated, so that a part of the second wiring layer 25 and a part of the first silicon layer 11 are alloyed to be the eutectic alloy portion 30. Thus, the eutectic alloy portion 30 is made of gold-silicon eutectic alloy.

In this embodiment, the wire made of gold is connected to the wiring portion 25a as the pad exposed from the sensor portion 10.

Next, a manufacturing method of the device in FIG. 18 will be explained with reference to FIGS. 19A and 19B. In a step of FIG. 19, the SOI substrate as a wafer is prepared in the step of FIG. 4A and the anchor 15 and the like are formed in the first silicon layer 11 in the step of FIG. 4C.

Further, the steps of FIGS. 5A to 5C area performed, and in the step of FIG. 5D, only a gold layer as the second wiring layer 25 is formed. Then, in the step of FIG. 5E, the second wiring layer 25 is patterned. Thus, the wafer having multiple cap portions is prepared.

Figure 19A:
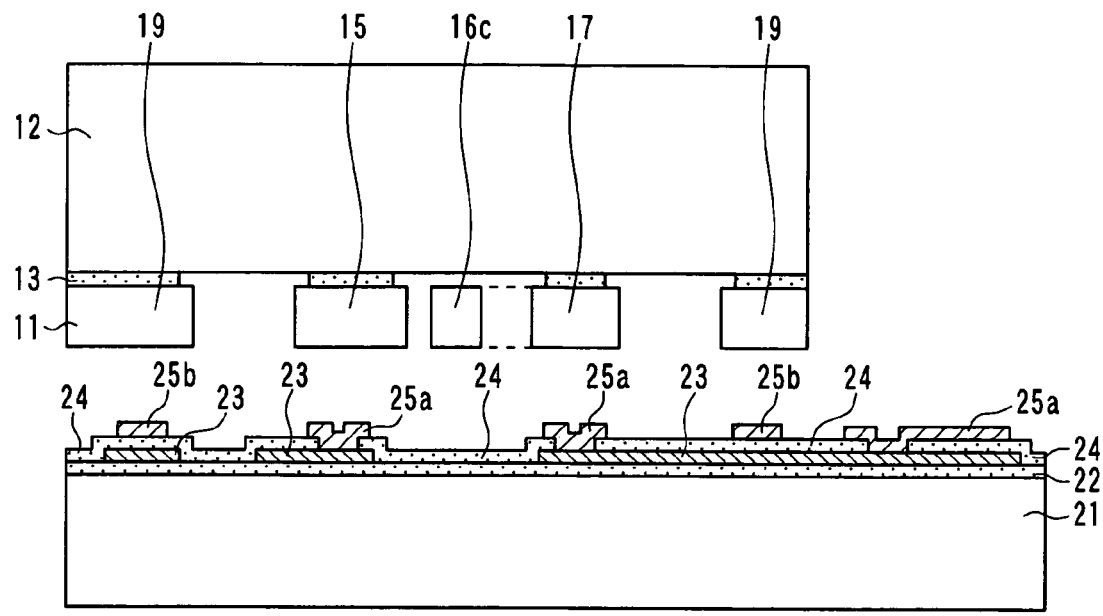
FIGS. 19A to 19B are diagrams showing a manufacturing method of the semiconductor device in FIG. 18.
Figure 19B:
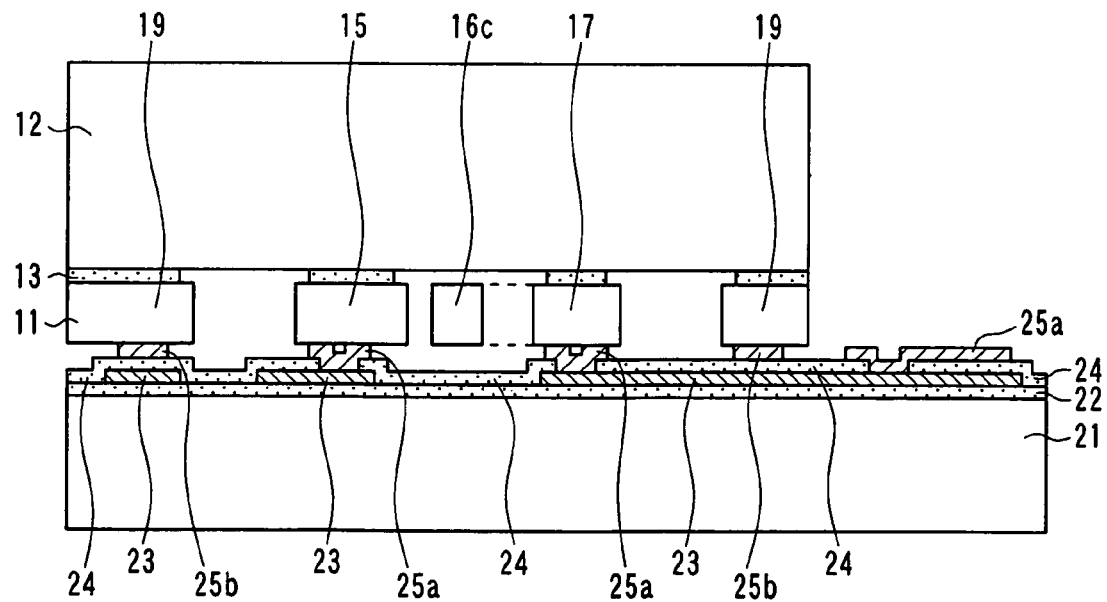

Next, in a step of FIG. 19B, the wafers prepared in the step of FIG. 19A are bonded together in a vacuum chamber so as to form the eutectic alloy. In this embodiment, the second wiring layer 25 is made of gold, and the first silicon layer 11 is made of silicon. Thus, the gold-silicon eutectic alloy is formed. Accordingly, the first silicon layer 11 and the second wiring layer 25 are heated under a condition that the first silicon layer 11 contacts the second wiring layer 25, so that a part of the first silicon layer 11 and a part of the second wiring layer 25 are alloyed to be the eutectic alloy.

Here, the eutectic temperature, i.e., the eutectic point between gold and silicon is 363° C. when the weight percent of silicon is 3.2 wt %. Specifically, when the concentration of silicon with respect to gold is 3.2 wt %, the eutectic temperature is 363° C. This temperature is lower than the eutectic temperature between aluminum and germanium, which is 420° C. Thus, the eutectic bonding between gold and silicon is performed at temperature, which is lower than that of the eutectic bonding between aluminum and germanium.

Thus, the part of the first silicon layer 11 and the part of the second wiring layer 25 are alloyed so that the eutectic alloy portion 30 is formed between the second wiring layer 25 and the first silicon layer 11. Then, the wafers are divided into multiple chips. Thus, the semiconductor device in FIG. 18 is completed. The wiring portion 25a exposed from the sensor portion 10 is connected to the wire 50 so that the device is electrically coupled with an external system.

When the gold film is formed on a $SiO_2$ film as the first insulation film 22 and the second insulation film 24, adhesive force between the gold film and the $SiO_2$ film may be small. To improve the adhesive force between the gold film and the $SiO_2$ film, a titanium film or a TiN film having a thickness in a range between 10 nanometers and 50 nanometers may be stacked between the gold film and the $SiO_2$ film. Thus, the adhesive force between the first wiring layer 23 and the first insulation film 22, and the adhesive force between the second wiring layer 25 and the second insulation film 24 are improved.

Thus, the gold-silicon eutectic alloy is formed, so that the sensor portion 10 and the cap portion 20 are integrated.

Here, the first silicon layer 11 provides a conductive layer, and the second wiring layer 25 provides a metallic layer.

Eleventh Embodiment

Figure 20:
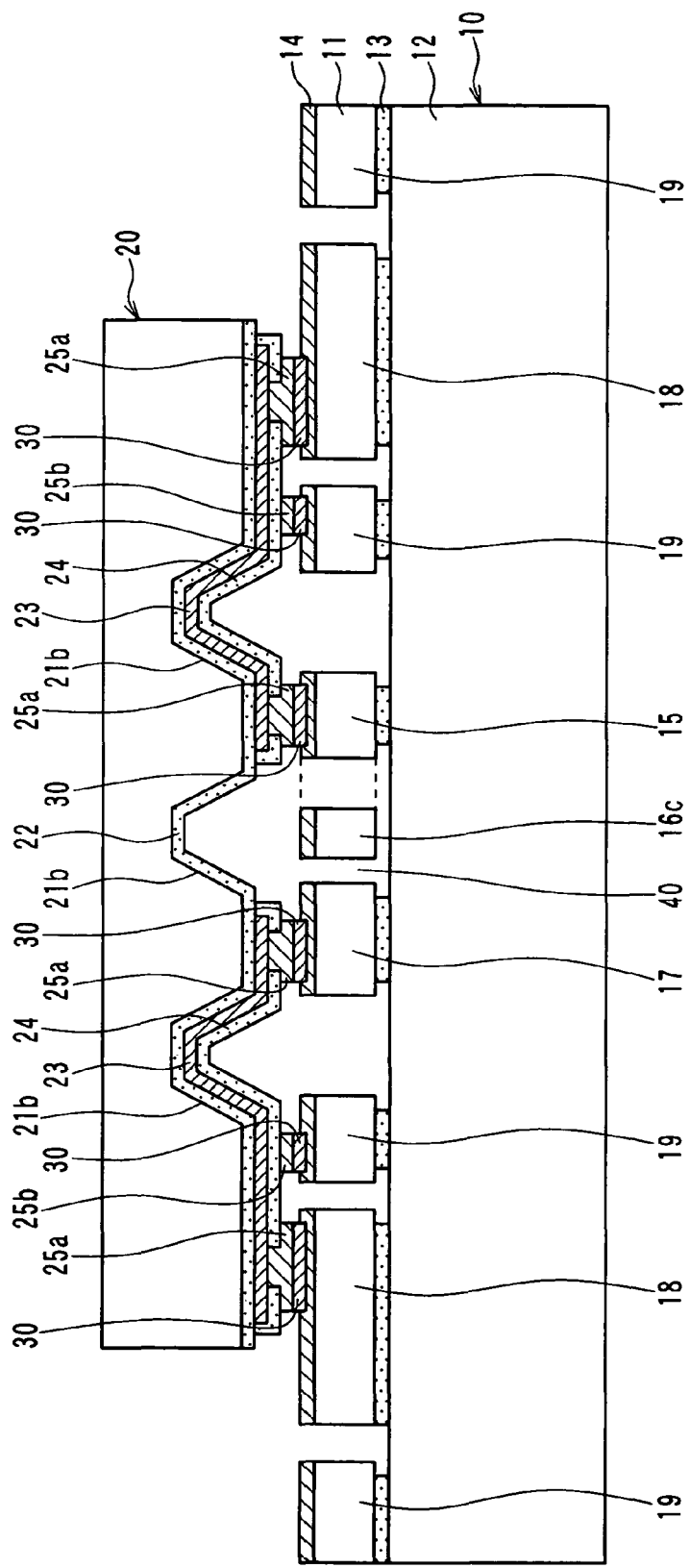
FIG. 20 is a diagram showing a cross sectional view of a semiconductor device according to an eleventh embodiment.

FIG. 20 shows a semiconductor device according to an eleventh embodiment. Multiple connection elements 18 are formed in the sensor portion 10.

In this embodiment, the device includes the connection element 18 for one direction shown in FIG. 2, and further, other connection elements 18 for two directions. Thus, multiple wires 50 are connected to the sensor portion 10 from multiple directions. In this case, the first wiring layer 23 is formed in the cap portion 20 in such a manner that the first wiring layer 23 crosses the periphery element 19 in the sensor portion 10 toward a direction of the connection element 18 in the sensor portion 10.

Further, as shown in FIG. 20, a concavity 21b is formed on the one side 21a of the silicon substrate 21 in the cap portion 20.

The concavity 21b is disposed in an area, which is surrounded with the sealing portion 25b. Specifically, the concavities 21b are formed in a portion of the silicon substrate 21 other than a connection portion between the wiring portion 25a and the sensor portion 10, the portion which faces the second silicon layer 12 of the sensor portion 10. Further, the concavity 21b is also formed o the silicon substrate 21, which faces the vibrator 16.

The concavity 21b functions to reduce influence of electric and/or mechanical contact between the sensor structure in the sensor portion 10 and the cap portion 20. Accordingly, the device in FIG. 20 includes three concavities 21b in the silicon substrate 21. Alternatively, the device may include at least one concavity, which faces the vibrator 16 for detecting physical quantity. Thus, the concavity 21b is formed in the silicon substrate 21 of the cap portion 20 so that the influence on the sensor structure by the silicon substrate 21 is reduced.

The device in FIG. 20 may include the IC circuit 50 in the silicon substrate 21 shown in FIG. 15. Alternatively, the connection element 18 in the sensor portion 10 in the device in FIG. 20 may be removed so that a structure shown in FIG. 13 is prepared.

Twelfth Embodiment

In the above embodiments, the first wiring layer 12, the second insulation film 24, and the second wiring layer 25 provide a wiring pattern, and the anchor 15 and the connection element 18 and the like are coupled with each other via the wiring pattern. In the present embodiment, a through hole electrode provides to retrieve an electric potential to the other side of the cap portion 20, which is opposite to the one side 21a of the cap portion 20.

Figure 21:
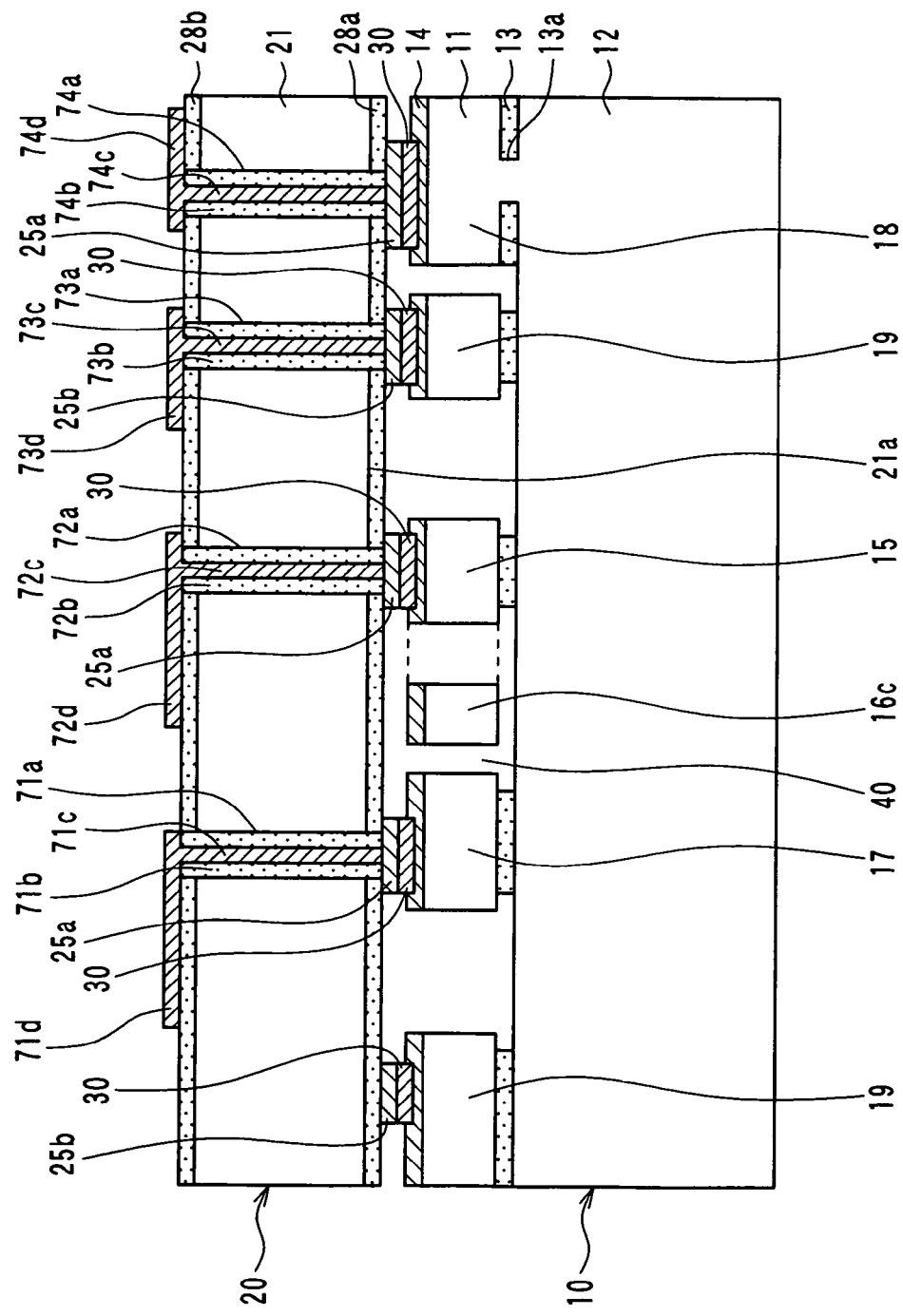
FIG. 21 is a diagram showing a cross sectional view of a semiconductor device according to a twelfth embodiment.

FIG. 21 shows a semiconductor device according to a twelfth embodiment. A contact hole 13a is formed in the insulation layer 13, which is disposed between the second silicon layer 12 and the first silicon layer 11 that provides the connection element 18 in the sensor portion 10. The first silicon layer 11 is formed in the contact hole 13a. The connection element 18 is electrically coupled with the second silicon layer 12. The wiring layer 14 made of aluminum is formed on the first silicon layer 11.

As shown in FIG. 21, a third insulation film 28a made of, for example, $SiO_2$ is formed on the one side 21a of the silicon substrate 21, which faces the sensor portion 10. The wiring portion 25a and the sealing portion 25b are formed on the third insulation film 28a. The wiring portion 25a and the sealing portion 25b are made of aluminum. Further, a fourth insulation film 28b made of $SiO_2$ is formed on the other side of the silicon substrate 21, which is opposite to the one side 21a.

First to fourth through hole electrodes 71c-74c are formed in through holes 71a-74a via insulation films 71b-74b. The through holes 71a-74a penetrate the silicon substrate 21 and the third insulation film 28a. The insulation films 71b-74b are formed on a sidewall of the through holes 71a-74a, respectively. Each insulation film 71b-74b is made of, for example, $SiO_2$. One end of the first through hole electrode 71c is electrically connected to the fixed electrode 17 via the wiring portion 25a and the eutectic alloy portion 30. One end of the second through hole electrode 72c is electrically connected to the anchor 15 via the wiring portion 25a and the eutectic alloy portion 30. One end of the third through hole electrode 73c is electrically connected to the periphery element 19 via the sealing portion 25b and the eutectic alloy portion 30. One end of the fourth through hole electrode 74c is electrically connected to the second silicon layer 12 via the wiring portion 25a and the eutectic alloy portion 30.

The eutectic alloy portion 30 is made of aluminum-germanium eutectic alloy. Specifically, germanium atoms in the conductive layer 60 melts and reacts aluminum so as to form the eutectic alloy.

Pads 71d-74d are formed on the fourth insulation film 28b. Each pad 71d-74d is connected to the respective through hole electrode 71c-74c. Thus, the electric potentials of the fixed electrode 17, the anchor 15, the sealing portion 25b and the second silicon layer 12 are retrieved from the fourth insulation film 28b. Thus, in the present embodiment, the electric potential of the sealing portion 25b and the electric potential of the second silicon layer 12 are provided.

The sensor structure such as the anchor 15 is arranged in the sealed portion 40, which is formed between the sensor portion 10 and the cap portion 20.

In the above structure, only one layer made of an aluminum film is formed in the cap portion 20. Thus, the structure is simplified. Further, since an electric potential of each part of the sensor portion 10 is retrieved via the through hole electrode 71c-74c, dimensions of the device are minimized.

A manufacturing method of the semiconductor device will be explained with reference to FIG. 22. The sensor portion 10 is prepared in the steps of FIGS. 4A to 4C. Here, in the steps of FIGS. 4A to 4C, a contact hole 13a is formed in the insulation layer 13 between the connection element 18 and the second silicon layer 12. Then, the contact hole 13a is filled with the first silicon layer 11 so that the connection element 18 is to be electrically couple with the second silicon layer 12.

Figures 22A, 22B:
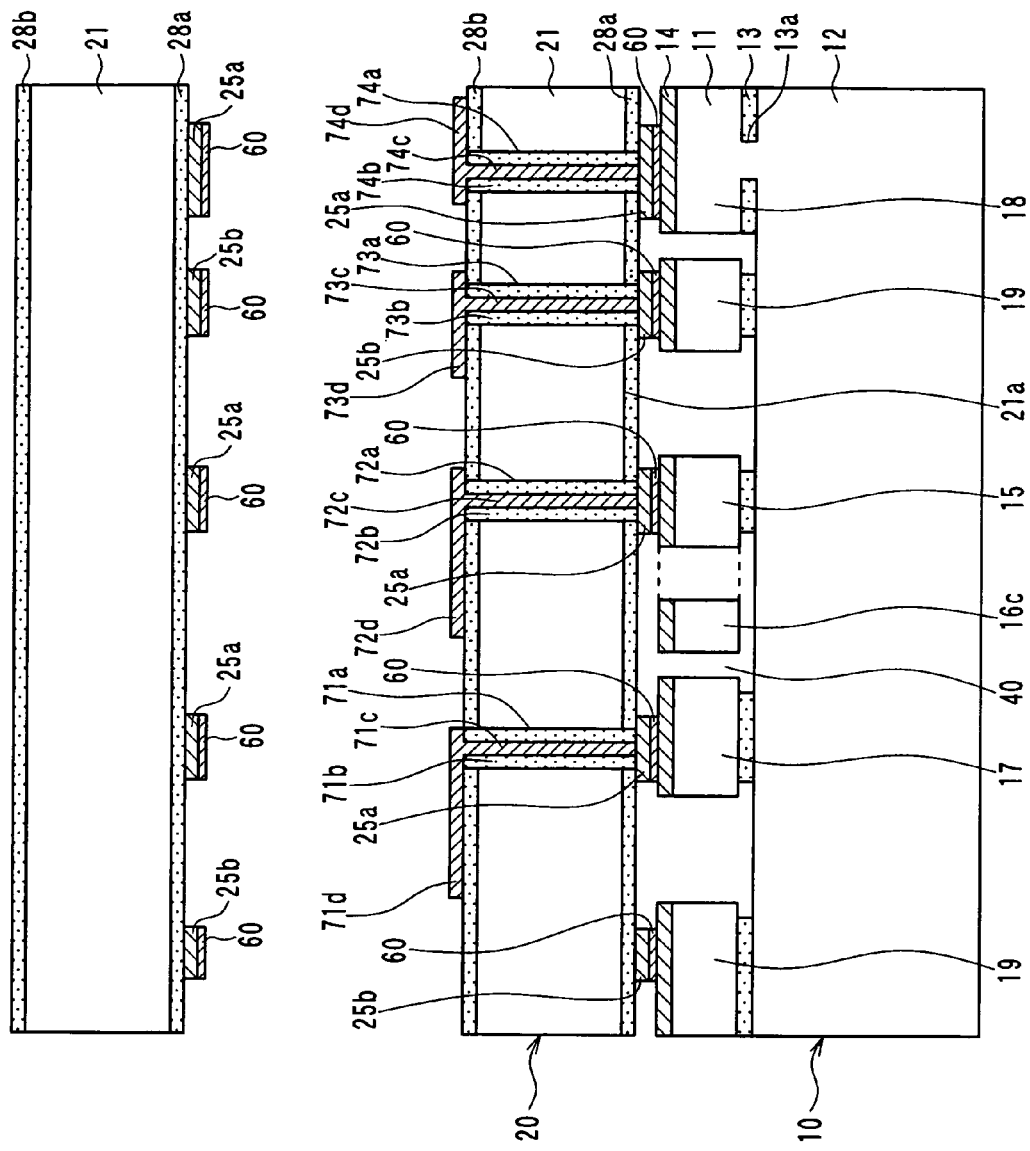
FIGS. 22A to 22B are diagrams showing a manufacturing method of the semiconductor device in FIG. 21.

Then, in a step of FIG. 22A, the cap portion is formed. Thus, the third insulation film 28a and the fourth insulation film 28b are formed on both sides of the silicon substrate 21 in the wafer. The aluminum layer is formed on the third insulation film 28a, and further, the germanium layer as the conductive layer 60 is formed on the aluminum layer. The aluminum layer and the conductive layer 60 are patterned so that the wiring portion 25a and the sealing portion 25b are formed at certain positions.

In a step of FIG. 22B, the wafer having the sensor portion and the wafer prepared in the step of FIG. 22A are stacked. Thus, the wiring portion 25a and the wiring layer 14 sandwich the conductive layer 60. Similarly, the conductive layer 60 is sandwiched between the sealing portion 25b and the wiring portion 14. Similar to the step of FIG. 6, the wafers are heated at about 420° C., so that the eutectic alloy portion 30 is formed. Thus, the wafers are bonded together.

Then, the through holes 71a-74a are formed so as to penetrate the fourth insulation film 28b, the silicon substrate 21 and the third insulation film 28a at positions corresponding to the wiring portion 25a and the sealing portion 25b in the cap portion 20. Then, the $SiO_2$ film as the insulation films 71b-74b are formed on the sidewalls of the through holes 71a-74a, respectively, by a CVD method or a sputtering method. Further, an aluminum film is embedded in the through holes 71a-74a by the CVD method. Thus, the through hole electrodes 71c-74c are formed. Thus, the aluminum layer is formed on the fourth insulation film 28b. The aluminum layer is patterned to be the pads 71d-74d.

Then, after bonding the wafers, the bonded wafers are divided, into multiple chips, so that the semiconductor device in FIG. 21 is completed. Thus, the through hole electrodes 71c-74c are formed in the cap portion 20.

Thirteenth Embodiment

Figure 23:
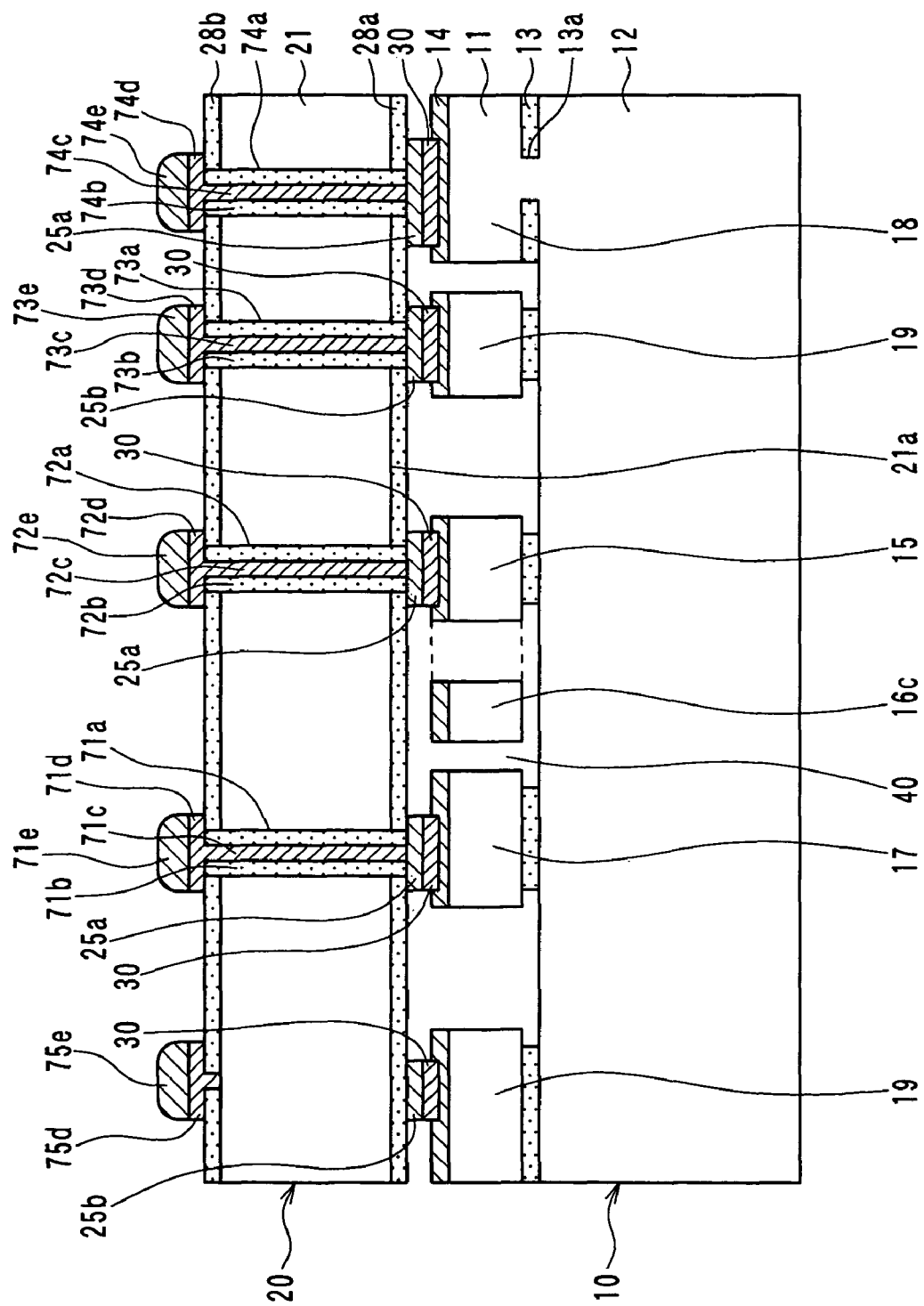
FIG. 23 is a diagram showing a cross sectional view of a semiconductor device according to a thirteenth embodiment.

FIG. 23 shows a semiconductor device according to a thirteenth embodiment. Bonding balls 71e-74e are formed on the pads 71d-74d, respectively.

In this embodiment, the pad 75d is formed on the fourth insulation film 28b. The pad 75d penetrates the fourth insulation film 28b, and is connected to the silicon substrate 21. The bonding ball 75e is also formed on the pad 75d.

Thus, since the bonding balls 71e-74e are formed in the cap portion 20, the semiconductor device can be attached to an external board with a flip-chip mounting method. Further, the electric potential of the silicon substrate 21 in the cap portion 20 can be retrieved via the bonding ball 75e.

Fourteenth Embodiment

Figure 24:
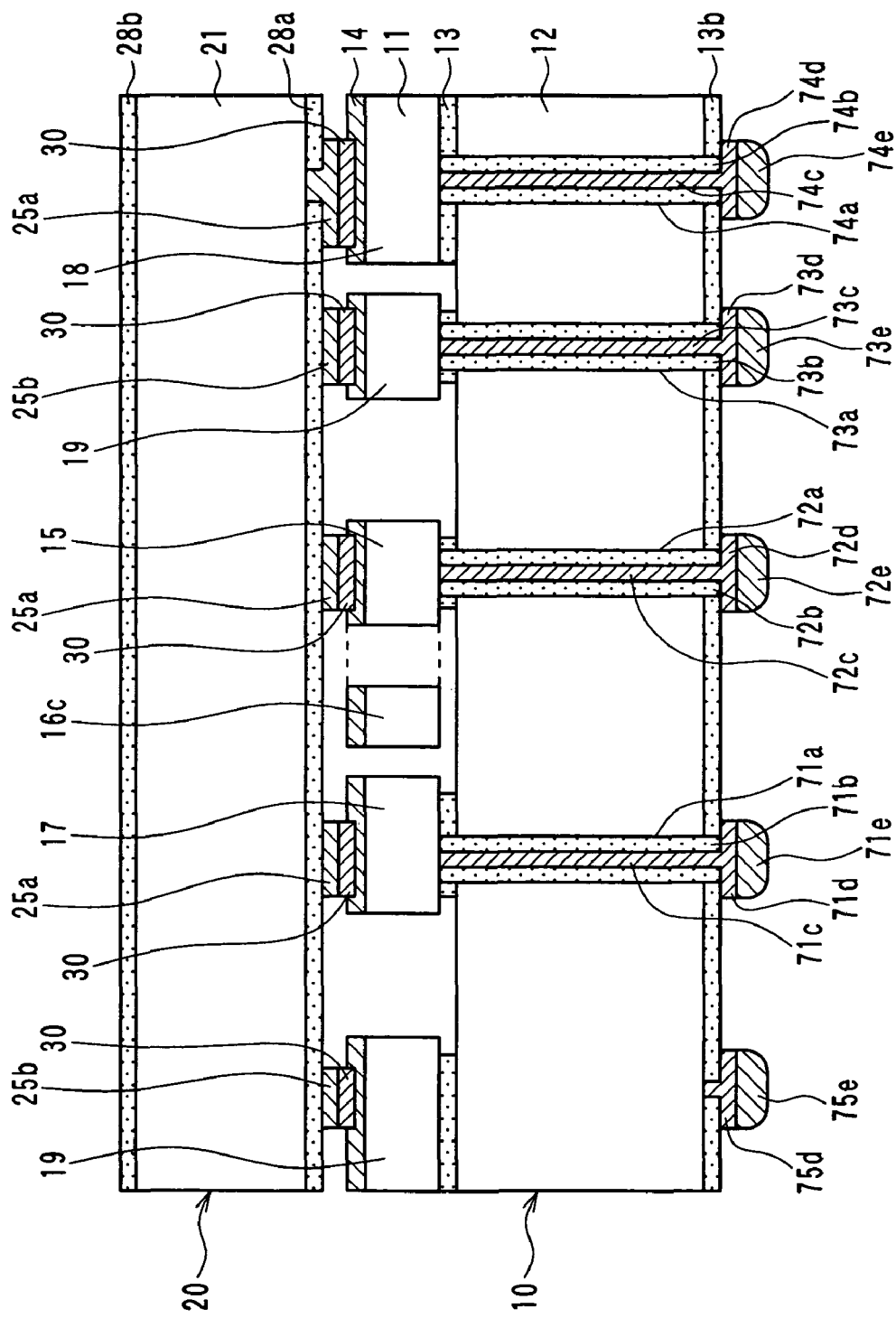
FIG. 24 is a diagram showing a cross sectional view of a semiconductor device according to a fourteenth embodiment.

FIG. 24 shows a semiconductor device according to a fourteenth embodiment. The insulation film 13b is formed on the other side of the second silicon layer 12 in the sensor portion 10, which is opposite to the insulation layer 13.

The through holes 71a-74a penetrate the insulation film 13b, the second silicon layer 12 and the insulation layer 13. The insulation films 71b-74b and the through hole electrodes 71c-74c are formed in the through holes 71a-74a, respectively. The bonding ball 71e-74e is formed on the respective pad 71d-74d connecting to the corresponding through hole electrode 71c-74c.

The pad 75d penetrating the insulation film 13b and connecting to the second silicon layer 12 is formed on the insulation film 13b. The bonding ball 75e' is formed on the pad 75d.

Thus, an electric potential of each part is retrieved via the corresponding through hole electrode 71c-74c in the sensor portion 10. Further, the electric potential of the second silicon layer 12 is also retrieved.

Fifteenth Embodiment

In the above embodiments, the device detects physical quantity in parallel to the one side 10a of the sensor portion 10. In the fifteenth embodiment, the device detects physical quantity perpendicular to the one side 10a of the sensor portion 10. The device detects the physical quantity in a Z-axis.

Figure 25A:
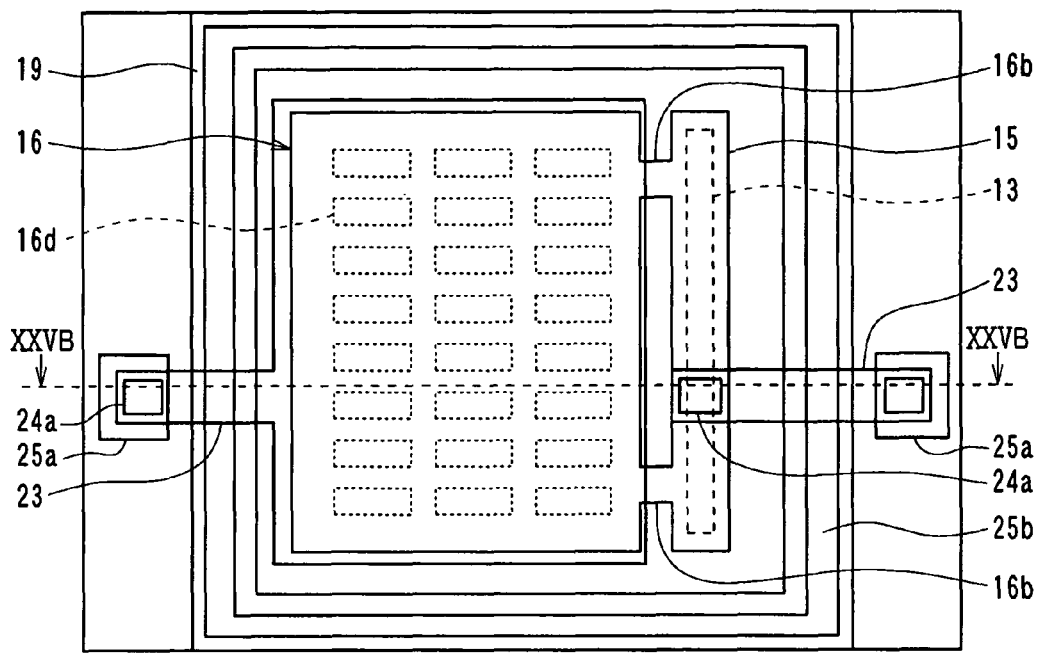
FIG. 25A is a diagram showing a plan view of a semiconductor device according to a fifteenth embodiment.
Figure 25B:
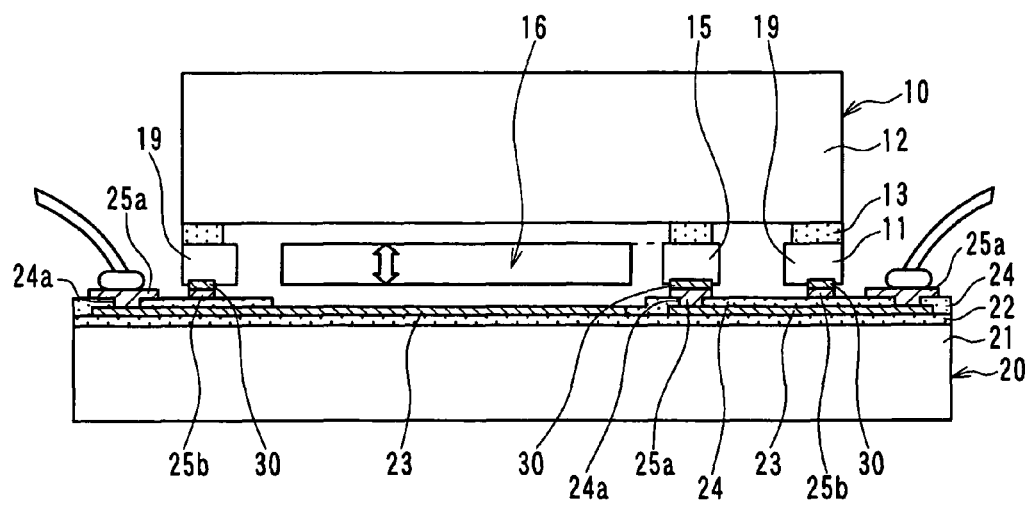
FIG. 25B is a diagram showing a cross sectional view of the device taken along line XXVB-XXVB in FIG. 25A.

FIGS. 25A and 25B show a semiconductor device according to the fifteenth embodiment.

As shown in FIG. 25B, the anchor 15, the beam 16b, the vibrator 16 and the periphery element 19 are formed in the first silicon layer 11 in the sensor portion 10. Multiple etching holes 16d are formed in the vibrator 16.

In the cap portion 20, the first wiring layer 23 is patterned so that the first wiring layer 23 faces the vibrator 16. Thus, capacitance between the vibrator 16 and the first wiring layer 23 is detected so that the physical quantity is detected.

Further, as shown in FIG. 25B, the wiring portion 25a formed on the first wiring layer 23 is connected top the anchor 15 via the eutectic alloy portion 30. The sealing portion 25b formed on the second insulation film 24 is connected to the periphery element 19 via the eutectic alloy portion 30. In this embodiment, the eutectic alloy portion 30 is made of, for example, gold-silicon eutectic alloy.

Thus, in the device for detecting the physical quantity in the Z-direction, the part of the sensor portion 10 and the part of the cap portion 20 are alloyed to be the eutectic alloy so that the wafers are bonded together.

Sixteenth Embodiment

FIGS. 26A and 26B show a semiconductor device according to a sixteenth embodiment.

In the device in FIG. 26A, the periphery element 19 surrounds the structure shown in FIG. 25A. Further, as shown in FIG. 26B, the through hole electrodes 76c, 77c are formed in the sensor portion 10. Thus, similar to the device in FIG. 24, an electric potential of each connection element 18 is retrieved to an external device via the through hole electrodes 76c-77c.

Thus, the device is electrically coupled with the external device via the through hole electrodes 76c-77c without using the wire 50.

Seventeenth Embodiment

In the first embodiment, the wiring layer 14 made of aluminum is formed on a whole surface of the first silicon layer 11. In the present embodiment, the wiring layer 14 is formed on a part of the first silicon layer 11.

Figure 27:
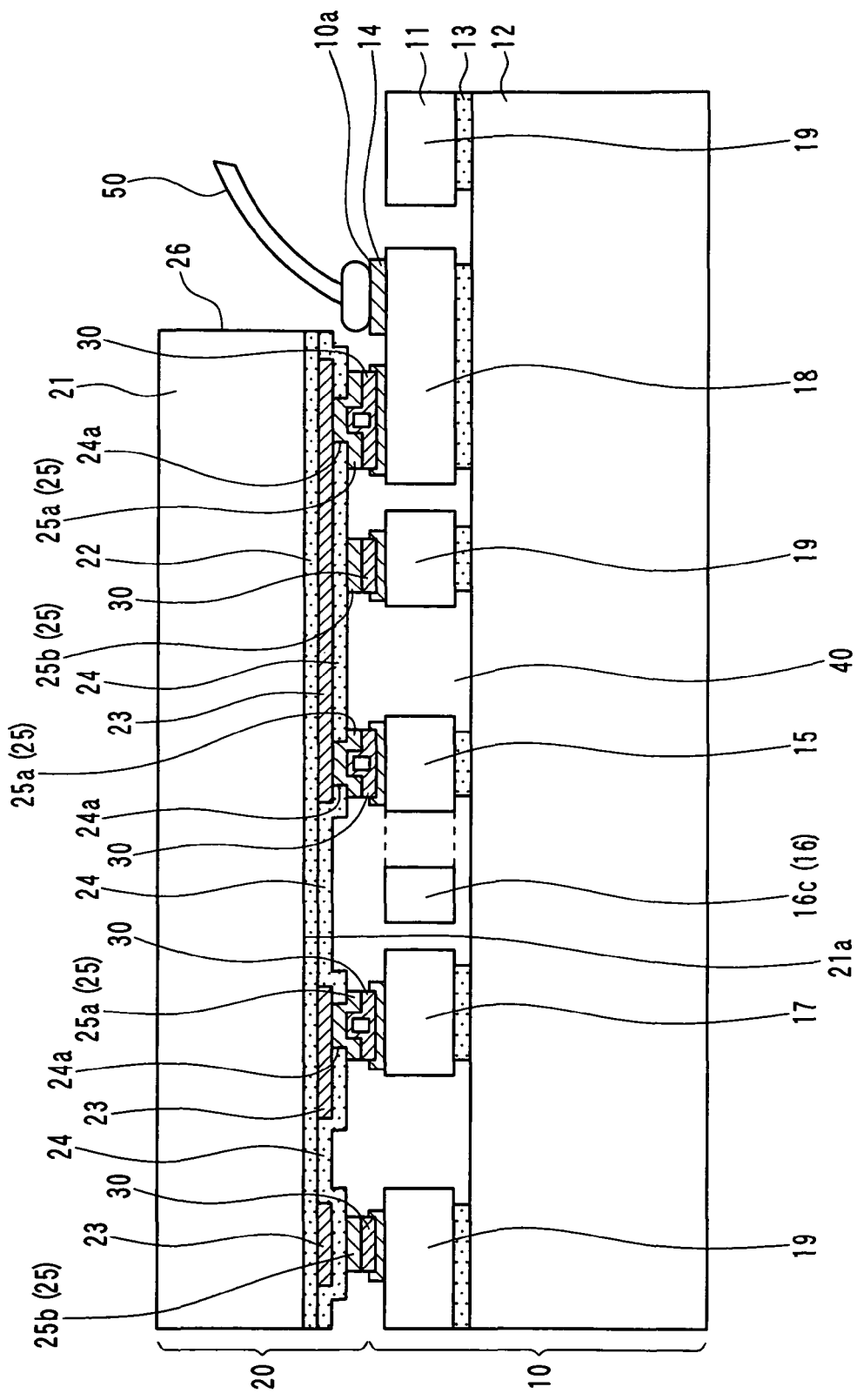
FIG. 27 is a diagram showing a cross sectional view of a semiconductor device according to a seventeenth embodiment.

FIG. 27 shows a semiconductor device according to a seventeenth embodiment. The wiring layer 14 is disposed on the surface side of the anchor 15, the fixed electrode 17, the connection element 18 and the periphery element 19, which face at least the wiring portion 25a and the sealing portion 25b. The anchor 15, the fixed electrode 17, the connection element 18 and the periphery element 19 are formed on the first silicon layer 11. The wiring layer 14 is further formed on the front side of the connection element 18, which faces the wiring portion 25a and a connection portion of the wire 50. Thus, the wiring layer 14 made of aluminum is formed on the minimum portion of the first silicon layer 11.

In this embodiment, the area of the wiring layer 14 is wider than the wiring portion 25a and the sealing portion 25b. Alternatively, the area of the wiring portion 25a and the sealing portion 25b may be wider than the wiring layer 14.

The linear part 16a, the beam 16b, and the movable electrode 16c provide the vibrator 16, and the wiring layer 14 is not formed on the vibrator 16. Accordingly, the stress of the wiring layer 14 made of aluminum does not affect on the vibrator 16.

The wiring layer 14 disposed on the anchor 15 and the like and facing the wiring portion 25a and the sealing portion 25b is alloyed with at least one of the wiring portion 25a and the sealing portion 25b. Thus, the wiring layer 14 and at least one of the wiring portion 25a and the sealing portion 25b are alloyed to be eutectic alloy.

In the above structure, a stacking structure of silicon in the first silicon layer 11, aluminum in the wiring layer 14, germanium in the eutectic alloy portion 30, aluminum in the first wiring layer 23 and the second wiring layer 25, and silicon in the silicon substrate 21 is formed so as to balance the stress in the device. Thus, the germanium layer is disposed between the aluminum layer and the aluminum layer, so that the eutectic alloy is stable.

Next, a manufacturing method of the semiconductor device will be explained. First, the wafer having multiple sensor portions 10 is prepared in the step of FIG. 4A. Then, in the step of FIG. 4B, a mask having an opening at a position corresponding to the wiring layer 14 is used for forming the wiring layer 14. Thus, the wiring layer 14 is formed on the first silicon layer 11, which faces at least the wiring portion 25a and the sealing portion 25b, and further, a bonding portion of the wire 50. Accordingly, the wiring layer 14 is not formed on the first silicon layer 11, which provides the vibrator 16.

In the step of FIG. 4C, the photo-lithography and etching process is performed, so that a trench is formed in the first silicon layer 11. Thus, the anchor 15, the vibrator 16, the fixed electrode 17, the connection element 18 and the periphery element 19 are formed. Further, the insulation layer 13 disposed between the first silicon layers 11 to provide the vibrator 16 and the second silicon layer 12 is removed so that the vibrator 16 is formed. Thus, the wiring layer 14 is formed on the surface portion of the first silicon layer 11, which faces at least the wiring portion 25a and the sealing portion 25b.

The wafer having multiple cap portions 20 is prepared in the step of FIGS. 5A to 5E.

Figure 28:
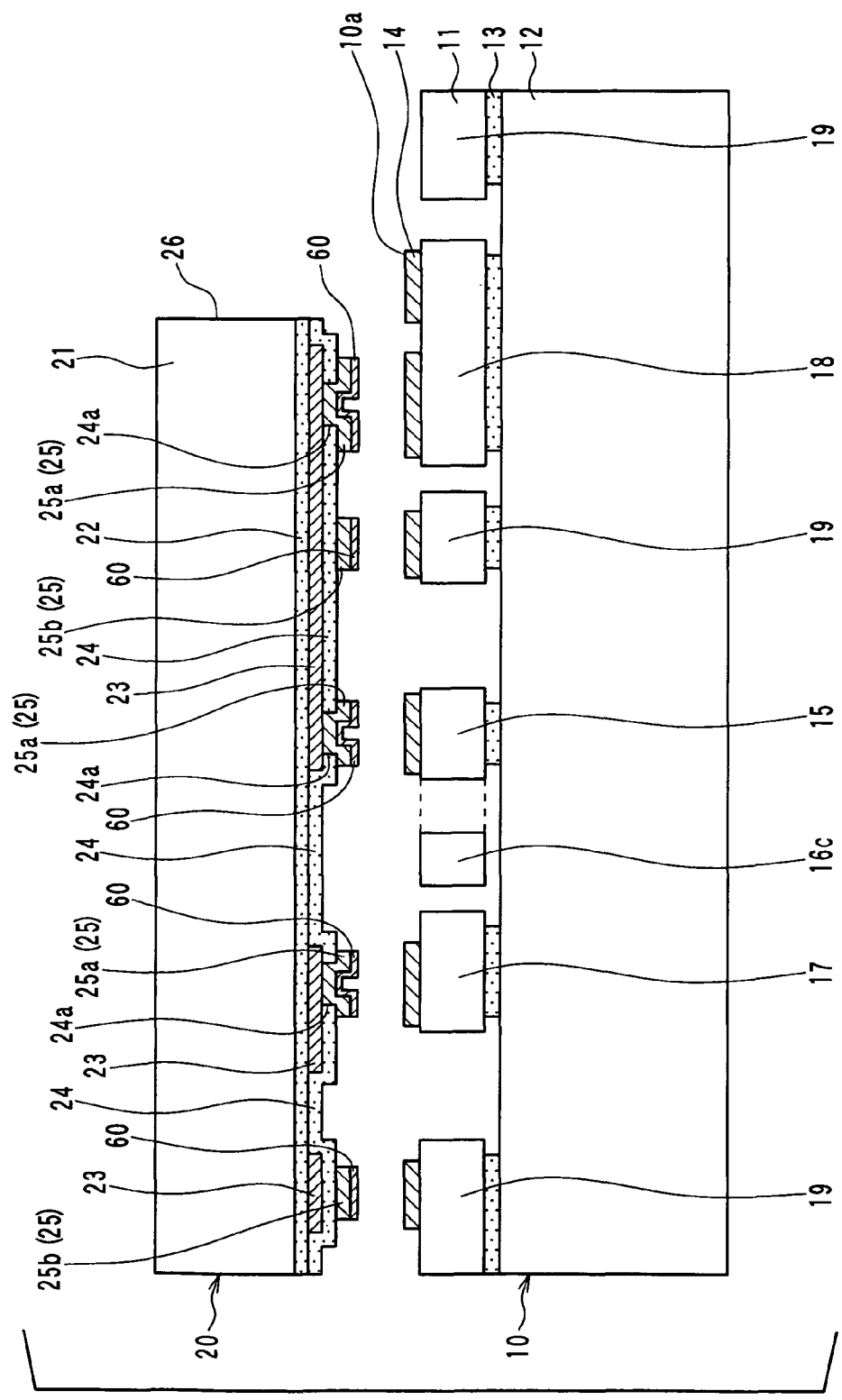
FIG. 28 is a diagram showing a manufacturing method of the semiconductor device in FIG. 27.

Then, as shown in FIG. 28, the wafer having multiple sensor portions 10 and, the wafer having multiple cap portions 20 are arranged to face each other in the vacuum chamber. Then, the wafer having multiple sensor portions 10 is moved closer to the wafer having multiple cap portions 20, so that the wiring layer 14 contacts the conductive layer 60. Then, the wafers stacked each other are heated, so that the eutectic alloy portion 30 is formed. After that, the wafers bonded together are cut into multiple chips. Thus, the semiconductor device shown in FIG. 27 is completed. Then, the wire 50 is bonded to the device so that the device is electrically coupled with the external system.

In this embodiment, the wiring layer 14 is formed on the first silicon layer 11, which faces at least the wiring portion 25a and the sealing portion 25b. Thus, the area of a part of the first silicon layer, on which the wiring layer 14 is disposed, is minimized. Accordingly, deformation of the sensor structure caused by difference of thermal expansion between the anchor 15 and the like in the first silicon layer 11 and the wiring layer 14 is restricted. Specifically, the wiring layer 14 is not formed on the vibrator 16, which is movable according to flexure of the beam 16b. The vibrator 16 is not affected by the thermal expansion of the wiring layer 14, so that the detection accuracy of acceleration is improved.

Although the above structure in the present embodiment is applied to the device in FIG. 6, the above structure may be applied to other devices in other embodiments. Specifically, the wiring layer 14 having the above pattern may be used for the devices in other embodiments.

Eighteenth Embodiment

In the eighteenth embodiment, the periphery element 19 in the first silicon layer 11 contacts the second silicon layer 12, and further, the periphery element 19 contacts the silicon substrate 21 in the cap portion 20.

Figure 29:
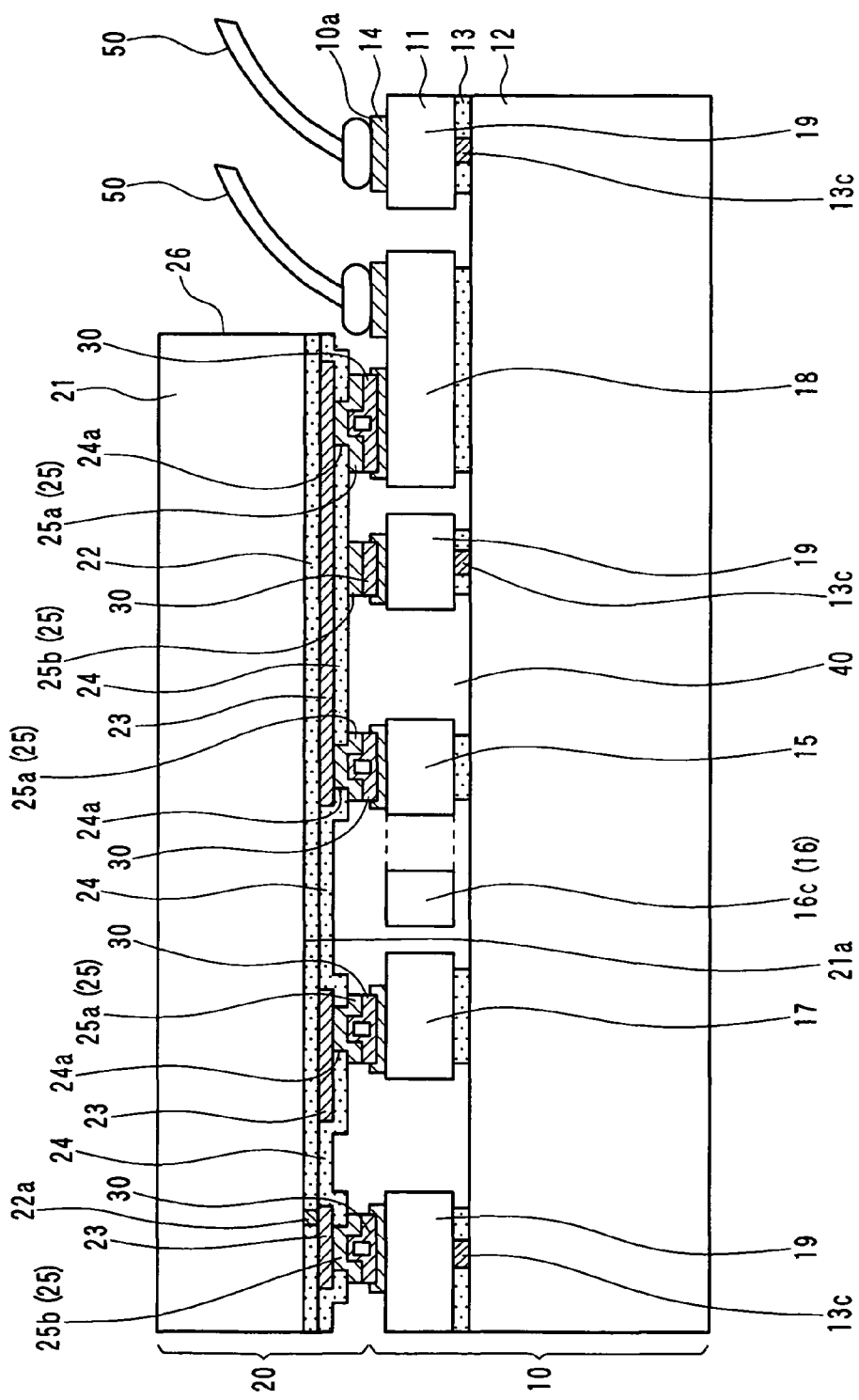
FIG. 29 is a diagram showing a cross sectional view of a semiconductor device according to an eighteenth embodiment.

FIG. 29 shows a semiconductor device according to an eighteenth embodiment. The insulation layer 13 includes a contact portion 13c for electrically connecting between the periphery element 19 and the second silicon layer 12. The contact portion 13c is disposed between the periphery element 19 and the second silicon layer 12. The insulation layer 13 includes an opening for exposing the second silicon layer 12 from the insulation layer 13. A poly crystal silicon film is embedded in the opening so that the contact portion 13c is formed. The poly crystal silicon has an impurity having the same conductive type as the first and second silicon layers 11, 12.

The contact portion 13c may be formed along with a whole part of the periphery element 19, which is formed in the first silicon layer 11. Alternatively, the contact portion 13c may be formed on a part of the periphery element 19. Alternatively, the contact portion 13c may be intermittently formed on the periphery element 19. Further, as shown in FIG. 21, the contact portion 13c may be formed in such a manner that the first silicon layer 11 having the same conductive type as the second silicon layer 12 is embedded in a contact hole 13a formed in the insulation layer 13.

In the cap portion 20, the silicon substrate 21 is electrically connected to the sealing portion 25b. Thus, the first insulation film 22 includes a contact portion 22a for connecting between the silicon substrate 21 and the first wiring layer 23. The contact portion 22a is disposed between the silicon substrate 21 and the first wiring layer 23. The contact portion 22a is formed such that an aluminum film or the like is embedded in an opening in the first insulation film 22. The first insulation film 22 is formed on the silicon substrate 21, and the silicon substrate 21 is exposed from the first insulation film 22 via the opening.

Specifically, the contact portion 22a is not formed between the silicon substrate 21 and a patterned portion of the first wiring layer 23, which is electrically connected to the sensor structure. The contact portion 22a is formed between the silicon substrate 21 and the first wiring layer 23 patterned so as to correspond to the periphery portion of the silicon substrate 21. Specifically, the contact portion 22a is arranged on the first insulation film 22 at a position corresponding to the periphery element 19.

The contact portion 22a maybe formed along with the first wiring layer 23, which is patterned so as to be arranged on an outer periphery of the silicon substrate 21. Alternatively, the contact portion 22a may be formed on a part of the first wiring layer 23. Alternatively, the contact portion 22a maybe intermittently formed on the first wiring layer 23. Furthermore, the contact portion 23 may be formed such that the first wiring layer 23 is embedded in the contact hole in the first insulation film 22.

The second insulation film 24 further includes an opening 24a, which faces the periphery element 19. The periphery element 19 is disposed on an outer periphery of the first silicon layer 11. Accordingly, when the second wiring layer 25 is formed on the second insulation film 24, the sealing portion 25b in the second wiring layer 25 is formed on the first wiring layer 23. Accordingly, the sealing portion 25b is electrically coupled with the silicon substrate 21 via the contact portion 22a and the first wiring layer 23. The sealing portion 25b is arranged on the same layer as the wiring layer 25a. Further, the sealing portion 25b is electrically isolated from the wiring portion 25a. The sealing portion 25b has a ring shape for corresponding to the periphery element 19 so that one end of the sealing portion 25b is connected to the other end of the sealing portion 25b.

The wiring layer 14 and the wiring portion 25a and the sealing portion 25b are alloyed and bonded to each other via the eutectic alloy portion 30. Thus, the second silicon layer 12, the contact portion 13c, the periphery element 19, the wiring layer 14, the eutectic alloy portion 30, the sealing portion 25b, a part of the first wiring layer 23, the contact portion 22a and the silicon substrate 21 are electrically coupled with each other, and therefore, have the same electric potential. Further, as shown in FIG. 29, the wire 50 is bonded to the periphery element 19 in the sensor portion 10 so that a predetermined voltage is applied to the periphery element 19 from an external circuit. Thus, the silicon substrate 21, the periphery element 19, and the second silicon layer 12 have the same electric potential so that the sensor structure is electrically shielded.

A manufacturing method of the semiconductor device will be explained. The SOI substrate in the wafer is prepared in the step of FIG. 4A. In this case, the insulation layer 13 is formed on the second silicon layer 12. An opening is formed in the insulation layer 13 so as to expose the second silicon layer 12 from the insulation layer 13 at a position corresponding to the periphery element 19. A poly crystal silicon film having the same conductive type as the second silicon layer 12 is embedded in the opening so that the contact portion 13c is formed. After that, the first silicon layer 11 having the same conductive type as the second silicon layer 12 is formed on the insulation layer 13. Thus, the SOI substrate is completed. Here, the contact portion 13c may be formed such that the first silicon layer 11 having the same conductive type as the second silicon layer 12 is embedded in the contact hole 13a in the insulation layer 13.

After that, the wiring layer 14 is formed in the step of FIG. 4B. In this step, the wiring layer 14 is formed on the first silicon layer 11, which faces the wiring portion 25a and the sealing portion 25b, and a connection portion of the wire 50. The photo-lithography and etching process is performed in the step of FIG. 4C so that the sensor structure such as the anchor 15 and the periphery element 19 are formed in the first silicon layer. Thus, the wafer having multiple sensor portions 10 is prepared.

In the step of FIG. 5A, the silicon substrate 21 is prepared. The first insulation film 22 is formed on the one side 21a of the substrate 21. Then, the opening is formed in the first insulation film 22 at a position corresponding to the first wiring layer 23, which is patterned on an outer periphery of the silicon substrate 21. Specifically, the position corresponding to the first wiring layer 23 corresponds to the periphery element 19. The silicon substrate 21 is exposed from the first insulation film 22 via the opening. A metallic film such as aluminum film is embedded in the opening, so that the contact portion 22a is formed. Then, the first wiring layer 23 is formed on the first insulation film 22 and the contact portion 22a.

An opening maybe formed in the first insulation film 22, and a metallic film made of, for example, aluminum maybe embedded in the opening. Thus, the contact portion 22a is formed in the opening, and further, the first wiring layer 23 is formed on the first insulation film 22.

The first wiring layer 23 is patterned in the step of FIG. 5B. The second insulation film 24 is formed on the first wiring layer 23 in the step of FIG. 5C. The openings 24a are formed in the second insulation film 24 at positions corresponding to the anchor 15, the fixed electrode 17, the connection element 18 and the periphery element 19, respectively.

Then, in the step of FIG. 5D, the second wiring layer 25 is formed o the second insulation film 24 and the first wiring layer 23 exposed via the opening 24a from the second insulation film 24. Further, the conductive layer 60 is formed on the second wiring layer 25.

In the step of FIG. 5E, the second wiring layer 25 is patterned so as to form the wiring portion 25a and the sealing portion 25b. Thus, the silicon substrate 21, the contact portion 22a, the first wiring layer 23 and the sealing portion 25b are electrically connected to each other via the contact portion 22a, which is formed in the silicon substrate 21 at a position corresponding to the periphery element 19. Thus, the wafer having multiple cap portions 20 is prepared.

As shown in FIG. 30, the wafer having multiple sensor portions 10 and the wafer having multiple cap portions 20 are accommodated in the vacuum chamber to face each other. Then, the wafer having multiple sensor portions 10 is moved closer to the wafer having multiple cap portions 20, and then, the wiring layer 14 contacts the conductive layer 60. Then, the sensor portion 10 and the cap portion 20 are stacked and heated, so that the eutectic alloy portion 30 is formed. Thus, the silicon substrate 21, the contact portion 22a, a part of the first wiring layer 23, the sealing portion 25b, the eutectic alloy portion 30, the periphery element 19 including the wiring layer 14, the contact portion 13c, and the second silicon layer 12 are electrically coupled with each other, so that they have the same electric potential. Then, the wafers bonded together are divided into chips, so that the semiconductor device in FIG. 27 is completed.

The wire 50 is bonded to the wiring layer 14, which is disposed on the periphery element 19. Thus, a predetermined voltage is applied to the wire 50 from an external circuit, so that the sensor structure is shielded electro-magnetically.

In the present embodiment, the contact portion 13c is formed in the insulation layer 13 in the sensor portion 10, and the contact portion 22a is formed in the first insulation film 22 of the cap portion 20. Thus, the silicon substrate 21, the contact portion 22a, the part of the first wiring layer 23, the sealing portion 25b, the eutectic alloy portion 30, the periphery element 19 including the wiring layer 14, the contact portion 13c, and the second silicon layer 12 are electrically coupled with each other.

Thus, the silicon substrate 21, the periphery element 19 and the second silicon layer 12 surround the sensor structure, and the silicon substrate 21, the periphery element 19 and the second silicon layer 12 have the same electric potential. Thus, the sensor structure is shielded electrically. Thus, the sensor structure is not affected by an electro-magnetic noise from an outside of the device. Thus, the detection accuracy of acceleration is improved.

Although the above structure in the present embodiment is applied to the device in FIG. 6, the above structure may be applied to other devices in other embodiments. Specifically, the contact portions 13c, 22a may be used for the devices in other embodiments.

Here, in the above embodiment, the silicon substrate 21 corresponds to a conductive substrate, the second silicon layer 12 corresponds to a second conductive layer.

(Modifications)

In the above embodiments, the device includes the sealing portion 25b. Here, the sealing portion 25b functions to seal the sensor structure. Accordingly, it is not necessary for the device to include the sealing portion 25b. Alternatively, the device may not have the sealing portion 25b.

In the above embodiments, the sealed portion 40 is in vacuum. Alternatively, the sealed portion 40 may be filled with medium. The sealed medium is, for example, air, N2 gas, or inert gas such as He gas, Ar gas. Further, the pressure in the sealed portion 40 may be controlled. For example, the pressure in the sealed portion 40 may be controlled to be 1 atm. Alternatively, the pressure in the sealed portion 40 may be higher than 1 atm. In this case, a damping effect of the sealed gas is obtained.

In each embodiment, the cap portion 20 is provided from the silicon substrate 21. Alternatively, the cap portion may be formed from a glass substrate, a metallic substrate, a ceramics substrate, or other semiconductor substrates. For example, when the substrate 21 is made of insulation material such as glass, it is not necessary to form the first insulation film 22, and thereby, the first wiring layer 23 is directly formed on the insulation substrate.

In the above embodiments, the eutectic alloy portion 30 is made of Al—Ge eutectic alloy, or Au—Si eutectic alloy. Alternatively, the eutectic alloy portion 30 may be made of other eutectic alloy such as Au—Sn eutectic alloy, or Au—Ge eutectic alloy. When the eutectic alloy portion 30 is made of Au—Sn eutectic alloy, the eutectic temperature is 280° C. when the concentration of Sn with respect to Au is 20 wt %. When the eutectic alloy portion 30 is made of Au—Ge eutectic alloy, the eutectic temperature is 356° C. when the concentration of Ge with respect to Au is 12 wt %. Even when the eutectic alloy portion 30 is made of any material, the eutectic temperature, i.e., the bonding temperature is lowered. Alternatively, the eutectic alloy portion 30 may be made of other materials as long as it is easy to handle the other materials in the semiconductor process.

In the above embodiment, both of a part of the sensor portion 10 and a part of the cap portion 20 are alloyed with the conductive layer 60. Alternatively, at least one of a part of the sensor portion to be connected to the cap portion 20 and a part of the cap portion 20 to be connected to the sensor portion 10 may be alloyed to be the eutectic alloy portion 30. Here, when the one of the part of the sensor portion 10 and the part of the cap portion 20 is alloyed, the second wiring layer 25 and the conductive layer 60 may be preliminary formed from a Al—Ge or Au—Si eutectic layer. In this case, one of the part of the sensor portion 10 and the part of the cap portion 20 is made of eutectic alloy, the other one of the part of the sensor portion 10 and the part of the cap portion 20 is alloyed to be the eutectic alloy portion 30.

For example, an eutectic alloy layer may be formed on the second wiring layer 25 in the cap portion 20. The eutectic alloy layer is sandwiched between the wiring layer 14 of the sensor portion 10 and the second wiring layer 25, and under this condition, the sensor portion 10 and the cap portion 20 are heated so that a part of the eutectic alloy layer and a part of the wiring layer 14 are alloyed, and further, a part of the eutectic alloy layer and a part of the second wiring layer 25 are alloyed.

Alternatively, an eutectic alloy layer may be formed on the wiring layer 14 in the sensor portion 10. The eutectic alloy layer is sandwiched between the wiring layer 14 of the sensor portion 10 and the second wiring layer 25, and under this condition, the sensor portion 10 and the cap portion 20 are heated so that a part of the eutectic alloy layer and a part of the wiring layer 14 are alloyed, and further, a part of the eutectic alloy layer and a part of the second wiring layer 25 are alloyed.

Alternatively, an eutectic alloy layer as the second wiring layer 25 may be formed in the cap portion 20. The eutectic alloy layer contacts the wiring layer 14, and under this condition, the sensor portion 10 and the cap portion 20 are heated so that the eutectic alloy layer and a part of the wiring layer 14 are alloyed.

Alternatively, the first silicon layer 11 may be exposed on the one side 10a of the sensor portion 10, and an eutectic alloy layer as the second wiring layer 25 may be formed in the cap portion 20. The first silicon layer 11 contacts the eutectic alloy layer, and under this condition, the sensor portion 10 and the cap portion 20 are heated so that a part of the eutectic alloy layer and a part of the first silicon layer 11 are alloyed.

When the eutectic alloy portion is made of aluminum and germanium, a Al—Ge layer may be formed by an evaporation deposition method or a sputtering method so as to be a predetermined ratio between Al and Ge.

Although the sensor portion 10 and the cap portion 20 are formed from a silicon substrate, the sensor portion 10 and the cap portion 20 may be formed from a compound semiconductor substrate such as a GaAs substrate, a GaN substrate, a SiGe substrate and SiC substrate, or a metallic substrate such as a copper substrate, a nickel substrate and a kovar substrate.

In the tenth embodiment, the first wiring layer 23 and the second wiring layer 25 are made of gold. Alternatively, the first wiring layer 23 may be made of poly crystal silicon having high impurity concentration. In this case, the second wiring layer 25 made of gold is sandwiched between the first silicon layer 11 and the first wiring layer 23 made of poly crystal silicon. Thus, stress balance in the device is improved.

Nineteenth Embodiment

A semiconductor physical quantity sensor as a semiconductor device according to a nineteenth embodiment is an acceleration sensor or an angular speed sensor such as a gyro sensor having a movable portion. The sensor is suitably used for detecting acceleration and angular speed of a vehicle.

Figure 31A:
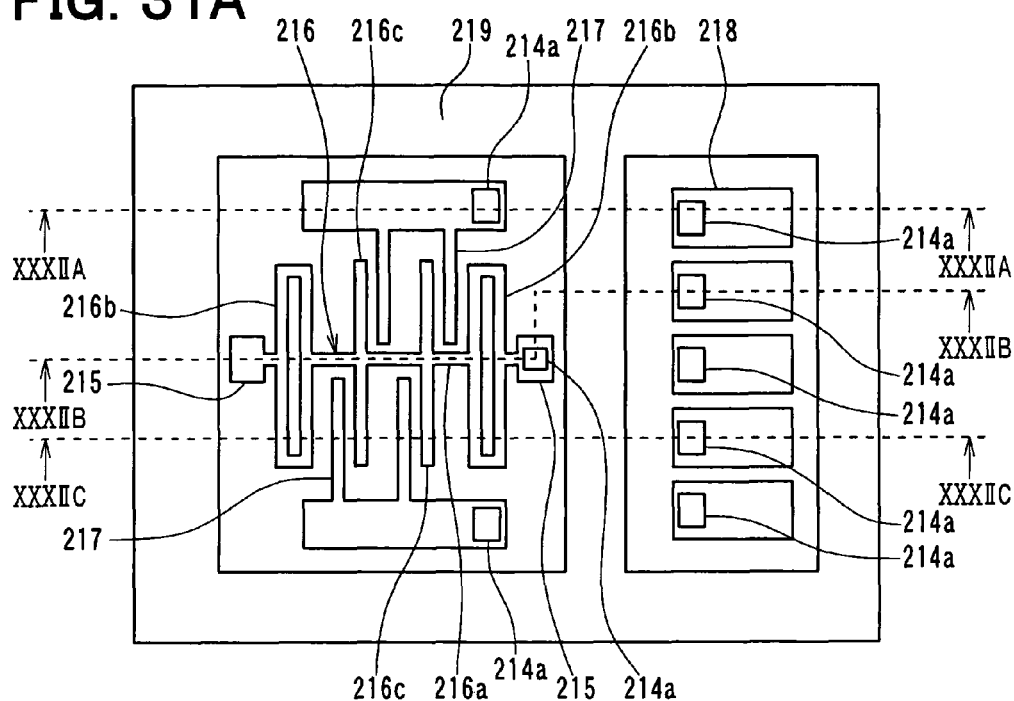
FIGS. 31A and 31B are diagrams showing a plan view of a semiconductor physical quantity sensor according to a nineteenth embodiment.
Figure 31B:
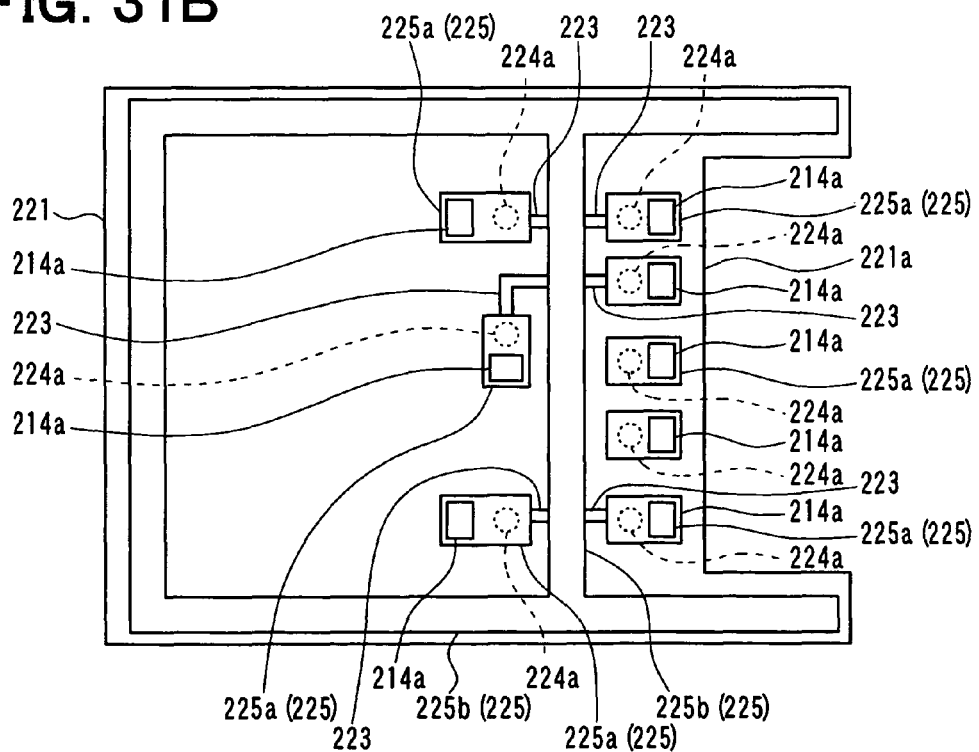
Figure 32A:
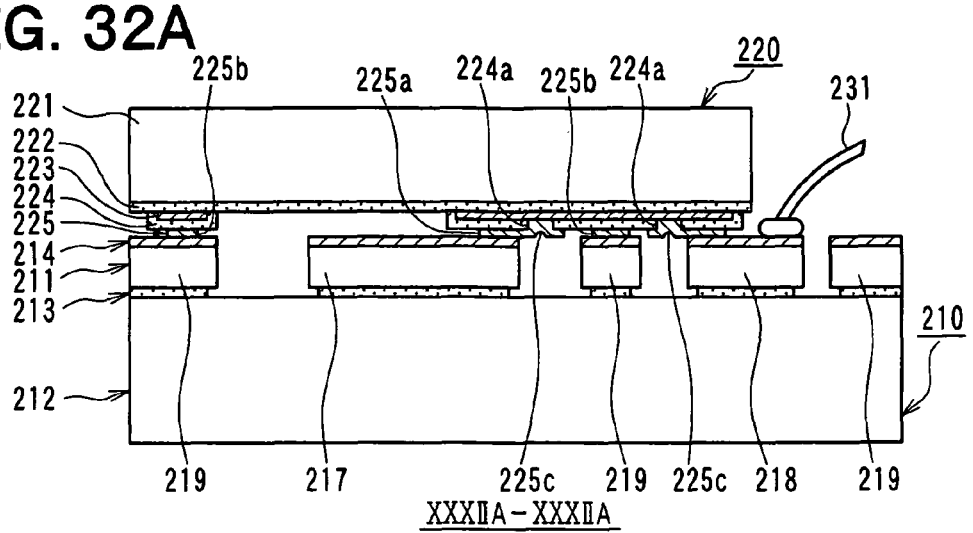
FIG. 32A is a diagram showing a cross sectional view of the sensor taken along line XXXIIA-XXXIIA in FIG. 31A.
Figure 32B:
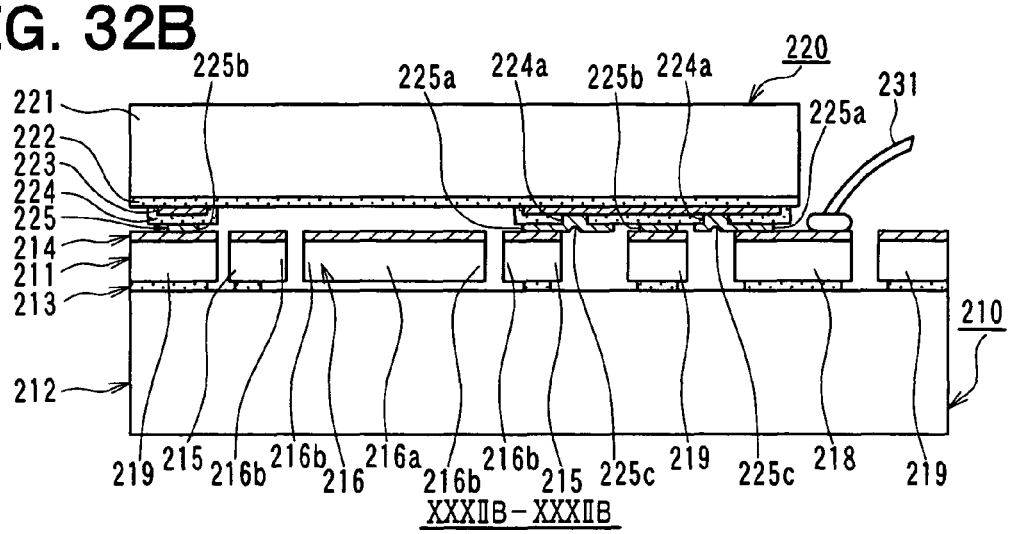
FIG. 32B is a diagram showing a cross sectional view of the sensor taken along line XXXIIB-XXXIIB in FIG. 31A.
Figure 32C:
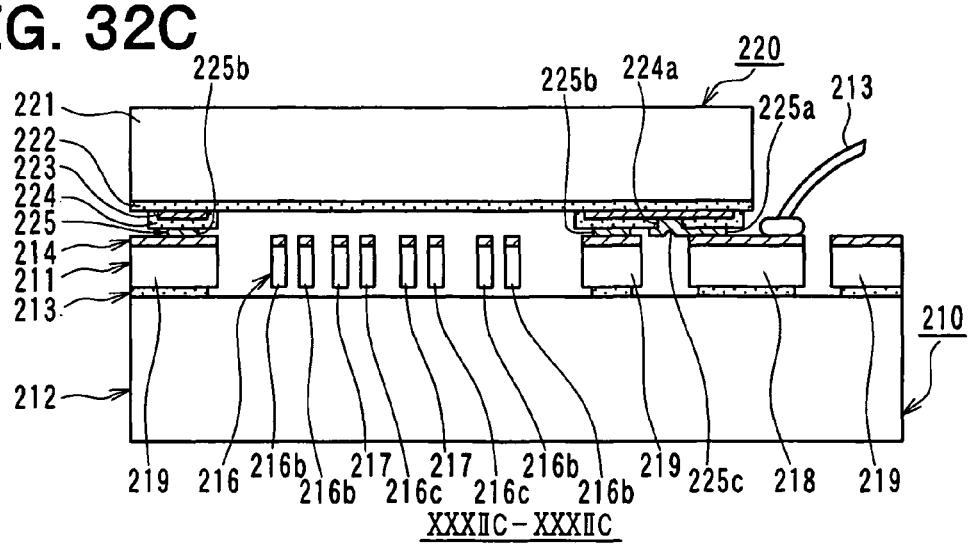
FIG. 32C is a diagram showing a cross sectional view of the sensor taken along line XXXIIC-XXXIIC in FIG. 31A.

FIG. 31A shows a plan view of a sensor portion in the physical quantity sensor. FIG. 31B' shows a plan view of one side of a cap portion 220, which is bonded to the sensor portion 210. FIGS. 32A to 32C show cross sectional views of the sensor portion 210 and the cap portion 220 bonded together. FIG. 32A is a diagram showing a cross sectional view of the sensor taken along line XXXIIA-XXXIIA in FIG. 31A, FIG. 32B is a diagram showing a cross sectional view of the sensor taken along line XXXIIB-XXXIIB in FIG. 31A, and FIG. 32C is a diagram showing a cross sectional view of the sensor taken along line XXXIIC-XXXIIC in FIG. 31A.

The sensor includes the sensor portion 210 having a plate shape and the cap portion 220 having a plate shape, which are bonded together.

The sensor portion 210 has a sensing portion for detecting physical quantity such as acceleration. Specifically, the sensor portion 210 includes an SOI substrate having a first silicon layer 211, an insulation layer 213 and a second silicon layer 212, which are stacked in this order, and a wiring layer 214. The wiring layer 214 is formed on the first silicon layer 211. The first and second silicon layers 211, 212 are made of, for example, N conductive type single crystal silicon. The insulation layer 213 is made of, for example $SiO_2$. The wiring layer 214 is made of, for example, aluminum.

The sensing portion is formed in a surface portion of the one side of the first silicon layer 211. Specifically, as shown in FIG. 31A, a movable electrode fixed portion 215, a movable electrode 216, a fixed electrode 217, a connection element 218 and a periphery element 219 are formed in the first silicon layer 211.

The movable electrode fixed portion 215 has a block shape, and is arranged at two positions on the insulation layer 213. The movable electrode 216 is arranged between two movable electrode fixed portions 215. The movable electrode 216 includes a linear part 216a, a spring 216b, and an electrode part 216c. The linear part 216a couples between two movable electrode fixed portions 215. The spring 216b is perpendicular to the linear part 216a. The electrode part 216c has a bar shape. The linear part 216a, the spring 216b and the electrode part 216c are supported between two movable electrode fixed portions 215 so that the linear part 216a, the spring 216b and the electrode part 216c are spaced apart from the second silicon layer 212. The longitudinal direction of the linear part 216a in the movable electrode 216 is a movable direction of the movable electrode 216.

The fixed electrode 217 having a bar shape is formed on the insulation layer 213, and faces the electrode part 216c of the movable electrode 216. In FIG. 31A, the sensor includes two pairs of the electrode part 216c and the fixed electrode 217 along with the movable direction of the movable electrode 216. Alternatively, the sensor may include one, three or more pairs of the electrode part 216c and the fixed electrode 217. Thus, the electrode part 216c and the fixed electrode 217 are arranged to have a comb-teeth shape. The movable electrode 216 and the fixed electrode 217 provide a comb-teeth electrode as a capacitor.

The fixed electrode 217 is arranged on the insulation layer 213, as shown in FIG. 32A. Similarly, the movable electrode fixed portion 215 is formed on the insulation layer 213, as shown in FIG. 32B. The insulation layer 216 under the linear part 216a and the spring 216b of the movable electrode 216 is removed so that the linear part 216a and the spring 216b are separated from the second silicon layer 212. Similarly, as shown in FIG. 32C, the electrode part 216c of the movable electrode 216 and a part of the fixed electrode 217 facing the electrode part 216c are spaced apart from the second silicon layer 212.

In the above structure, when acceleration and/or angular speed is applied to the sensor, the spring 216b of the movable electrode 216 is deformed, so that the electrode part 216c of the movable electrode 216 is displaced toward an expending direction of the linear part 216a with respect to the fixed electrode 217, a position of which is fixed. Accordingly, the capacitance of the capacitor between the fixed electrode 217 and the electrode part 216c is measured, and the sensor detects the physical quantity such as acceleration and angular speed applied to the sensor. The comb-teeth structure provided by the movable electrode fixed portion 215, the movable electrode 216 and the fixed electrode 217 is defined as a sensor structure.

The connection element 218 functions as a terminal for connecting between the sensor and an external circuit electrically. Since the wiring layer 214 is formed on the first silicon layer 211, the sensor is electrically coupled with the external circuit via the connection element 218 and the wiring layer 214.

As shown in FIG. 31A, the periphery element 219 surrounds the sensor structure, and further surrounds the connection element 218. Thus, a region of the sensor structure and a region of the connection element 218 are separated from each other with the periphery element 219. Alternatively, the periphery element 219 may not completely surround the connection element 218. Even in this case, function of the device is sufficient.

The cap portion 220 protects the sensor structure from water and/or a foreign particle penetrating into the sensor structure. The cap portion 220 includes a silicon substrate 221, a first insulation film 222, a first wiring layer 223, a second insulation film 224, and a second wiring layer 225. The first and second insulation films 222, 224 may be made of the same material. Alternatively, the material of the first insulation film 222 may be different from the material of the second insulation film 224. The first and second wiring layers 223, 225 may be made of the same material. Alternatively, the material of the first wiring layer 223 may be different from the material of the second wiring layer 225.

The silicon substrate 221 has a square shape with one side and the other side, which is opposite to the one side. The one side of the substrate 211 includes a concavity 221a, which is concaved toward the other side. The connection element 218 is exposed from the silicon substrate 221 via the concavity 221a when the cap portion 220 is bonded to the sensor portion 210.

The first insulation film 222 is formed on one side of the silicon substrate 221, which faces the sensor portion 210. The first insulation film 222 isolates the first wiring layer 223 from the silicon substrate 221. Further, the first wiring layer 223 is patterned on the first insulation film 222.

The second insulation film 224 is formed on the first wiring layer 223 so as to cover the first wiring layer 223. An opening 224a is formed in a part of the second insulation film 224 other than a region facing the fixed electrode 217, the movable electrode fixed portion 215 and the connection element 218.

Thus, the second wiring layer 225 is patterned and formed on the second insulation film 224 having the opening 224a. Specifically, the second wiring layer 225 includes a wiring portion 225a and a sealing portion 225b. The wiring portion 225a is connected to the fixed electrode 217, the movable electrode fixed portion 215 and the connection element 218 in the sensor portion 210, respectively. The sealing portion 225b is connected to the periphery element 219 of the sensor portion 210. The sealing portion 225b steps over the first wiring layer 223. Specifically, the sealing portion 225b crosses over the first wiring layer 223.

A contact region 214a is formed on each of the movable electrode fixed portion 215, the fixed electrode 217 and the connection element 218. The wiring portion 225 of the second wiring layer 225 is connected to the contact region 214a.

Here, connection relationship between the movable electrode fixed portion 215, the fixed electrode 217 and the connection element 218 in the sensor portion 210 and the wiring portion 225a of the second wiring layer 225 will be explained with reference to FIG. 33A to 33B.

Figure 33A:
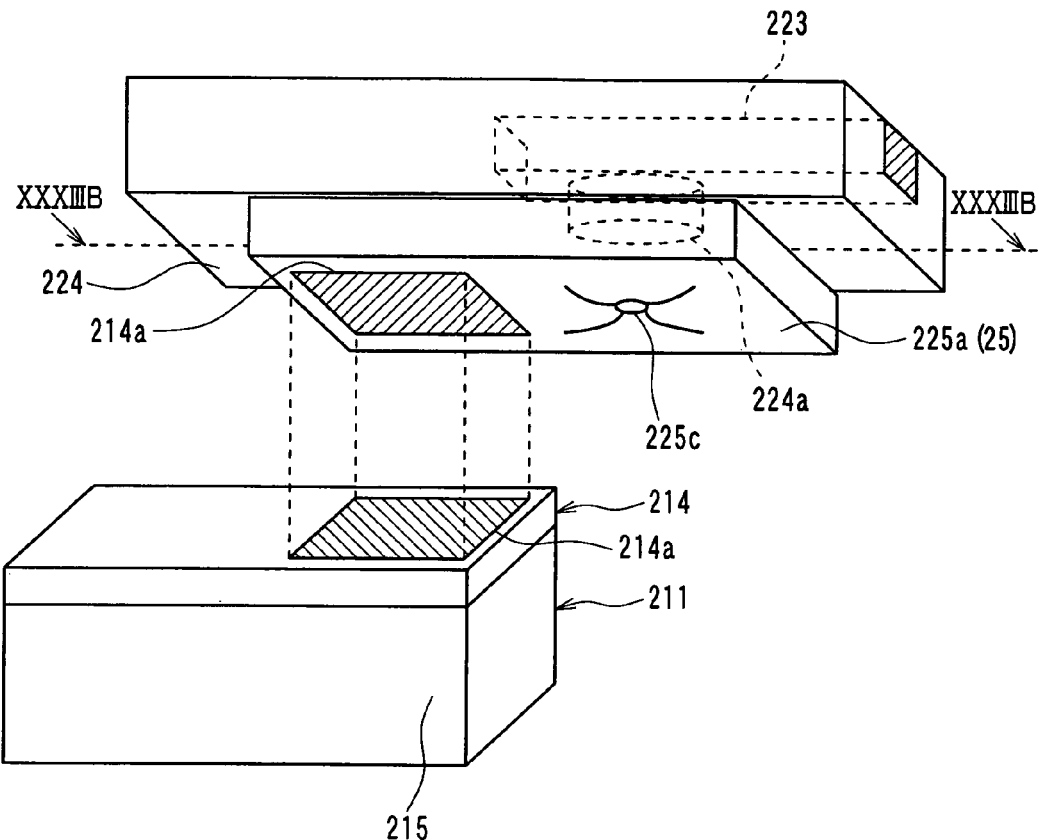
FIG. 33A is a diagram showing a partially enlarged view of a wiring portion of a second wiring layer and a fixed portion of a movable electrode.

FIG. 33A shows a contact portion between the wiring portion 225a of the second wiring layer 225 and the movable electrode fixed portion 215. FIG. 33B shows a polishing amount of the surface of the wiring portion 225a of the second wiring layer 225. FIG. 33A is a perspective view of the movable electrode fixed portion 215 and the second wiring layer 225 before bonding. FIG. 33B is a cross sectional view of the second wiring layer 225 on the first wiring layer 223.

As shown in FIG. 33A, a concavity 225c is formed on the surface of the wiring portion 225a, which is generated by a step coverage effect. Specifically, the concavity 225c is formed on a part of the wiring portion 225a, which is embedded in the opening 224a of the second insulation film 224. The concavity 225c is concaved toward the first wiring layer 223. The flat portion of the wiring portion 225a of the second wiring layer 225 is concaved toward the first wiring layer 223 so that the concavity 225c is formed. The concavity 225c has a bottom.

If the movable electrode fixed portion 215 is bonded to the wiring portion 225a of the second wiring layer 225 to cover the concavity 225c, the movable electrode fixed portion 215 may not contact the bottom of the concavity 225c on the surface of the wiring portion 225a. In this case, a contact area between the wiring portion 225a and the movable electrode fixed portion 215 is reduced, compared with a case where the concavity 225c is formed in the wiring portion 225c. Accordingly, the opening 224a of the second insulation film 224 is formed in a part of the second insulation film 224 other than a part facing the contact region 214a of the movable electrode fixed portion 215.

The contact region 214a of the movable electrode 215 faces a part of the wiring portion 225a of the second wiring layer 225 other than a region corresponding to the opening 224a of the second insulation film 224. Thus, the contact region 214a is displaced from the region of the surface of the wiring portion 225a of the second wiring layer 25 corresponding to the opening 224a. Thus, the contact region 214a is arranged on the surface of the wiring portion 225a of the second wiring layer 225 adjacent to the opening 224a of the second insulation film 224.

Thus, the movable electrode fixed portion 215 does not cover the concavity 225c of the wiring portion 225a of the second wiring layer 225. Thus, the contact area between the wiring portion 225a and the movable electrode fixed portion 215 is not reduced.

The contact region 214a is bonded to the part of the surface of the wiring portion 225a other than the region corresponding to the opening 224a of the second insulation film 224. The contact region 214a may be formed on a region of the surface of the wiring portion 225a other than the concavity 225c even if the region of the surface of the wiring portion 225a is partially overlapped over the opening 224a of the second insulation film 224.

Figure 33B:
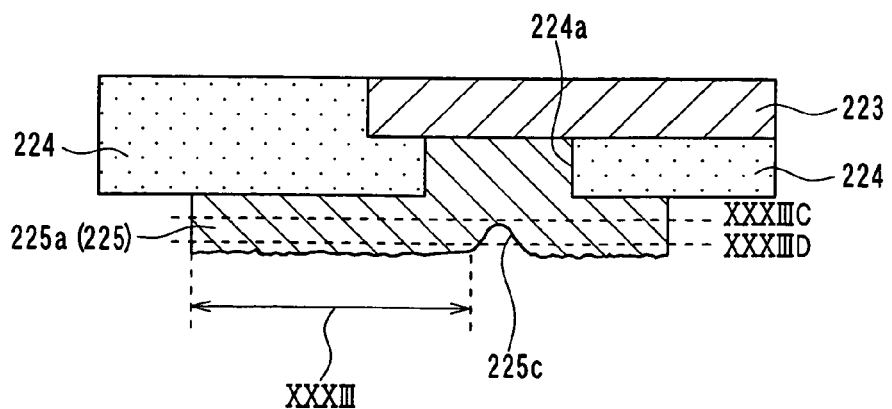
FIG. 33B is a diagram explaining a polishing amount of a surface of the wiring portion of the second wiring layer.

Specifically, as shown in FIG. 33B, a boundary is defined at position, from which a flat surface of the wiring portion 225a starts to slant toward the opening 224a. The boundary is between the flat surface and a slant surface of the wiring portion 225a. The contact region 214a is capable of arranging in an area XXXIII in FIG. 33B. The area XXXIII is disposed from one end of the flat surface to the boundary of the wiring portion 225a. Accordingly, the contact region 214a can be arranged adjacent to the boundary, even when the area includes a region of the surface of the wiring portion 225a corresponding to the opening 224a.

The boundary may be defined not only in a case where the boundary between the flat surface and the slant surface is clearly conformed (i.e., visible) but also in a case where the boundary is not clearly confirmed (i.e., visible).

Accordingly, the contact region 214a may be arranged in the area XXXIII in FIG. 33B. Thus, the contact region 214a is arranged at a position shifted from the concavity 225c.

The connection between the fixed electrode 217 and the second wiring layer 225, and the connection between the connection element 218 and the second wiring layer 225 have also the same feature as the above connection between the movable electrode fixed portion 215 and the second wiring layer 225.

As shown in FIG. 33B, the surface of the second wiring layer 225 including the contact region 214a is polished in a chemical mechanical polishing method (CMP method) so that concavities and convexities on the surface of the second wiring layer 225 generated in a forming step of the second wiring layer 225 are removed. In this case, it is not necessary to polish by the line XXXXIIIC in order to remove the concavity 225c completely. Alternatively, the surface of the second wiring layer 225 may be polished by the line XXXIID, so that a part of the concavity 225c remains.

Thus, in a wiring structure of the second wiring layer 225, the wiring portion 225a and the sealing portion 225b have the same height from the one side of the silicon substrate 221.

In this embodiment, since the concavity 221a is formed on the one side of the substrate 221, the second wiring layer 225 is not formed at a position corresponding to the periphery element 219, which faces the concavity 221a. Accordingly, the second wiring layer 225 surrounds at least the sensor structure of the sensor portion 210.

The wiring portion 225a of the second wiring layer 225 covers the opening 224a of the second insulation film 224, and is electrically coupled with the first wiring layer 223. The sealing portion 225b of the second wiring layer 225 is formed on a part of the second insulation film 224, which is separated from the opening 224a of the second insulation film 224, and faces the sealing portion 225b. Accordingly, the first wiring layer 223 is isolated from the sealing portion 225b. Specifically, the first wiring layer 223 steps over the sealing portion 225b, so that the fixed electrode 217 and the movable electrode fixed portion 215 in the sensor portion 210 is electrically coupled with the connection element 218 with crossing over the periphery element 219.

The first insulation film 222 and the second insulation film 224 are made of, for example, $SiO_2$, or $Si_3N_4$. The first wiring layer 223 and the second wiring layer 225 are made of, for example, aluminum or poly crystal silicon.

The sealing portion 225b of the second wiring layer 225 in the cap portion 220 is strongly bonded to the periphery element 219 in the sensor portion 210 by, for example, direct bonding method. Thus, as shown in FIGS. 32A to 32C, the second silicon layer 212, the insulation layer 213, the periphery element 219 in the sensor portion 210, and the second wiring layer 225, the sealing portion 225b of the second wiring layer 225, the second insulation film 224 and the first insulation film 222 in the cap portion 220 seals, i.e., accommodates the sensor structure.

Thus, since the sensor structure is sealed, water and/or foreign particle is prevented from penetrating into the sensor structure. An accommodation space for the sensor structure may be in vacuum, filled with an inert gas such as $N_2$ and He, or filled with air. In this embodiment, the accommodation space is in vacuum.

Further, as shown in FIG. 31B, the connection element 218 of the sensor portion 210 is exposed from the silicon substrate 221 via the concavity 221a formed on the silicon substrate 221 of the cap portion 220. Thus, as shown in FIGS. 32A to 32C, the bonding wire 231 is bonded to the connection element 218 exposed from the substrate 221. Thus, the semiconductor physical quantity sensor is electrically coupled with an external circuit.

Figure 34A:
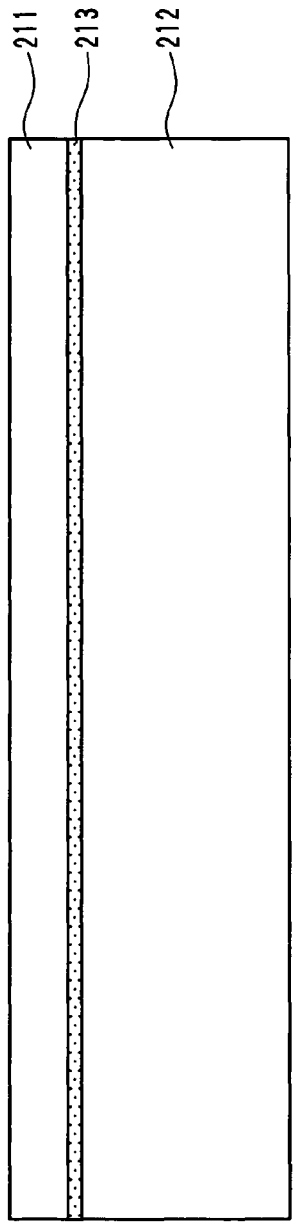
FIGS. 34A to 34C are diagrams showing a manufacturing process of a sensor portion in the sensor.
Figure 34B:
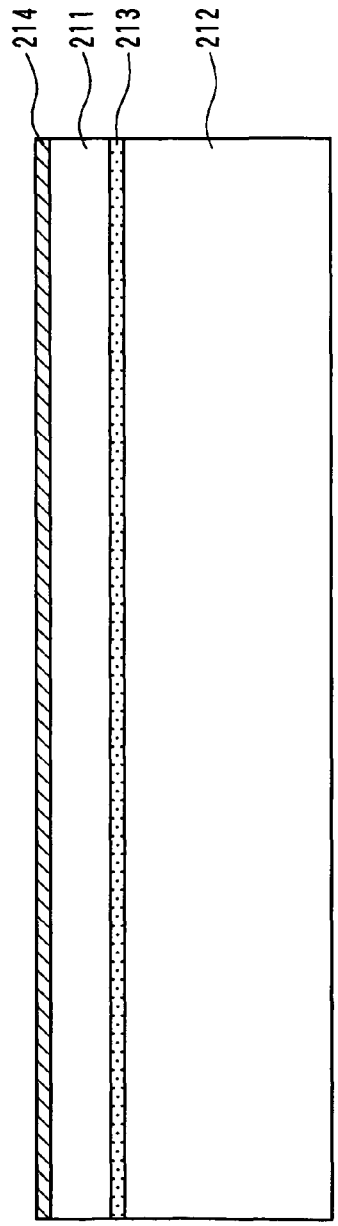
Figure 34C:
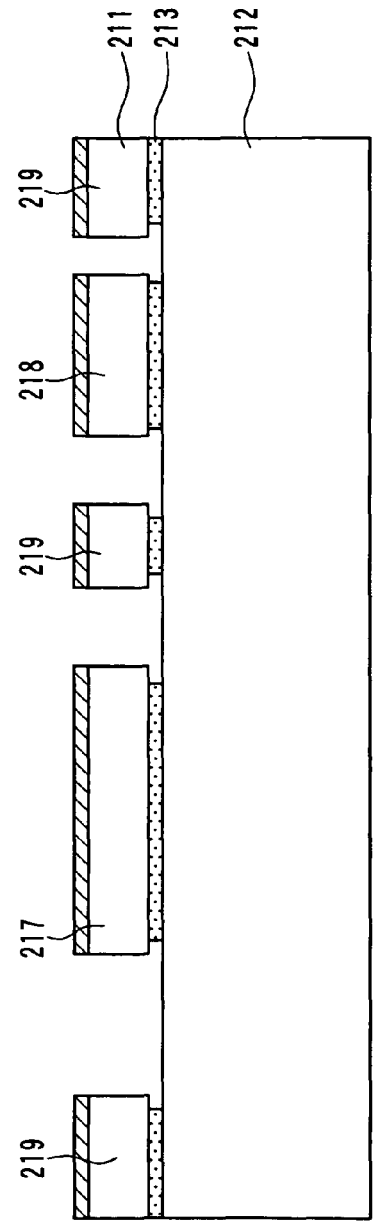

A manufacturing method of the semiconductor physical quantity sensor will be explained. Multiple sensor portions 210 are formed in a silicon wafer. FIGS. 34A to 34C shows the manufacturing method of the sensor portion 210. FIGS. 35A to 35E shows a manufacturing steps of the cap portion 220. FIG. 36 shows a bonding step of the sensor portion 210 and the cap portion 220. FIGS. 34A to 36 correspond to a cross sectional view of the sensor taken along with line XXXIIA-XXXIIA in FIG. 31A.

A manufacturing process of the sensor portion 210 will be explained with reference to FIGS. 34A to 34C. In FIG. 34A, the SOI substrate is prepared. Specifically, the insulation layer 213 made of a $SiO_2$ film is formed on the second silicon layer 212 made of a single crystal silicon wafer as a support substrate. The thickness of the insulation layer 213 is in a range between 0.1 micrometers and 2 micrometers. Further, the first silicon layer 211 as a silicon on insulator layer is bonded to the insulation layer 213 by a wafer bonding method. Thus, the SOI substrate is completed.

The first silicon layer 211 has a N conductive type and a (100)-orientation surface. Further, the first silicon layer 211 has resistivity in a range between 0.001 Ωcm and 0.02 Ωcm.

The single crystal silicon wafer and the SOI layer as the first silicon layer 211 may have a P conductive type. The first silicon layer 211 may have a different orientation surface. Alternatively, a poly crystal silicon film having an impurity with a high concentration may be deposited on the insulation layer 213 so that the SOI substrate is formed. Alternatively, the second silicon layer is used as the support substrate, the support substrate may be made of a glass substrate, a metallic substrate, a ceramic substrate, or other semiconductor substrates. The thickness of each of the first and second silicon layers 211, 212 may be in a range between 1 micrometer and 500 micrometers.

In a step of FIG. 34B, an aluminum layer as the wiring layer, 214 is formed on the first silicon layer 211 by a CVD method. The thickness of the aluminum layer is in a range between 0.1 micrometers and 2 micrometers. In this case, the wiring layer 214 is formed on a whole of the first silicon layer 214.

Then, in a step of FIG. 34C, a trench is formed in the wiring layer 214 and the first silicon layer 211 by a photo lithography method, and then, the fixed electrode 217, the connection element 218 and the periphery element 219 are formed.

Further, the movable electrode fixed portion 215 and the movable electrode 216, which are not shown in FIG. 34C, are also formed. In this case, the insulation layer 213 between the second silicon layer 212 and a movable-electrode-to-be-formed portion of the first silicon layer 211 is removed with an etchant such as HF in a gas phase or a liquid phase. Thus, the movable electrode 216 is formed. Thus, the sensor portion 210 of the semiconductor physical quantity sensor is completed.

Next, a manufacturing method of the cap portion 220 will be explained with reference to FIGS. 35A to 35E. Multiple cap portions 220 are formed in a silicon wafer.

Figure 35A:
FIGS. 35A to 35E are diagrams showing a manufacturing process of a cap portion in the sensor.

In a step of FIG. 35A, a single crystal silicon substrate 221 having resistivity of 0.01 Ωcm and a (100)-orientation surface is prepared. The substrate 221 is a silicon wafer. The first insulation film 222 made of Si3N4 is formed on the substrate 221 by a LPCVD method or a plasma CVD method. The thickness of the first insulation film 222 is in a range between 0.1 micrometers and 2 micrometers.

Figure 35B:
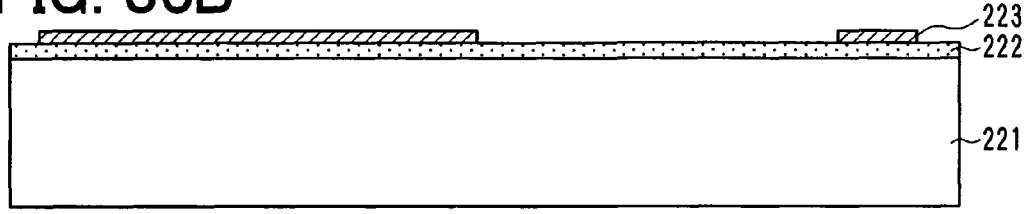

In a step of FIG. 35B, an aluminum film having a thickness in a range between 0.1 micrometers and 2 micrometers is formed on the first insulation film 222. The aluminum film is patterned by a photo lithography and etching method so that the first wring layer 223 is formed. Alternatively, the aluminum film may be formed with using a metallic mask such as stainless mask having an opening so that the first wiring layer 223 is formed by a mask deposition method.

Figure 35C:
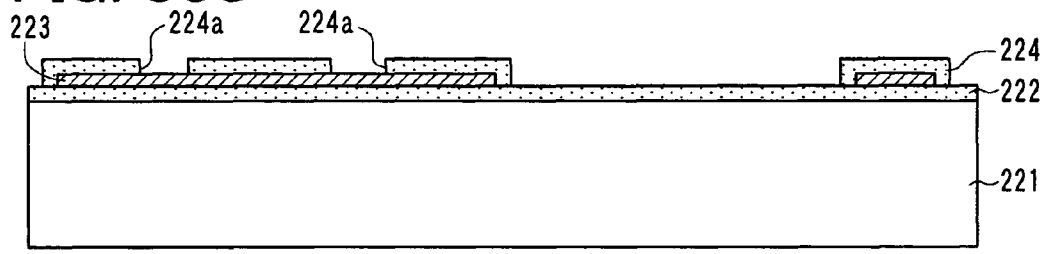

In a step of FIG. 35C, a $SiO_2$ film as the second insulation film 224 having a thickness in a range between 0.5 micrometers and 4 micrometers, which is sufficiently thicker than the first wiring layer 223, is formed on the first wiring layer 223 and the first insulation film 222. Further, the surface of the second insulation film 224 is flattened by a CMP method so that a whole surface of the wafer is flattened.

The opening 224a for exposing the first wiring layer 223 is formed in a part of the second insulation film 224 other than a portion facing the contact region 214a of the fixed electrode 217, the movable electrode fixed portion 215 and the connection element 218 in the sensor portion 210. Thus, the opening 224a is formed in the second insulation film 224 such that the opening 224a does not overlap the contact region 214a when the opening 224a faces the fixed electrode 217, the movable electrode fixed portion 215 and the connection element 218.

The opening 224a may be partially overlapped the contact region 214a of the fixed electrode 217, the movable electrode fixed portion 215 and the connection element 218 of the sensor portion 210 as long as the opening 224a is spaced apart from the concavity 225c, which is generated by a step coverage effect. The opening is used for connecting between the first wiring layer 223 and the second wiring layer 225. At leas a part of the second insulation film 224 corresponding to the position of the electrode portion 216c of the movable electrode 216 is removed so that the electrode portion 216c of the movable electrode 216 does not contact the cap portion 220.

Here, instead of the flattening step of the second insulation film 224, the second wiring layer 225 may be thickly formed on a whole surface of the wafer in the next step, and the surface of the second wiring layer 225 may be flattened by the CMP method, and then, the second wiring layer 225 may be patterned, in a photo lithography and etching process.

Figure 35D:
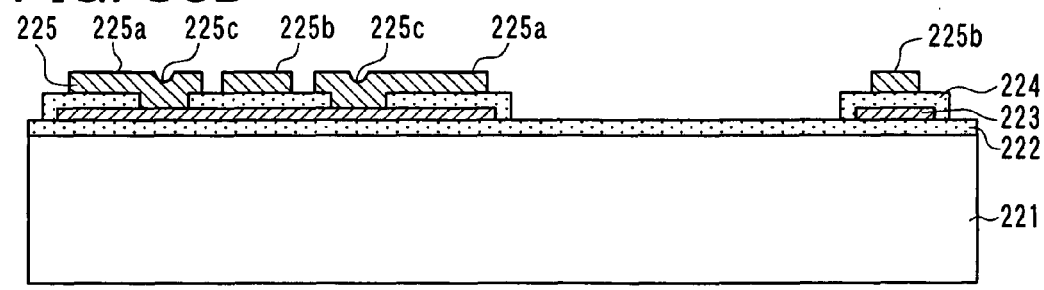

In a step of FIG. 35D, an aluminum film is formed on the second insulation film 224, the first wiring layer 223 exposed from the second insulation film 224 and the first insulation film 222. A mask is formed on the aluminum film, and then, the aluminum film is etched with the mask so that the wiring portion 225a and the sealing portion 225b as the second wiring layer 225 are formed. Thus, the wiring portion 225a of the second wiring layer 225 is electrically coupled with the first wiring layer 223 via the opening 224a of the second insulation film 224.

Further, the concavity 225c is generated by concaving the surface of the wiring portion 225a when a part of the wiring portion 225a is embedded in the opening 224a of the second insulation film 224.

Figure 35E:
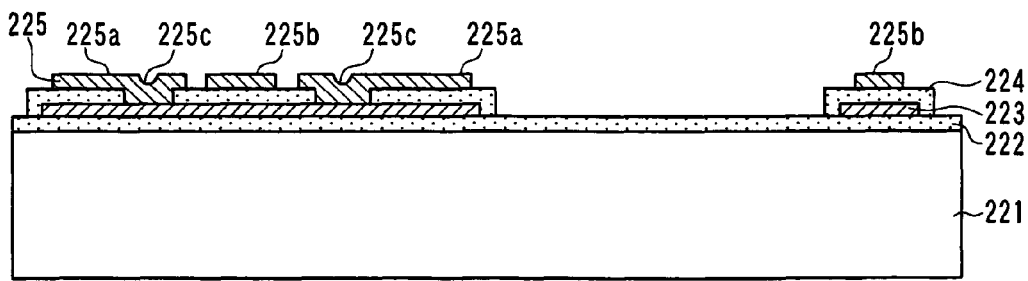
Figure 37:
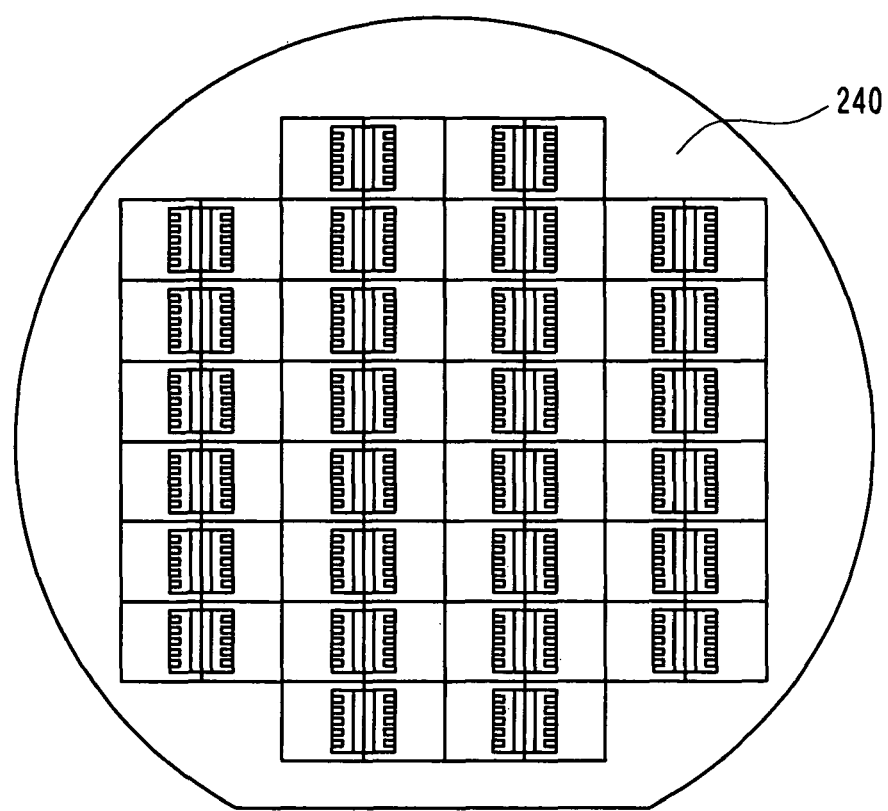
FIG. 37 is a diagram showing a plan view of a wafer having multiple sensors.

In a step of FIG. 35E, a whole surface of the second wiring layer 225 is flattened in a CMP process so that the height of the wiring portion 225a from the one side of the substrate 221 is equalized to the height of the sealing portion 225b from the one side of the silicon substrate 221. As shown in FIG. 33B, concavities and convexities on the surface of the second wiring layer 225 is flattened. In this case, it is not necessary to polish by the line XXXXIIIC in order to remove the concavity 225c completely. Alternatively, the surface of the second wiring layer 225 may be polished by the line XXXIIID, so that a part of the concavity 225c remains. Since the contact region 214a of the movable electrode fixed portion 215 and the like in the sensor portion 210 is bonded to a region of the surface of the wiring portion 225a other than the concavity 225c, it is not necessary to remove the concavity 225c completely.

Thus, the wiring portion 225a and the sealing portion 225b are formed. The sealing portion 225b may have a floating potential or a predetermined potential such as ground potential. Thus, the cap portion 220 of the sensor is completed. The substrate 221 of the cap portion 220 may be made of, for example, a glass substrate, a metallic substrate, a ceramic substrate, or other semiconductor substrates.

Next, as shown in FIG. 36, the sensor portion 210 and the cap portion 220 are bonded together. Specifically, the wiring layer 214 of the sensor portion 210 faces the second wiring layer 225 of the cap portion 220, and then, for example, as described in JP-A-H10-92702, an argon ion sputtering is performed on the surface in vacuum so that the surface is activated; and the sensor portion 210 and the cap portion 220 are directly and tightly bonded together at temperature in a range between room temperature and 500° C. Thus, the periphery element 219 of the sensor portion 210 is bonded to the sealing portion 225b of the cap portion 220 so that the sensor structure is sealed.

The fixed electrode 217, the movable electrode fixed portion 215 and the connection element 218 in the sensor portion 210 is bonded to the wiring portion 225a of the cap portion 220 are bonded together so that the sensor structure of the sensor portion 210 is electrically coupled with the connection element 218. In this case, since the opening 224a in the second insulation film 224 does not face the contact region 214a of the movable electrode fixed portion 15 and the like in the sensor portion 210, the contact region 214a of the movable electrode fixed portion 15 and the like in the sensor portion 210 is not bonded to the wiring portion 225a so as to cover the concavity 225c. Accordingly, the bonding strength between the movable electrode fixed portion and the like and the wiring portion 225a is not reduced.

In this embodiment, the sensor portion 210 is directly bonded to the cap portion 220. Alternatively, a metallic layer made of Ni, Cu, Au or the like may be formed on the wiring layer 214 of the sensor portion 210 and the second wiring layer 225 of the cap portion 220 so that the sensor portion 210 is soldered on the cap portion 220. Further, instead of a solder bonding method, conductive adhesive material such as silver paste may be used for bonding the cap portion 220 and the sensor portion 210. When the cap portion 220 and the sensor portion 210 are directly bonded together, it is necessary to equalize the height of the wiring portion 225a and the height of the sealing portion 225b in the second wiring layer 225 of the cap portion 220 from the one side of the silicon substrate 221. When cap portion 220 and the sensor portion 210 are bonded together with using the solder or the conductive adhesive material, the solder and the conductive adhesive material function to adjust the height of the wiring portion 225a and the height of the sealing portion 225b. Thus, it is not necessary to equalize the height of the wiring portion 225a and the height of the sealing portion 225b in the second wiring layer 225. Thus, when cap portion 220 and the sensor portion 210 are bonded together with using the solder or the conductive adhesive material, the sensor structure is sealed by press-contacting the sensor portion 210 on the cap portion 220.

Thus, the silicon wafer having multiple sensor portions 210 is bonded to the silicon wafer having multiple cap portions 220. Thus, a wafer 240 having multiple semiconductor physical quantity sensors is formed. Then, the wafer 240 is cut by a dicing method so that the wafer 240 is divided into multiple chips. Thus, an individual semiconductor physical quantity sensor is completed.

The wafer 240 includes, for example, a few hundreds sensors with the sensor portions 210 and the cap portions 220. Then, the wafer 240 is divided into multiple chips. Alternatively, the sensor portion 210 and the cap portion 220 may be individually formed, and then, an independent sensor portion 210 is bonded to an independent cap portion 220 so that one sensor is formed.

Then, the sensor is mounted on a circuit board or the like (not shown). As shown in FIGS. 32A to 32C, the connection element 218 and an electric circuit (not shown) are bonded together with a bonding wire. Thus, an electric signal according to physical quantity applied to the sensor structure is output to an external circuit from the sensor.

Thus, the opening 224a is formed in a portion of the second insulation film 224 other than a region facing the contact region 214a of the fixed electrode 217, the movable electrode fixed portion 215 and the connection element 218.

In the above feature, when the wiring portion 225a is bonded to the contact region 214a of the movable electrode fixed portion 215 and the like, the contact region 214a does not overlap the concavity 225c. A contact area between the wiring portion 225a and the contact region 214a is not reduced. Accordingly, bonding strength between the movable electrode fixed portion 215 and the like and the wiring portion 225a is secured. Thus, the cap portion 220 does not peel off from the sensor portion 210. Thus, a manufacturing yield ratio of the sensor is improved.

Further, even when the concavity 225c is formed on the wiring portion 225a by step coverage effect, it is not necessary to cut the surface of the wiring portion 225a until the concavity 225c is removed completely. Thus, the manufacturing yield ratio of the cap portion 220 is improved, and further, the productivity of the sensor is improved.

In this embodiment, a stacking structure comprising the first insulation film 222, the first wiring layer 223, the second insulation film 224 and the second wiring layer 225 is formed on the one side of the cap portion 220, which faces the sensor portion 210. Thus, it is not necessary to form complicated wiring layer on the one side of the sensor portion 210, on which the sensor structure as a sensing portion is formed. Thus, a structure of the sensor portion 210 is simplified, and further, a structure of the sensor is simplified.

Since the wiring layers 223, 225 in the cap portion 220 function as a sealing member, it is not necessary to form a wiring layer on the sensor portion 210. Further, it is not necessary to form the sensor portion 210 to be a multi-layered structure. Accordingly, the manufacturing process of the sensor portion is simplified, and further, the manufacturing method of the sensor is simplified. Thus, the manufacturing yield ratio of the sensor is improved, and the manufacturing cost of the sensor is reduced.

The wiring portion 225a and the sealing portion 225b in the second wiring layer 225 have the same height from the one side of the silicon substrate 221. Thus, only by bonding the sensor portion 210 and the cap portion 220, the connection element 218 and the sensor structure are electrically coupled with each other via the wiring portion 225a. Further, the sensor structure is sealed with the sealing portion 225b.

The concavity 221a is formed on the cap portion 220, so that the connection element 218 of the sensor portion 210 is exposed via the concavity 221a. Thus, a tool for executing a wire bonding step does not contact the cap portion 220. Further, the wire bonding step to the connection element 218 is easily performed. Accordingly, it is not necessary to form a through hole in the cap portion 220 for a bonding wire. Thus, a size of the cap portion 220 is minimized, so that a chip size is reduced.

Twentieth Embodiment

In the nineteenth embodiment, the connection element 218 for electrically connecting to an external circuit is formed in the sensor potion 210 of the sensor. In a twentieth embodiment, the cap portion 220 is electrically connected to an external circuit.

Figure 38:
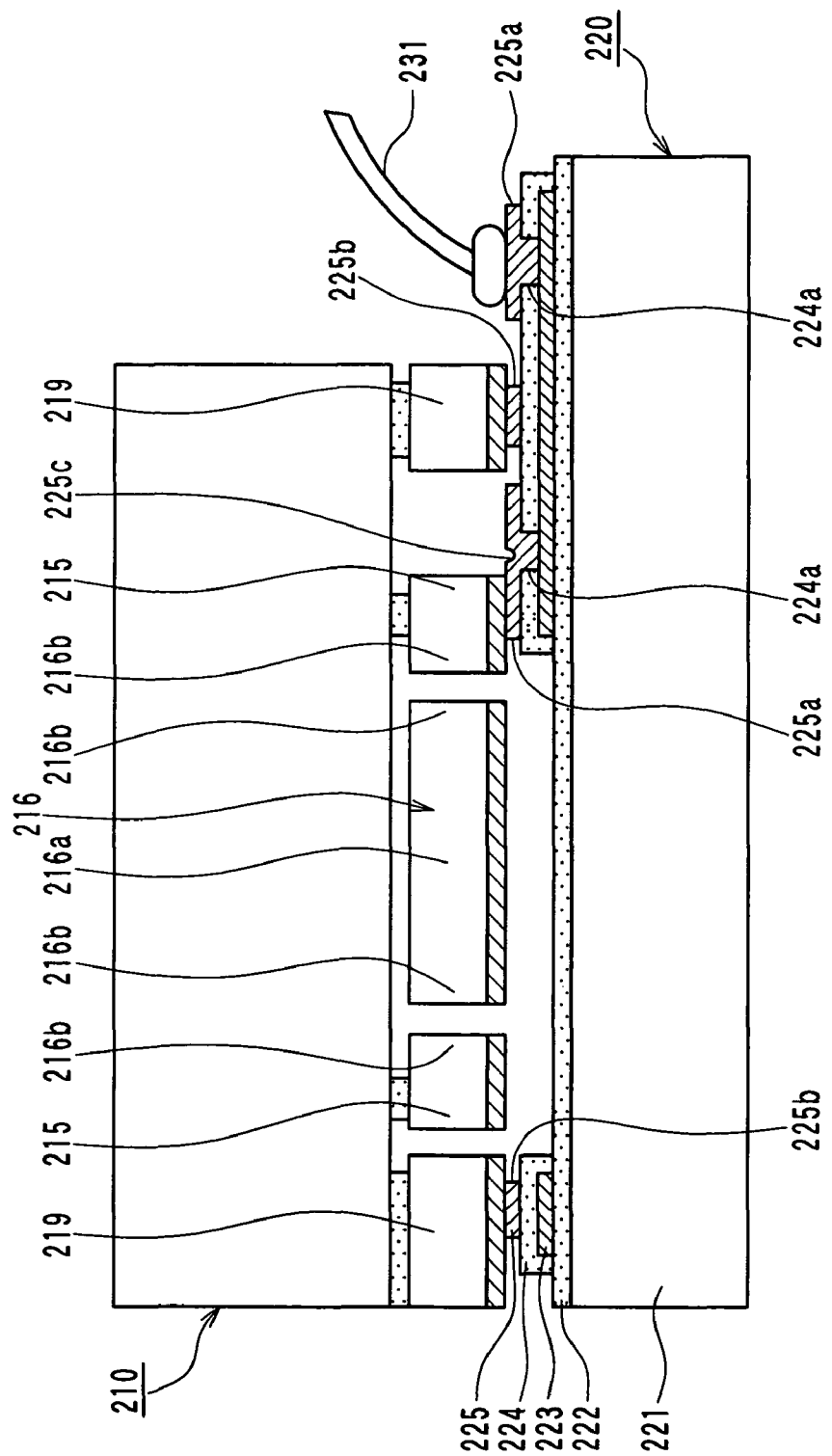
FIG. 38 is a diagram showing a semiconductor physical quantity sensor according to a twentieth embodiment.

FIG. 38 shows a semiconductor physical quantity sensor according to the twentieth embodiment. The connection element 218 is not formed in the sensor portion 210, and the sensor portion 210 includes merely the periphery element 219 and a region surrounded with the periphery element 219. The cap portion 220 in FIG. 38 is similar to the cap portion 220 in FIG. 32A to 32C.

In FIG. 38, the dimensions of the sensor portion 210 is smaller than that in FIGS. 32A to 32C since the connection element 218 is not formed in the sensor portion 210. When the sensor structure of the sensor portion 210 is sealed with the sealing portion 225b of the cap portion 220, the wiring portion 225a of the cap portion 220 is exposed. Here, the wiring portion 225a in FIGS. 32A to 32C is bonded to the connection element 218 of the sensor portion 210.

In this embodiment, a portion of the cap portion 220, which is exposed from the sensor portion 210, i.e., the wiring portion 225a of the cap portion 220 which is not sealed with the sensor portion 210, functions as a pad for connecting to the external circuit. As shown in FIG. 38, the wiring portion 225a exposed from the sensor portion 210 is connected to the bonding wire 31 so that the sensor is electrically coupled with the external system.

Thus, the wiring portion 225a of the cap portion 220 is bonded to the external circuit. Thus, the size of the sensor portion 210 is minimized, and the size of the cap portion 220 is the same as that in FIGS. 32A to 32C. Accordingly, the dimensions of the sensor in FIG. 38 is smaller than those in FIGS. 32A to 32C. Further, in FIG. 31B, the concavity 221a is formed on the silicon substrate 221 of the cap portion 220. In this embodiment, the concavity 221a is formed on the sensor portion 210. Alternatively, the concavity 221a may not be formed in the sensor portion 210 when an individual cap portion 220 and an individual sensor portion 210 are bonded together.

Twenty-First Embodiment

In a twenty-first embodiment, two chips having a wiring pattern are bonded together so that a semiconductor physical quantity sensor is formed.

Figure 39:
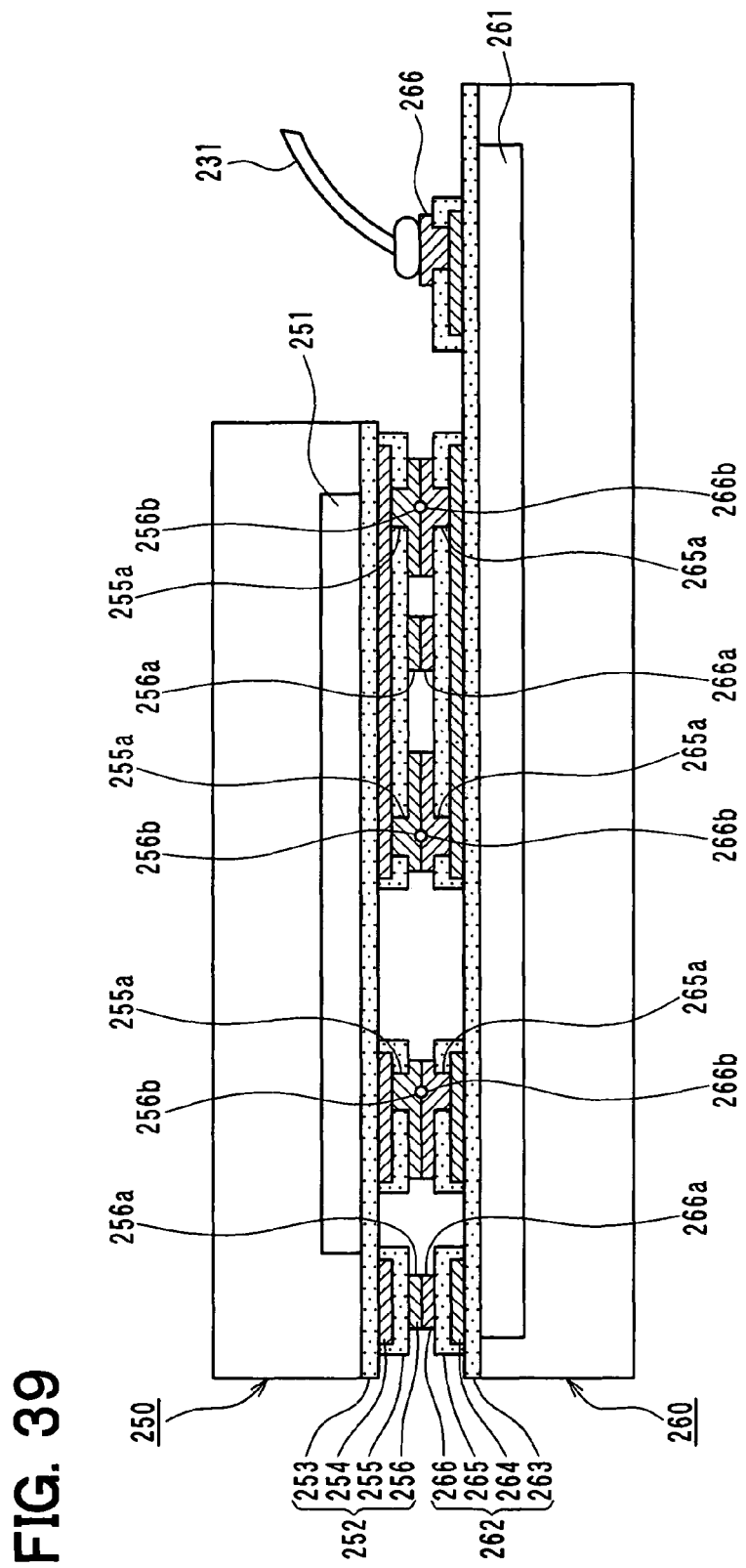
FIG. 39 is a diagram showing a semiconductor physical quantity sensor according to a twenty-first embodiment.

FIG. 39 shows the semiconductor physical quantity sensor according to the twenty-first embodiment. The sensor includes a first chip 250 and a second chip 260, which are bonded together.

The first chip 250 has a plate shape with one side. A first IC circuit 251 is formed on the one side of the first chip 250. The first chip has a wiring pattern 252, which is the same as that in FIGS. 32A to 32C.

Specifically, a first insulation film 253 is formed o the first IC circuit 251. A first wiring layer 254 for connecting to the first IC circuit 251 is patterned and formed on the first insulation film 253. Further, a second insulation film 255 is formed on the first wiring layer 254. The second insulation film 255 includes an opening 255a for exposing the first wiring layer 254. A second wiring layer 256 is formed on the first wiring layer 54, which is exposed via the opening 255a.

In the first chip 250, a sealing portion 256a is formed on the second insulation film 255 in a wiring pattern 252. The sealing portion 256a has a ring shape so that one end of the sealing portion 256a is connected to the other end of the sealing portion 256a. The sealing portion 256a is formed on the second insulation film 255 so that the sealing portion 256a is electrically insulated from the first wiring layer 254. The sealing portion 256a has the same height as the second wiring layer 256.

The second wiring layer 256 is embedded in the opening 255a of the second insulation film 255. Thus, a concavity 256b is formed on the surface of the second wiring layer 256. The concavity 256b is concaved toward the opening 255a.

The wiring pattern 252 is electrically coupled with the first IC circuit 251, which is not shown in FIG. 39.

The second chip 260 has a plate shape with one side. A second IC circuit 261 is formed on the one side of the second chip 260. The second chip 260 includes a wiring pattern 262 on the second IC circuit 261. The wiring pattern 262 has the same structure as the wiring pattern 252.

Specifically, the first insulation film 263 is formed on the second IC circuit 261. The first wiring layer 264 is patterned and formed on the first insulation film 263. The first wiring layer 264 is connected to the second IC circuit 261. The second insulation film 265 is formed on the first wiring layer 264. The second insulation film 265 has an opening 265a for exposing the first wiring layer 264. The second wiring layer 266 is formed on the first wiring layer 264, which is exposed via the opening 265a. Further, in the second chip 260, the sealing portion 266a is formed on the second insulation film 265. The sealing portion 266a is arranged on a part of the surface of the second insulation film 265, which corresponds to the sealing portion 256a of the first chip 250.

The second wiring layer 266 is embedded in the opening 265a of the second insulation film 265, so that the concavity 266b is formed on the second wiring layer 266, which is concaved to the opening 265a. The wiring pattern 262 is electrically coupled with the second IC circuit 261.

The one side of the first chip 250 faces one side of the second chip 260, so that the second wiring layer 256 of the wiring pattern 252 in the first chip 250 and the second wiring layer 266 of the wiring pattern 262 in the second chip 260 are bonded together.

In this case, the first chip 250 is bonded to the second chip 260 such that the concavity 256b of the second wiring layer 256 in the first chip 250 faces the concavity 266b of the second wiring layer 266 in the second chip 260. Further, the second wiring layer 256 of the first chip 250 is bonded to the second wiring layer 266 of the second chip 260.

In the above structure, a contact area between the surface of the second wiring layer 256 of the first chip 250 and the surface of the second wiring layer 266 of the second chip 260 includes an area of the concavity 256b or an area of the concavity 266b, which are minimized. Here, even when the size of the concavity 256b is different from the size of the concavity 266b, a larger size of the concavities 256b, 266b covers a smaller size of the concavities 256b, 266b, and thereby, the above contact area merely includes the larger size of the concavities 256b, 266b. Thus, the contact area between the surface of the second wiring layer 256 of the first chip 250 and the surface of the second wiring layer 266 of the second chip 260 is only reduced by the larger size of the concavities 256b, 266b. The contact area is restricted from being reduced so much. Accordingly, the bonding strength between the second wiring layer 256 of the first chip 250 and the second wiring layer 266 of the second chip 260 is secured.

Further, the second wiring layers 256, 266 are bonded together, and further, the sealing portions 256a, 266a are bonded together. Thus, the sealing portions 256a, 266a, the first insulation films 253, 263 and the second insulation films 255, 265 provide a sealed space.

As shown in FIG. 39, the size of the first chip 250 is smaller than the second chip 260, and the second wiring layer 266 of the second chip 260 is exposed from the first chip 250. The bonding wire 231 is connected to the second wiring layer 266 so that the sensor is electrically coupled with an external circuit.

The sensor is manufactured as follows. The first IC circuit 251 and the wiring pattern 252 are formed in the first chip 250, and the second IC circuit 261 and the wiring pattern 262 are formed in the second chip 260.

The second wiring layer 256 of the first chip 250 is embedded in the opening 255a of the second insulation film 255, so that the concavity 256b is formed on the surface of the second wiring layer 256. The concavity 256b is concaved toward the opening 255a. Further, the sealing portion 256a is formed on the second insulation film 255.

Similarly, the second wiring layer 266 of the second chip 260 is embedded in the opening 265a of the second insulation film 265, so that the concavity 266b is formed on the surface of the second wiring layer 266. The concavity 266b is concaved toward the opening 265a. Further, the sealing portion 266a is formed on the second insulation film 265 at a position corresponding to the sealing portion 256a of the first chip 250.

In the first chip 250, the height of the second wiring layer 256 with respect to the one side of the first chip 250 is homogeneous. In the second chip 260, the height of the second wiring layer 266 with respect to the one side of the second chip 260 is homogeneous.

Each chip 250, 260 is formed in a wafer. In a wafer having multiple first chips 250, a through hole for the bonding wire is formed in each chip 250.

The wafers are bonded together at a room temperature. In this case, the second wiring layer 256 of the wiring pattern 252 in the first chip 250 and the second wiring layer 266 of the wiring pattern 262 in the second chip 260 are bonded together.

The one side of the first chip 250 faces the one side of the second chip 260, and the concavity 256b of the second wiring layer 256 in the first chip 250 faces the concavity 266b of the second wiring layer 266 in the second chip 260. Then, the second wiring layer 256 of the first chip 250 is bonded to the second wiring layer 266 of the second chip 260.

The sealing portions 256a, 266a are bonded together, so that the sealing portions 256a, 266a, the first insulation films 253, 263 and the second insulation films 255, 265 provide a sealed space. Water and/or foreign particle is prevented from penetrating into the sealed space.

Then, the wafers bonded together are cut in a dicing process so that individual sensor is formed.

Thus, the concavity 256b of the first chip 250 faces the concavity 266b of the second chip 260, and the second wiring layer 256 of the first chip 250 is bonded to the second wiring layer 266 of the second chip 260. A ratio between the larger area of the concavity 56b or the concavity 266b and the contact area between the second wiring layer 256 of the first chip 250 and the second wiring layer 266 of the second chip 260 is minimized. Thus, reduction of the contact area is minimized.

The wiring patterns 252, 262 are formed in the first and second chips 250, 260, respectively. The wiring patterns 252, 262 are bonded together so that one semiconductor physical quantity sensor is formed. In this case, it is not necessary to form a complicated wiring patter in each of the circuit 251, 261. Thus, an area of each circuit 251, 261 is minimized. Thus, the size of each chip 250, 260 is also minimized. Further, since the wiring pattern 252 of the first chip 250 is merely bonded to the wiring pattern 262 of the second chip 260, and thereby, a manufacturing process of the sensor is simplified.

Other Embodiments

In the nineteenth embodiment to the twenty-first embodiment, the sensor includes the sealing portions 225b, 256b, 266b. The sealing portion 225b, 256b, 266b functions to seal the sensor structure 215-217. Accordingly, it is not necessary to form the sealing portion 225b, 256b, 266b in the sensor. Alternatively, the sensor may not include the sealing portion 225b, 256b, 266b.

In the nineteenth embodiment to the twenty-first embodiment, the first and second silicon layers 211, 212 of the sensor portion 210 is made of single crystal silicon having the N conductive type. Alternatively, the first and second silicon layers 211, 212 of the sensor portion 210 may be made of single crystal silicon having a $N^+$ conductive type. Further, the impurity concentrations in the first and second silicon layers 211, 212 of the sensor portion 210 and the silicon substrate 221 of the cap portion 220 are comparatively high. Alternatively, the first and second silicon layers 211, 212 and the silicon substrate 221 may be made of a low impurity concentration substrate, a low impurity concentration layer in which an impurity ion is implanted, or a layer or a substrate having a high impurity concentration at a surface or a whole layer or a whole substrate prepared by a gas phase impurity diffusion method.

In the nineteenth embodiment to the twenty-first embodiment, the cap portion 220 is made of the silicon substrate 221. Alternatively, the cap portion 220 may be made of insulating material such as glass. In this case, it is not necessary to form the first insulation film 222, so that the first wiring layer 223 is directly formed on an insulation film.

The first wiring layer 223 may be made of poly silicon having a doped impurity. Alternatively, the second wiring layer 225 may be made of doped poly silicon. When the layer 223, 225 is made of poly silicon, a bonding portion at room temperature is provided by silicon-silicon connection. Thus, mechanical strength and stability of the bonding portion are improved. In this case, an aluminum film may be formed on a bonding pad for the bonding wire. Alternatively, a gold or a copper film may be formed on a bonding pad by an ink jet printing method or a screen printing method. Then, if necessary, the aluminum film is heated so as to improve adhesiveness. The bonding wire is bonded to the bonding pad.

In the nineteenth embodiment to the twenty-first embodiment, the acceleration sensor detects acceleration along with a Z-axis or a direction perpendicular to the Z axis. Alternatively, the sensor may be a two-axial acceleration sensor having an acceleration sensor for detecting acceleration along with the Z axis and an acceleration sensor for detecting acceleration along with the direction perpendicular to the Z axis such as X axis. The two sensors are integrated into one chip. Alternatively, the sensor may be a three axial acceleration sensor having an acceleration sensor for detecting acceleration along with the Z axis, an acceleration sensor for detecting acceleration along with the X axis, and an acceleration sensor for detecting the Y axis. The three sensors are integrated into one chip. In these cases, each sensor is surrounded with a corresponding sealing portion 225b. Alternatively, all sensors may be surrounded with one sealing portion 225b.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a sensor including a sensor structure and a periphery element, wherein the sensor structure is disposed on a first side of the sensor, and the periphery element surrounds the sensor structure; and
   a cap covering the sensor structure and having a second side, which is bonded to the first side of the sensor,
   wherein the cap includes a first wiring layer, which is disposed on the second side of the cap,
   wherein the first wiring layer steps over the periphery element,
   wherein the sensor further includes a sensor side connection portion, and the cap further includes a cap side connection portion,
   wherein the sensor side connection portion is bonded to the cap side connection portion,
   wherein at least one of the sensor side connection portion and the cap side connection portion provides an eutectic alloy so that the sensor side connection portion and the cap side connection portion are bonded to each other,
   wherein the sensor further includes a SOI substrate having a first conductive layer, an insulation layer, and a second conductive layer,
   wherein the first conductive layer, the insulation layer, and the second conductive layer are stacked in this order,
   wherein the sensor structure and the periphery element are disposed in the first conductive layer,
   wherein the insulation layer includes a contact portion, which is disposed between the periphery element and the second conductive layer,
   wherein the contact portion electrically couples the periphery element and the second conductive layer,
   wherein the cap further includes a conductive substrate,
   wherein the cap side connection portion is disposed on the conductive substrate,
   wherein the cap further includes a second wiring layer having a wiring portion and a sealing portion,
   wherein the wiring portion is electrically isolated from the sealing portion,
   wherein the wiring portion and the sealing portion provide the cap side connection portion, wherein the wiring portion is bonded to a part of the sensor structure via the eutectic alloy,
wherein the sealing portion has a ring shape, which corresponds to the periphery element,
wherein the sealing portion is bonded to the periphery element via the eutectic alloy, and
wherein the periphery element, the contact portion, the second conductive layer, the sealing portion, and the conductive substrate are electrically coupled with each other so that the periphery element, the contact portion, the second conductive layer, the sealing portion, and the conductive substrate have the same electric potential.

2. The semiconductor device according to claim 1,
wherein a part of the sensor structure and the periphery element provide the sensor side connection portion,
wherein the cap further includes a second wiring layer having a wiring portion and a sealing portion,
wherein the wiring portion is electrically isolated from the sealing portion,
wherein the wiring portion and the sealing portion provide the cap side connection portion,
wherein the wiring portion is bonded to the part of the sensor structure via the eutectic alloy,
wherein the sealing portion has a ring shape, which corresponds to the periphery element,
wherein the sealing portion is bonded to the periphery element via the eutectic alloy so that a sealed portion is provided between the cap and the sensor, and
wherein the sensor structure is accommodated in the sealed portion.

3. The semiconductor device according to claim 2,
wherein the wiring portion has a flat surface, which is bonded to the part of the sensor structure.

4. The semiconductor device according to claim 1,
wherein the sensor further includes a metallic layer, which provides the sensor side connection portion,
wherein the metallic layer faces the cap side connection portion, and
wherein at least one of the metallic layer and the cap side connection portion provides the eutectic alloy so that the metallic layer and the cap side connection portion are bonded to each other.

5. A method for manufacturing a semiconductor device comprising:
forming a sensor structure on a first side of a sensor;
forming a periphery element surrounding the sensor structure;
preparing a cap for covering the sensor structure;
forming a first wiring layer on a second side of the cap;
bonding the first side of the sensor and the second side of the cap, and
forming a second wiring layer on the second side of the cap,
wherein the first wiring layer steps over the periphery element,
wherein the sensor includes a sensor side connection portion, and the cap includes a cap side connection portion,
wherein the bonding includes alloying at least one of the sensor side connection portion and the cap side connection portion to be an eutectic alloy so that the sensor side connection portion and the cap side connection portion are bonded to each other,
wherein a part of the sensor structure and the periphery element provide the sensor side connection portion,
wherein the second wiring layer includes a wiring portion and a sealing portion, which provide the cap side connection portion,
wherein the wiring portion is electrically isolated from the sealing portion,
wherein the wiring portion and the sealing portion provide the cap side connection portion,
wherein the wiring portion is bonded to the part of the sensor structure via the eutectic alloy,
wherein the sealing portion has a ring shape, which corresponds to the periphery element,
wherein the sealing portion is bonded to the periphery element via the eutectic alloy so that a sealed portion is provided between the cap and the sensor,
wherein the sensor structure is accommodated in the sealed portion,
wherein the sensor further includes a SOI substrate having a first conductive layer, an insulation layer, and a second conductive layer, which are stacked in this order,
wherein the sensor structure and the periphery element are formed in the first conductive layer,
wherein the method further comprises forming a contact in the insulation layer so as to electrically couple between the periphery element and the second conductive layer,
wherein the cap further includes a conductive substrate,
wherein the cap side connection portion is disposed on the conductive substrate,
wherein the sealing portion is electrically coupled with the conductive substrate, and
wherein the periphery element, the contact portion, the second conductive layer, the sealing portion, and the conductive substrate are electrically coupled with each other so that the periphery element, the contact portion, the second conductive layer, the sealing portion, and the conductive substrate have the same electric potential.

6. The method according to claim 5, further comprising:
forming a metallic layer on the first side of the sensor, the metallic layer which provides the sensor side connection portion; and
forming a second wiring layer on the second side of the cap, and forming a conductive layer on the second wiring layer,
wherein the second wiring layer and the conductive layer provide the cap side connection portion, and
wherein the bonding includes:
contacting the conductive layer on the metallic layer so as to sandwich the conductive layer between the metallic layer and the second wiring layer; and
heating the metallic layer, the conductive layer and the second wiring layer so that the conductive layer and a part of the metallic layer are alloyed to be the eutectic alloy, and the conductive layer and a part of the second wiring layer are alloyed to be the eutectic alloy.

7. The method according to claim 5, further comprising:
forming a metallic layer on the first side of the sensor, and forming a conductive layer on the metallic layer; and
forming a second wiring layer on the second side of the cap,
wherein the metallic layer and the conductive layer provide the sensor side connection portion,
wherein the second wiring layer provides the cap side connection portion, and
wherein the bonding includes:
contacting the conductive layer on the second wiring layer so as to sandwich the conductive layer between the metallic layer and the second wiring layer; and
heating the metallic layer, the conductive layer and the second wiring layer so that the conductive layer and a part of the metallic layer are alloyed to be the eutectic alloy, and the conductive layer and a part of the second wiring layer are alloyed to be the eutectic alloy.

8. The method according to claim 5, further comprising:
forming a metallic layer on the first side of the sensor, the metallic layer which provides the sensor side connection portion; and
forming a second wiring layer on the second side of the cap, and forming an eutectic alloy layer on the second wiring layer,
wherein the second wiring layer and the eutectic alloy layer provide the cap side connection portion, and
wherein the bonding includes:
contacting the eutectic alloy layer on the metallic layer so as to sandwich the eutectic alloy layer between the metallic layer and the second wiring layer; and
heating the metallic layer, the eutectic alloy layer and the second wiring layer so that a part of the eutectic alloy layer and a part of the metallic layer are alloyed to be the eutectic alloy, and a part of the eutectic alloy layer and a part of the second wiring layer are alloyed to be the eutectic alloy.

9. The method according to claim 5, further comprising:
forming a metallic layer on the first side of the sensor, and forming an eutectic alloy layer on the metallic layer; and
forming a second wiring layer on the second side of the cap,
wherein the metallic layer and the eutectic alloy layer provide the sensor side connection portion,
wherein the second wiring layer provides the cap side connection portion, and
wherein the bonding includes:
contacting the eutectic alloy layer on the second wiring layer so as to sandwich the eutectic alloy layer between the metallic layer and the second wiring layer; and
heating the metallic layer, the eutectic alloy layer and the second wiring layer so that the eutectic alloy layer and a part of the metallic layer are alloyed to be the eutectic alloy, and the eutectic alloy layer and a part of the second wiring layer are alloyed to be the eutectic alloy.

10. The method according to claim 5, further comprising:
forming a metallic layer on the first side of the sensor, the metallic layer which provides the sensor side connection portion; and
forming a conductive layer on the second side of the cap,
wherein the conductive layer provides the cap side connection portion, and
wherein the bonding includes:
contacting the conductive layer on the metallic layer; and
heating the metallic layer and the conductive layer so that a part of the conductive layer and a part of the metallic layer are alloyed to be the eutectic alloy.

11. The method according to claim 5, further comprising:
forming a metallic layer on the first side of the sensor, the metallic layer which provides the sensor side connection portion; and
forming an eutectic alloy layer on the second side of the cap,
wherein the eutectic alloy layer provides the cap side connection portion, and
wherein the bonding includes:
contacting the eutectic alloy layer on the metallic layer; and
heating the metallic layer and the eutectic alloy layer so that a part of the eutectic alloy layer and a part of the metallic layer are alloyed to be the eutectic alloy.

12. The method according to claim 6,
wherein the metallic layer faces the cap side connection portion.

13. The method according to claim 5, further comprising:
forming a first conductive layer on the first side of the sensor,
forming a second wiring layer on the second side of the cap,
wherein the first conductive layer provides the sensor side connection portion,
wherein the second wiring layer provides the cap side connection portion, and
wherein the bonding includes:
contacting the first conductive layer on the second wiring layer; and
heating the first conductive layer and the second wiring layer so that a part of the first conductive layer and a part of the second wiring layer are alloyed to be the eutectic alloy.

14. The method according to claim 5, further comprising:
forming a first conductive layer on the first side of the sensor,
forming an eutectic alloy layer on the second side of the cap,
wherein the first conductive layer provides the sensor side connection portion,
wherein the eutectic alloy layer provides the cap side connection portion, and
wherein the bonding includes:
contacting the first conductive layer on the eutectic alloy layer; and
heating the first conductive layer and the eutectic alloy layer so that a part of the first conductive layer and a part of the eutectic alloy layer are alloyed to be the eutectic alloy.

15. The method according to claim 5,
wherein, in the bonding, the part of the sensor structure is bonded to a flat surface of the wiring portion.

16. A semiconductor device comprising:
a sensor having a plate shape and including a sensor structure, which is arranged on a first side of the sensor; and
a cap having a second side, which is bonded to the first side of the sensor,
wherein the cap includes a first wiring layer, an insulation film and a second wiring layer, which are disposed on the second side of the cap,
wherein the first wiring layer connects between an outer periphery of the first side of the sensor and the sensor structure,
wherein the insulation film is disposed on the first wiring layer, and includes an opening,
wherein the first wiring layer is exposed from the insulation film via the opening,
wherein the second wiring layer includes a wiring portion,
wherein the wiring portion is disposed on the first wiring layer exposed from the insulation film,
wherein the wiring portion has a concavity, which is disposed over the opening and is concaved toward the opening,
wherein a region of the sensor structure connecting to the wiring portion is defined as a contact region, and
wherein the contact region contacts a part of a surface of the wiring portion other than the concavity.

17. The semiconductor device according to claim 16,
wherein the part of the surface of the wiring portion is spaced apart from a region of the wiring portion corresponding to the opening of the insulation film.

18. The semiconductor device according to claim 16,
wherein the sensor further includes a periphery element, which surrounds the sensor structure and disposed on the first side of the sensor,
wherein the second wiring layer further includes a sealing portion, wherein the sealing portion has a ring shape, which corresponds to the periphery element,
wherein the sealing portion is disposed on the insulation film, and is electrically isolated from the first wiring layer,
wherein the sealing portion of the cap is bonded to the periphery element of the sensor, and
wherein the sensor structure is sealed in a space between the cap and the sensor.

19. The semiconductor device according to claim 18,
wherein the sensor further includes a connection element, which is disposed on the first side of the sensor at a position outside of a surrounded region with the periphery element,
wherein the connection element is coupled with a wire for connecting to an external circuit, and
wherein the wiring portion facing the outer periphery of the first side of the sensor is coupled with the connection element so that the sensor structure is electrically coupled with the external circuit via the wiring portion, the first wiring layer, the connection element and the wire.

20. The semiconductor device according to claim 18,
wherein the wiring portion facing the outer periphery of the first side of the sensor is coupled with a wire for connecting to an external circuit, and
wherein the sensor structure is electrically coupled with the external circuit via the wiring portion, the first wiring layer and the wire.

21. A method for manufacturing a semiconductor device comprising:
   forming a sensor structure on a first side of a sensor having a plate shape;
   forming and patterning a first wiring layer on a second side of a cap in such a manner that the first wiring layer connects between an outer periphery of the first side of the sensor and the sensor structure;
   forming an insulation film on the first wiring layer;
   forming an opening in the insulation film so as to expose the first wiring layer from the insulation film via the opening, wherein a region of the sensor structure to be connected to the cap is defined as a contact region, and the opening of the insulation film does not face the contact region;
   forming and patterning a second wiring layer on the insulation film so as to have a wiring portion, wherein the wiring portion is disposed on the first wiring layer exposed from the insulation film, and the wiring portion has a concavity with a bottom;
   flattening a surface of the wiring portion so as to leave the bottom of the concavity; and
   bonding the second side of the cap and the first side of the sensor in such a manner that the contact region of the sensor structure is bonded to a part of a surface of the wiring portion, which is spaced apart from a region of the wiring portion corresponding to the opening of the insulation film.

22. The method according to claim 21,
wherein the forming the sensor structure includes forming a periphery element, which surrounds the sensor structure and disposed on the first side of the sensor,
wherein the forming and patterning the second wiring layer includes forming a sealing portion having a ring shape, which corresponds to the periphery element,
wherein the sealing portion is disposed on the insulation film, and is electrically isolated from the first wiring layer, and
wherein the bonding the second side of the cap and the first side of the sensor includes: bonding the sealing portion of the cap and the periphery element of the sensor; and sealing the sensor structure in a space between the cap and the sensor.

* * * * *